United States Patent
Sim et al.

(10) Patent No.: US 10,714,695 B2
(45) Date of Patent: *Jul. 14, 2020

(54) ORGANIC LIGHT-EMITTING DEVICE

(71) Applicant: Samsung Display Co., Ltd., Yongin-si, Gyeonggi-do (KR)

(72) Inventors: Munki Sim, Yongin-si (KR); Eunyoung Lee, Yongin-si (KR); Youngkook Kim, Yongin-si (KR); Junha Park, Yongin-si (KR); Hyoyoung Lee, Yongin-si (KR); Eunjae Jeong, Yongin-si (KR); Seokhwan Hwang, Yongin-si (KR); Mikyung Kim, Yongin-si (KR); Seunggak Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

This patent is subject to a terminal disclaimer.

(21) Appl. No.: 15/162,450

(22) Filed: May 23, 2016

(65) Prior Publication Data
US 2017/0104167 A1   Apr. 13, 2017

(30) Foreign Application Priority Data

Oct. 8, 2015 (KR) .......................... 10-2015-0141640

(51) Int. Cl.
 *H01L 51/00* (2006.01)
 *H01L 51/50* (2006.01)
 (Continued)

(52) U.S. Cl.
 CPC ........ *H01L 51/0073* (2013.01); *C09K 11/025* (2013.01); *H01L 27/3248* (2013.01);
 (Continued)

(58) Field of Classification Search
 CPC ... H01L 51/5012; H01L 51/5072–5084; H01L 51/0062–0074
 See application file for complete search history.

(56) References Cited

U.S. PATENT DOCUMENTS 5,645,948 A    7/1997  Shi et al.
9,871,208 B2 *  1/2018  Lee .................... H01L 51/0072
(Continued)

FOREIGN PATENT DOCUMENTS

CN    103396386 A    11/2013
CN    107251260 A    10/2017
(Continued)

OTHER PUBLICATIONS

Machine translation of KR-20130075982-A.*
(Continued)

*Primary Examiner* — William E McClain
(74) *Attorney, Agent, or Firm* — Lewis Roca Rothgerber Christie LLP

(57) ABSTRACT

An organic light-emitting device includes a first electrode; a second electrode facing the first electrode; and an organic layer between the first electrode and the second electrode, the organic layer including an emission layer, wherein the organic layer includes a compound represented by Formula 1:

(Continued)

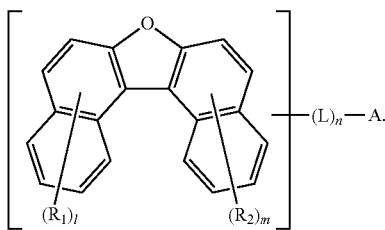

Formula 1

16 Claims, 1 Drawing Sheet

(51) Int. Cl.
C09K 11/02 (2006.01)
H01L 27/32 (2006.01)
(52) U.S. Cl.
CPC ........ *H01L 51/006* (2013.01); *H01L 51/0052* (2013.01); *H01L 51/0058* (2013.01); *H01L 51/0061* (2013.01); *H01L 51/0067* (2013.01); *H01L 51/0072* (2013.01); *H01L 51/0077* (2013.01); *H01L 51/5012* (2013.01); *H01L 51/5056* (2013.01); *H01L 51/5072* (2013.01)

(56) References Cited

U.S. PATENT DOCUMENTS

| | | | |
|---|---|---|---|
| 9,899,611 B2* | 2/2018 | Park | H01L 51/0073 |
| 10,236,452 B2* | 3/2019 | Jeong | H01L 51/0073 |
| 2002/0055014 A1* | 5/2002 | Okada | C09K 11/06 |
| | | | 428/690 |
| 2004/0053069 A1 | 3/2004 | Sotoyama et al. | |
| 2004/0137270 A1 | 7/2004 | Seo et al. | |
| 2011/0140043 A1* | 6/2011 | Stoessel | C07D 209/86 |
| | | | 252/301.16 |
| 2011/0147716 A1* | 6/2011 | Kondakova | H01L 51/5004 |
| | | | 257/40 |
| 2012/0074392 A1* | 3/2012 | Huang | H01L 27/3209 |
| | | | 257/40 |
| 2012/0326137 A1* | 12/2012 | Song | H01L 51/5008 |
| | | | 257/40 |
| 2013/0112954 A1* | 5/2013 | Osaka | C07D 409/04 |
| | | | 257/40 |
| 2013/0200341 A1 | 8/2013 | Fadhel et al. | |
| 2013/0306958 A1 | 11/2013 | Ito et al. | |
| 2014/0034915 A1* | 2/2014 | Lee | H01L 51/0074 |
| | | | 257/40 |
| 2014/0103325 A1 | 4/2014 | Shin et al. | |
| 2014/0183500 A1 | 7/2014 | Ikeda et al. | |
| 2015/0014673 A1 | 1/2015 | Takeya et al. | |
| 2015/0171351 A1* | 6/2015 | Steudel | C07F 15/0006 |
| | | | 257/40 |
| 2015/0236273 A1* | 8/2015 | Jang | C07D 221/10 |
| | | | 257/40 |
| 2015/0243908 A1* | 8/2015 | Lee | H01L 51/0072 |
| | | | 257/40 |
| 2016/0285011 A1* | 9/2016 | Park | H01L 51/0073 |
| 2016/0301016 A1* | 10/2016 | Stoessel | H01L 51/005 |
| 2017/0040549 A1* | 2/2017 | Jeong | C07D 307/77 |
| 2017/0062736 A1* | 3/2017 | Parham | C09K 11/025 |
| 2017/0104167 A1 | 4/2017 | Sim et al. | |
| 2017/0125689 A1* | 5/2017 | Lee | C07D 333/76 |
| 2018/0076397 A1* | 3/2018 | Frey | H01L 51/0072 |
| 2018/0145263 A1* | 5/2018 | Denker | |

FOREIGN PATENT DOCUMENTS

| | | | |
|---|---|---|---|
| JP | 10-17860 A | 1/1998 | |
| JP | 11-87067 A | 3/1999 | |
| JP | 2006-73581 A | 3/2006 | |
| JP | 4060669 B2 | 12/2007 | |
| JP | 2013-100239 A | 5/2013 | |
| JP | 2014-133713 A | 7/2014 | |
| KR | 10-0525408 B1 | 11/2005 | |
| KR | 10-2012-0138671 A | 12/2012 | |
| KR | 20130075982 A * | 7/2013 | |
| KR | 10-2013-0119413 A | 10/2013 | |
| KR | 10-2014-0017400 A | 2/2014 | |
| KR | 10-2014-0032948 A | 3/2014 | |
| WO | WO 2013/125599 A1 | 8/2013 | |
| WO | WO 2014/018919 A1 | 1/2014 | |
| WO | WO-2016131918 A1 * | 8/2016 | H01L 51/0073 |
| WO | WO 2017/022751 A1 | 2/2017 | |

OTHER PUBLICATIONS

Adachi et al., "Confinement of charge carriers and molecular excitons within 5-nm-thick emitter layer in organic electroluminescent devices with a double heterostructure," Applied Physics Letters 1990, 57 (6), pp. 531-533.
Johansson et al., "Solid-State Amplified Spontaneous Emission in Some Spiro-Type Molecules: A New Concept for the Design of Solid State Lasing Molecules," Advanced Materials, 1998, 10 (14), pp. 1136-1141.
Sakamoto et al., "Synthesis, Characterization, and Electron-Transport Property of Perfluorinated Phenylene Dendrimers," J. Am, Chem. Soc., 2000, 122, pp. 1832-1833.
Tang et al., "Organic electroluminescent diodes," Applied Physics Letters, 1987, 51 (12), pp. 913-915.
Tao et al., "Sharp green electroluminescence from 1H-pyrazolo[3,4-b]quinoline-based light-emitting diodes," Applied Physics Letters 2000, 77 (11), pp. 1575-1577.
Yamaguchi et al., "Diphenylamino-Substituted 2,5-Diarylsiloles for Single-Layer Organic Electroluminescent Devices," Chemistry Letters, 2001, pp. 98-99.
Cho et al., "Asymmetric Synthesis of Axially Chiral Biaryls by Nickel-Catalyzed Grignard Cross-Coupling of Dibenzothiophenes," Journal of Organic Chemistry (2004), vol. 69(11), pp. 3811-3823.
Derwent English abstract for JP 2014-133713 (2014).
Machine-assisted English translation for JP 2014-133713 (2014) provided by JPO.
Derwent English abstract for WO 2017/022751 A1. (Year: 2017).
Partial English translation for WO 2017/022751 A1, provided by PTO. (Year: 2017).
U.S. Office Action dated Nov. 14, 2017, issued in U.S. Appl. No. 14/938,770 (18 pages).
U.S. Final Office Action dated Jun. 11, 2018, issued in U.S. Appl. No. 14/938,770 (13 pages).

* cited by examiner

10

| 190 |
| 150 |
| 110 |

ORGANIC LIGHT-EMITTING DEVICE

CROSS-REFERENCE TO RELATED APPLICATIONS

This application claims priority to and the benefit of Korean Patent Application No. 10-2015-0141640, filed on Oct. 8, 2015, in the Korean Intellectual Property Office, the entire disclosure of which is incorporated herein by reference.

BACKGROUND

1. Field

One or more aspects of example embodiments of the present disclosure relate to an organic light-emitting device.

2. Description of the Related Art

Organic light-emitting devices (OLEDs) are self-emission devices that have wide viewing angles, high contrast ratios, and short response times. In addition, OLEDs exhibit excellent luminance, driving voltage, and response speed characteristics, and can produce full-color images.

An organic light-emitting device may include a first electrode disposed (e.g., positioned) on a substrate, and a hole transport region, an emission layer, an electron transport region, and a second electrode, which are sequentially disposed on the first electrode. Holes provided from the first electrode, for example, may move to the emission layer through the hole transport region, and electrons provided from the second electrode, for example, may move to the emission layer through the electron transport region. The holes and the electrons are then recombined in the emission layer to produce excitons. These excitons change from an excited state to a ground state to thereby generate light.

SUMMARY

One or more aspects of example embodiments of the present disclosure are directed toward an organic light-emitting device having improved characteristics including high efficiency, low voltage, high luminance, and long lifespan characteristics.

Additional aspects will be set forth in part in the description which follows and, in part, will be apparent from the description, or may be learned by practice of the presented embodiments.

According to one or more example embodiments, an organic light-emitting device includes a first electrode; a second electrode facing the first electrode; and an organic layer between the first electrode and the second electrode, the organic layer including an emission layer, wherein the organic layer further includes i) a hole transport region between the first electrode and the emission layer and including a hole transport layer and at least one selected from a hole injection layer and a buffer layer; and ii) an electron transport region between the emission layer and the second electrode and including an electron transport layer and at least one selected from a hole blocking layer and an electron injection layer, wherein the electron transport region includes a compound represented by Formula 1:

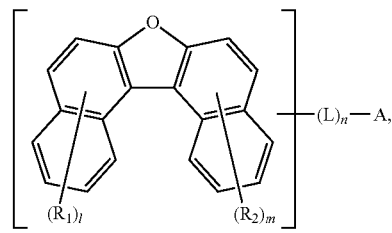

Formula 1 wherein, in Formula 1, $R_1$ and $R_2$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_6$-$C_{60}$ aryl group, and a substituted or unsubstituted $C_1$-$C_{60}$ heteroaryl group;

A may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

L may be selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

l and m may be each independently an integer selected from 1 to 6;

n may be an integer selected from 0 to 3;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$PO(Q_{31})(Q_{32})$, —$SO_2(Q_{33})$, and —$SO(Q_{34})$, wherein, $Q_{11}$ to $Q_{17}$, $Q_{21}$ to $Q_{27}$ and $Q_{31}$ to $Q_{34}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

According to one or more example embodiments, a flat panel display apparatus may include the organic light-emitting device wherein a first electrode is electrically connected (e.g., coupled) to a source electrode or drain electrode of a thin film transistor.

BRIEF DESCRIPTION OF THE DRAWINGS

These and/or other aspects will become apparent and more readily appreciated from the following description of the example embodiments, taken in conjunction with the accompanying drawing, which is a schematic view of an organic light-emitting device according to an embodiment of the present disclosure.

DETAILED DESCRIPTION

Reference will now be made in more detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the drawing, to explain aspects of the present description. As used herein, the term "and/or" includes any and all combinations of one or more of the associated listed items. Expressions such as "at least one of," "one of," "at least one selected from," and "one selected from," when preceding a list of elements, modify the entire list of elements and do not modify the individual elements of the list. Further, the use of "may" when describing embodiments of the present invention refers to one or more embodiments of the present invention."

According to an aspect of an example embodiment, an organic light-emitting device includes a first electrode; a second electrode facing the first electrode; and an organic layer that is disposed (e.g., positioned) between the first electrode and the second electrode and that includes an emission layer.

The organic layer may further include i) a hole transport region that is disposed between the first electrode and the emission layer and that includes at least one selected from a hole transport layer, a hole injection layer, and a buffer layer; and ii) an electron transport region that is disposed between the emission layer and the second electrode and that includes at least one selected from an electron transport layer, a hole blocking layer, and an electron injection layer, wherein the electron transport region may include a compound represented by Formula 1:

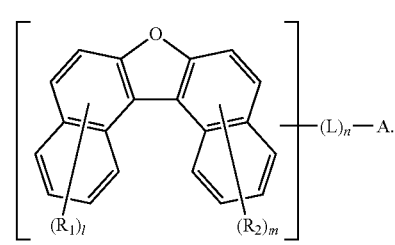

Formula 1

In Formula 1, $R_1$ and $R_2$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_6$-$C_{60}$ aryl group, and a substituted or unsubstituted $C_1$-$C_{60}$ heteroaryl group;

A may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

L may be selected from a single bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

l and m may be each independently an integer selected from 1 to 6;

n may be an integer selected from 0 to 3; and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —PO($Q_{31}$)($Q_{32}$), —SO$_2$($Q_{33}$), and —SO($Q_{34}$), wherein, $Q_{11}$ to $Q_{17}$, $Q_{21}$ to $Q_{27}$ and $Q_{31}$ to $Q_{34}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

When the number of $R_1$s in Formula 1 is 2 or greater, a plurality of $R_1$s may be identical to or different from each other.

When the number of $R_2$s in Formula 1 is 2 or greater, a plurality of $R_2$s may be identical to or different from each other.

In Formula 1, L may refer to a group that is substituted in the place of one or more hydrogens of a dinaphthofuran moiety of Formula 1.

The compound represented by Formula 1 according to an embodiment may have a high glass transition temperature (Tg) or a high melting point. Accordingly, the compound of Formula 1 may have high heat-resistance against Joule's heat generated in an organic layer or between an organic layer and an electrode, and thus may have high durability in high-temperature environments. The compound of Formula 1 having a heteroatom in a molecule may improve characteristics of an organic light-emitting device, and thus an organic light-emitting device manufactured using the compound represented by Formula 1 may have high durability when stored or operated.

In some embodiments, the electron transport layer of the electron transport region may include the compound of Formula 1.

In some embodiments, $R_1$ and $R_2$ in Formula 1 may be each independently hydrogen or deuterium.

In some embodiments, L in Formula 1 may be selected from a single bond and a group represented by one of Formulae 2a to 2d:

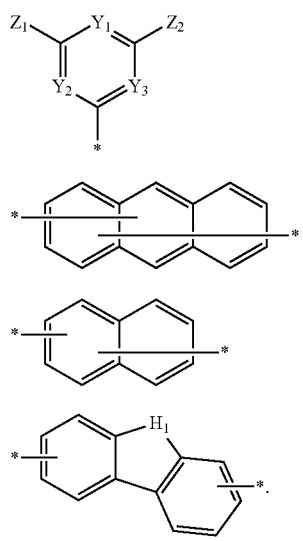

In Formulae 2a to 2d, $Y_1$ to $Y_3$ may be each independently CH or N;

$H_1$ may be $CR_{11}R_{12}$ or $NR_{13}$;

$Z_1$, $Z_2$, and $R_{11}$ to $R_{13}$ may be each independently a binding site, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted monovalent non-aromatic condensed polycyclic group, and a substituted or unsubstituted monovalent non-aromatic condensed heteropolycyclic group;

wherein, $R_{11}$ and $R_{12}$ may be optionally linked to each other and form a ring; and

* may be a binding site.

In some embodiments, A in Formula 1 may be selected from a cyano group, —PO($Q_{31}$)($Q_{32}$), —SO$_2$($Q_{33}$), —SO($Q_{34}$), and a compound represented by one of Formulae 3a to 3h:

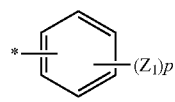

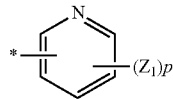

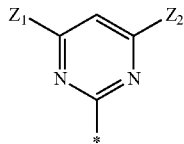

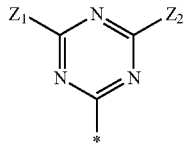

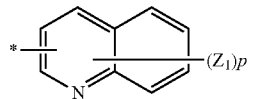

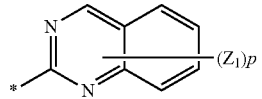

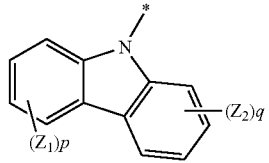

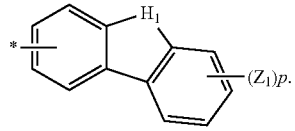

In Formulae 3a to 3h, $H_1$ may be $CR_{11}R_{12}$ or $NR_{13}$;

$Z_1$, $Z_2$, and $R_{11}$ to $R_{13}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted monovalent non-aromatic condensed polycyclic group, and a substituted or unsubstituted monovalent non-aromatic condensed heteropolycyclic group;

wherein, $R_{11}$ and $R_{12}$ may be optionally linked to each other and form a ring;

p in Formulae 3a and 3f may be 5, p in Formulae 3b, 3 g, and 3h may be 4, p in Formula 3e may be 6, and q in Formula 3 g may be 4; and

* may be a binding site.

In some embodiments, the compound represented by Formula 1 may be a compound represented by Formula 2:

Formula 2
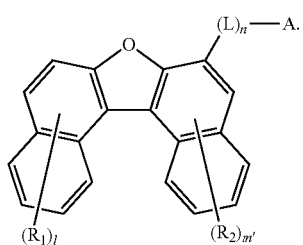
In Formula 2, m' may be an integer selected from 1 to 5, and the rest of substituents and coefficients in Formula 2 may be the same as defined herein.
In some embodiments, a compound represented by Formula 1 may be selected from compounds below:
1
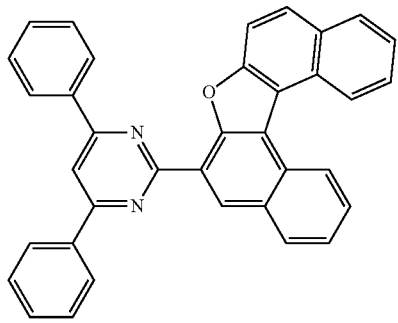
2
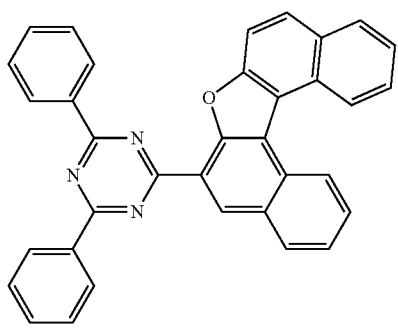
3
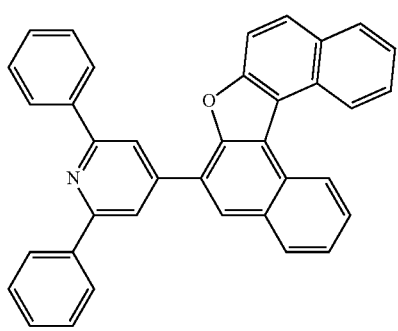
4
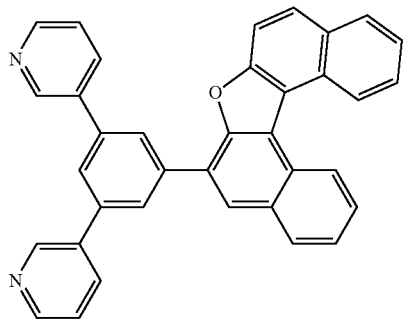
5
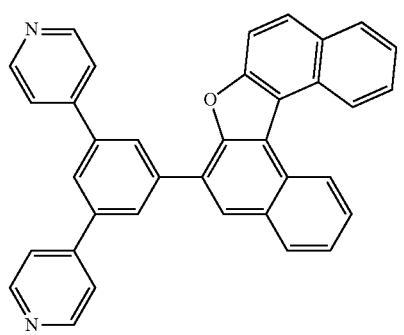
6
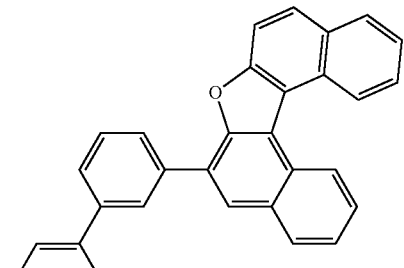
7
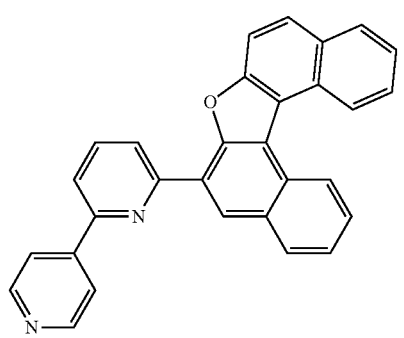
8
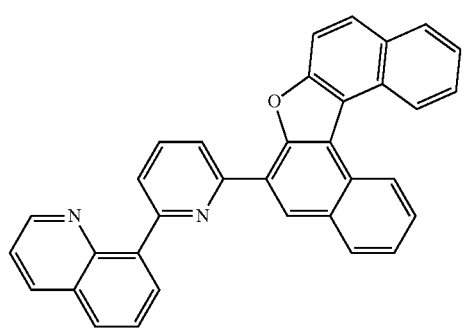

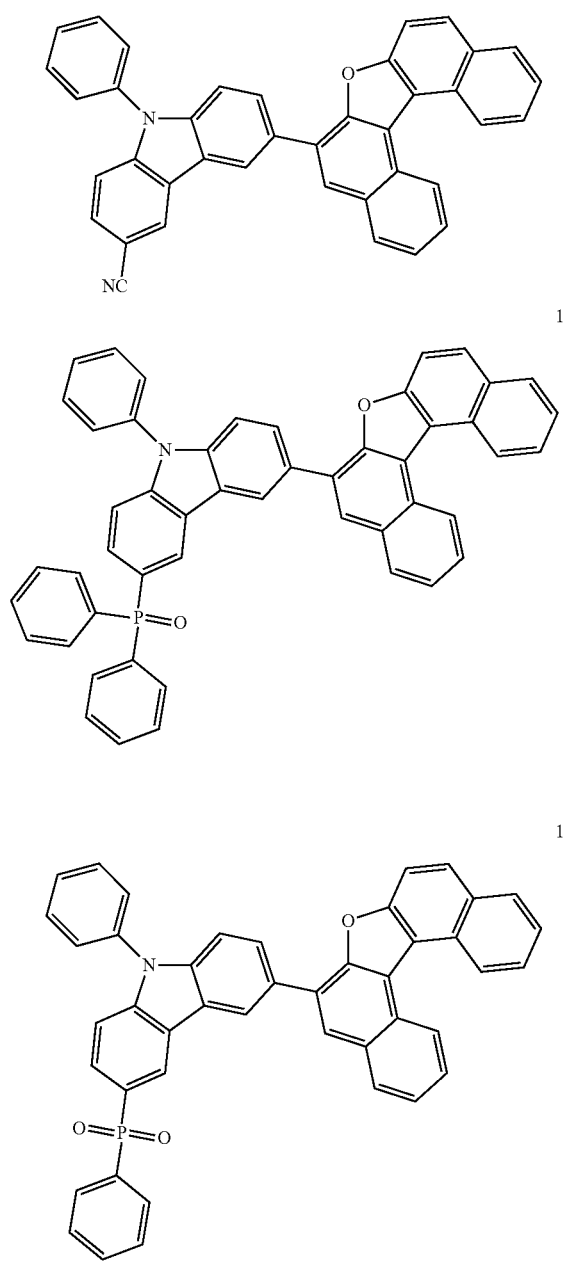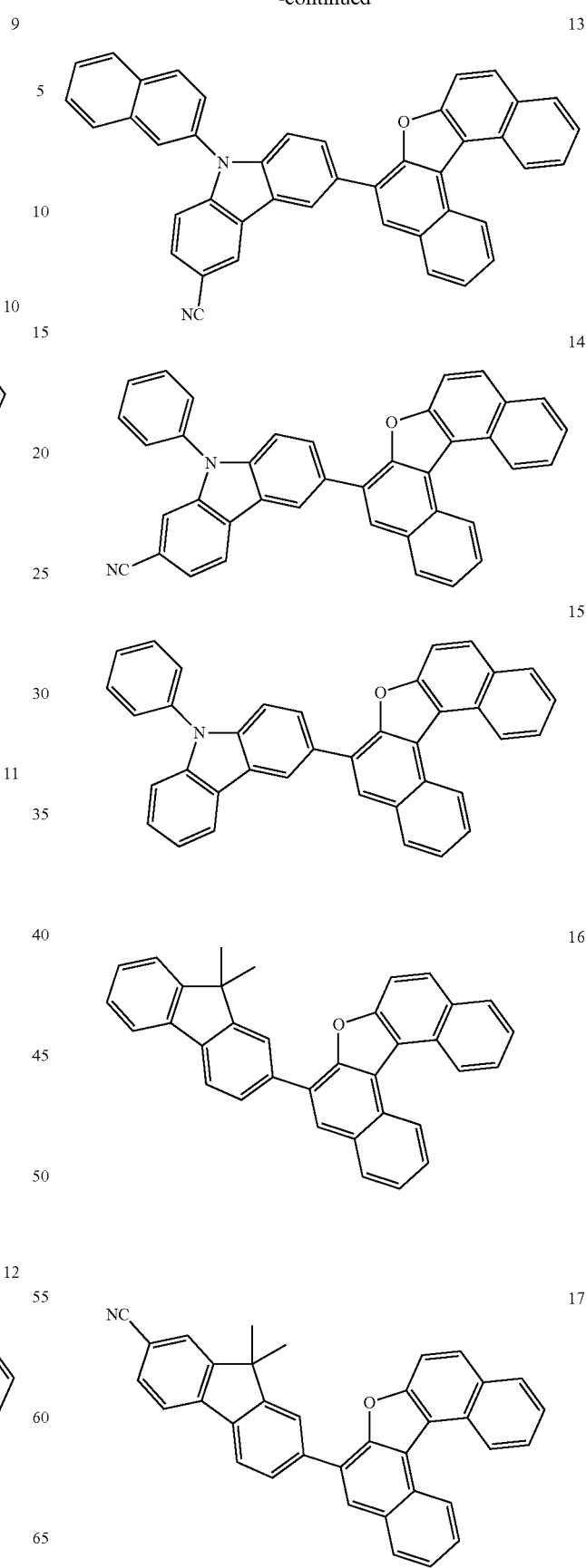

18
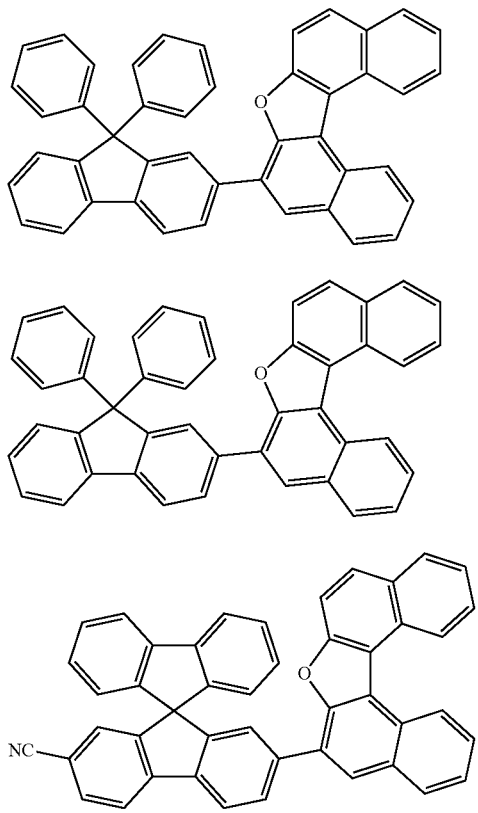
19
20
21
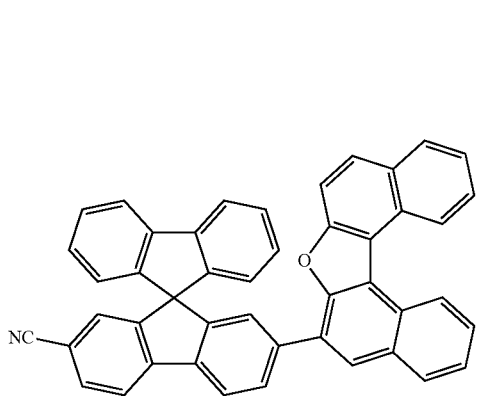
22
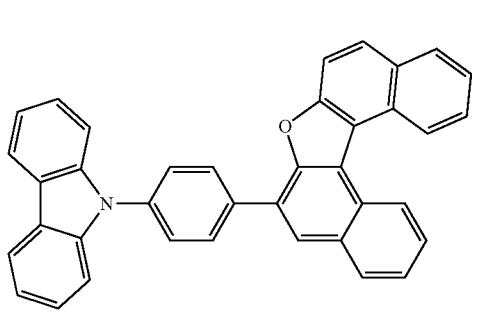
23
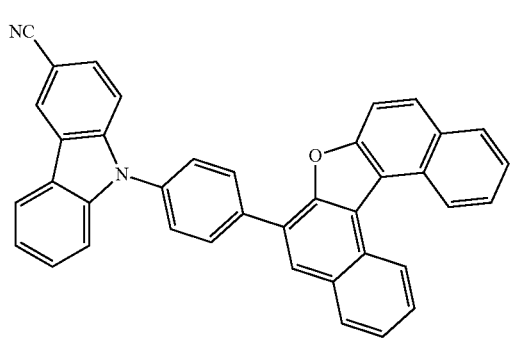
24
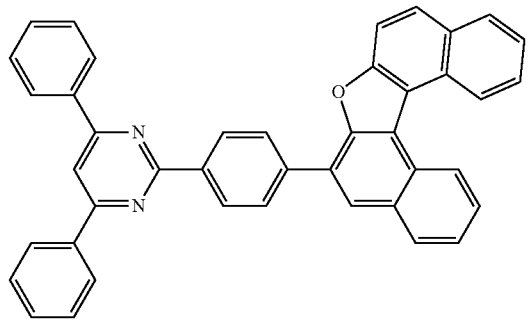
25
26
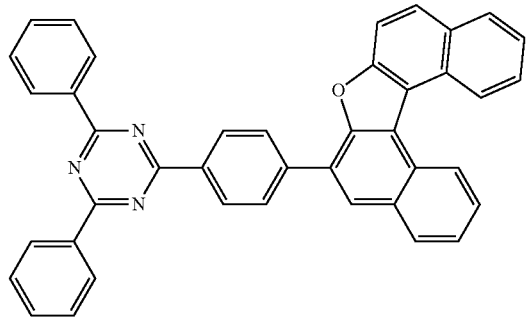

-continued
27
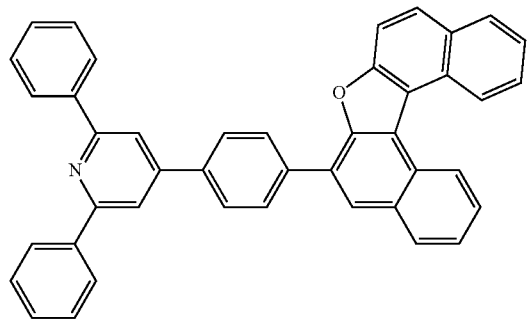
28
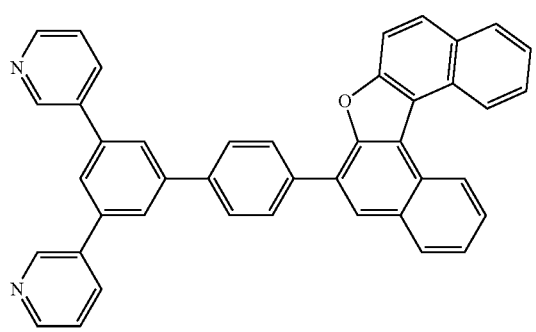
29
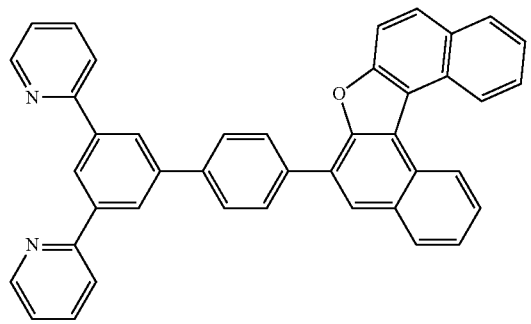
30
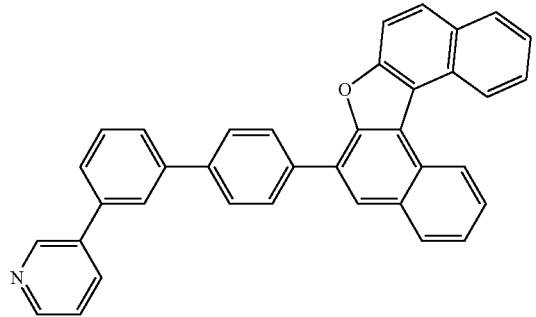
31
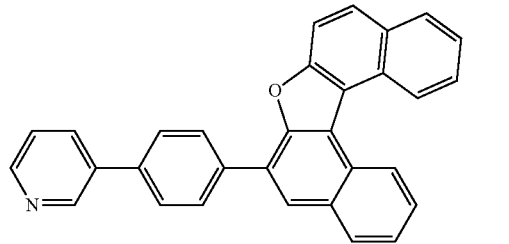
-continued
32
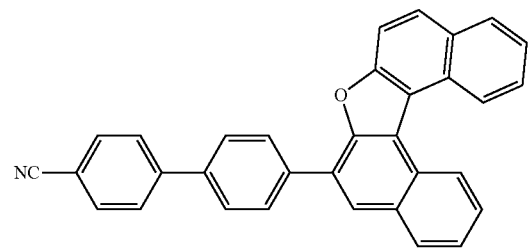
33
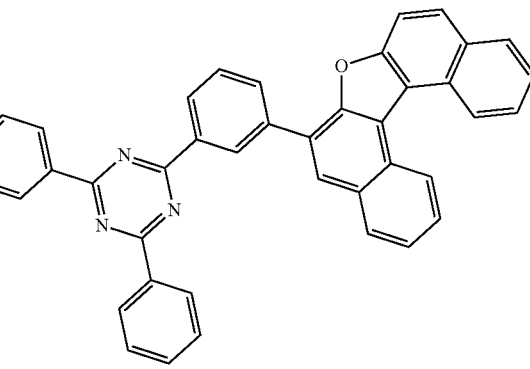
34
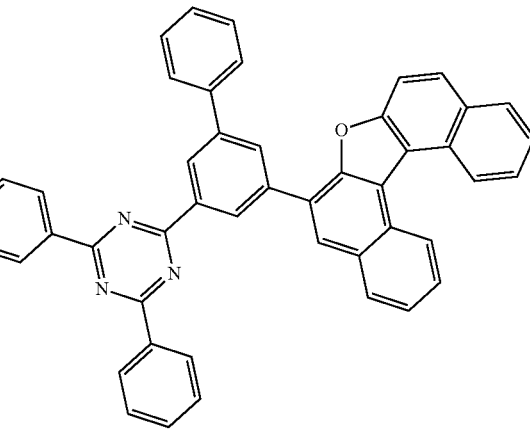
35
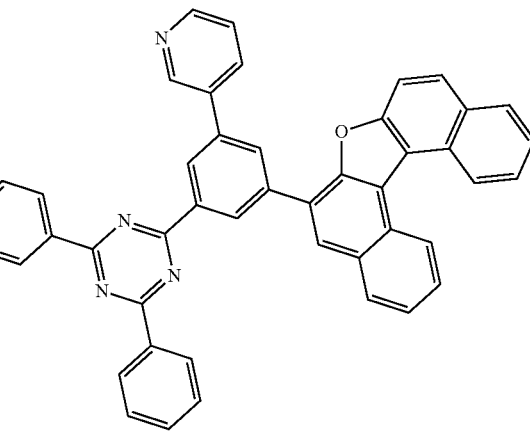

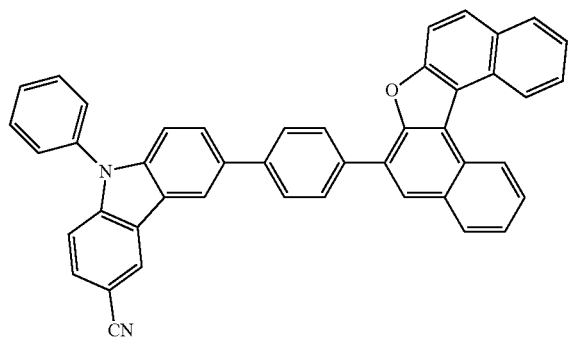
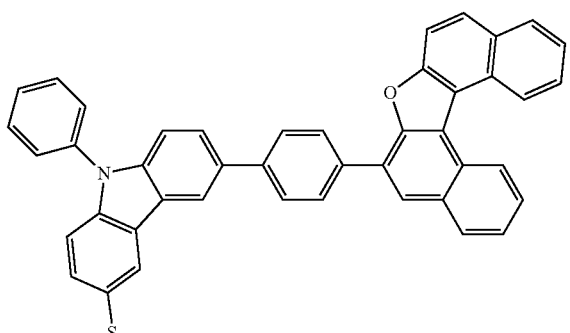

44
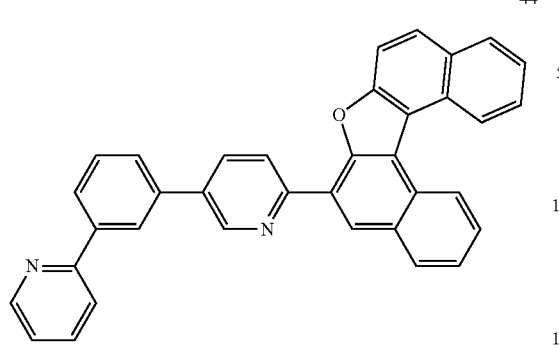
45
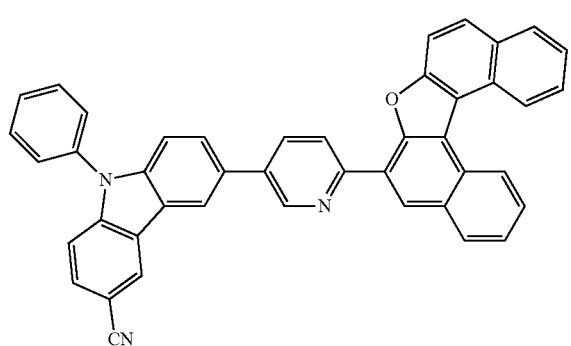
46
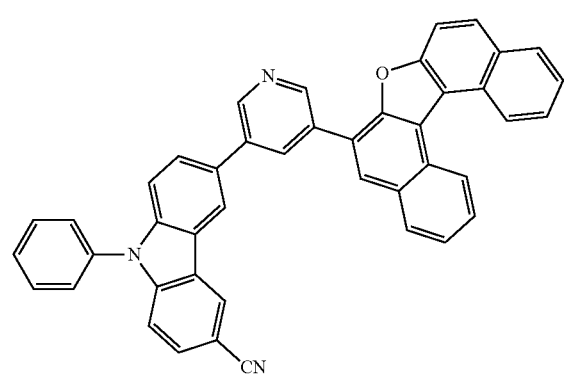
47
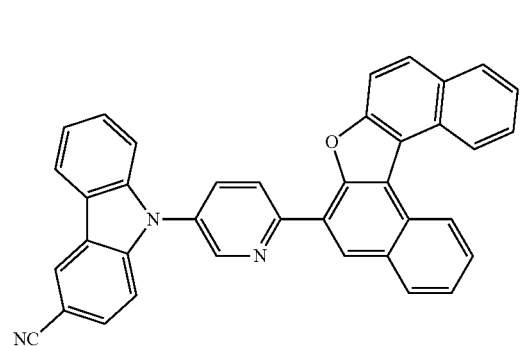
48
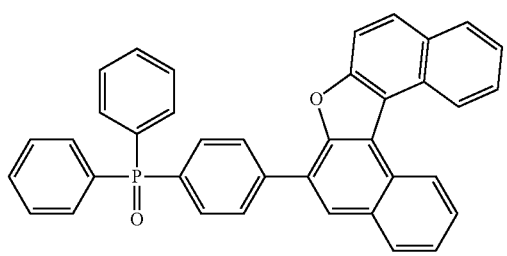
49
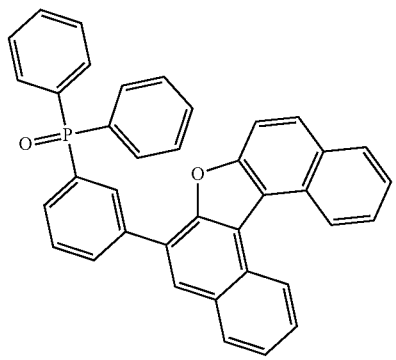
50
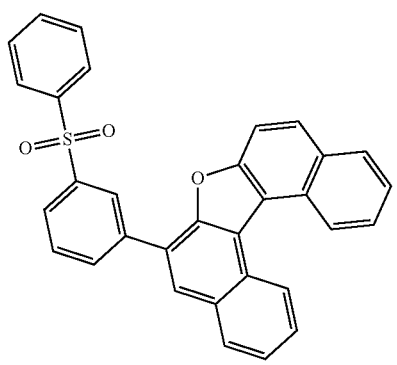
51
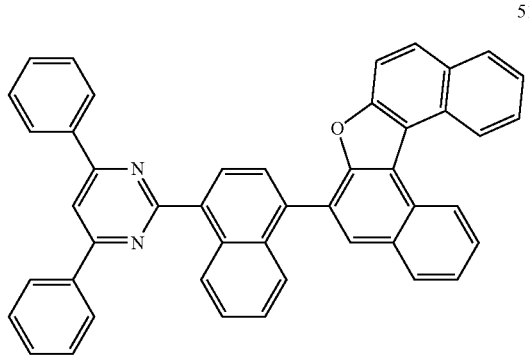

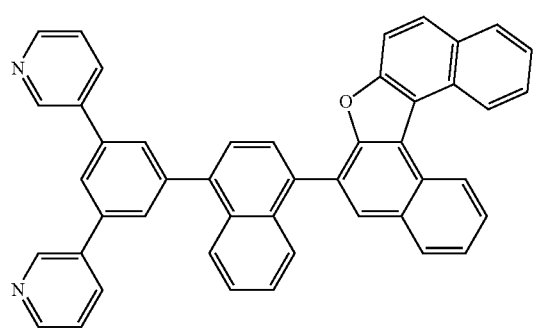
52
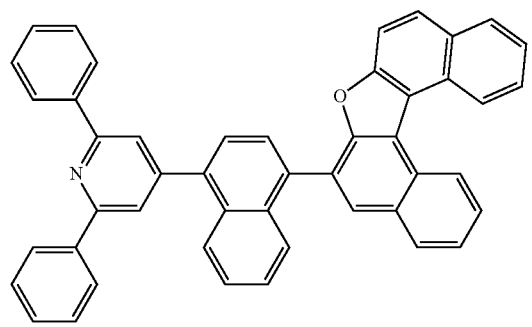
53
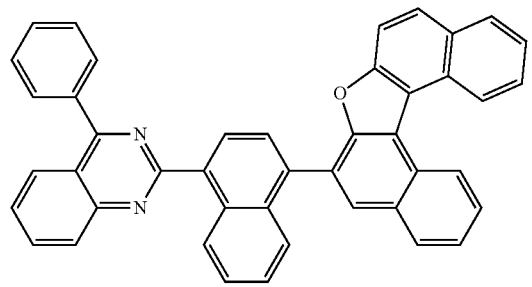
54
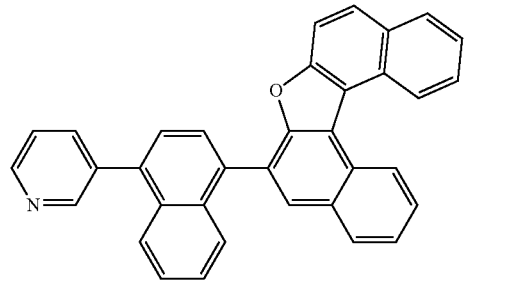
55
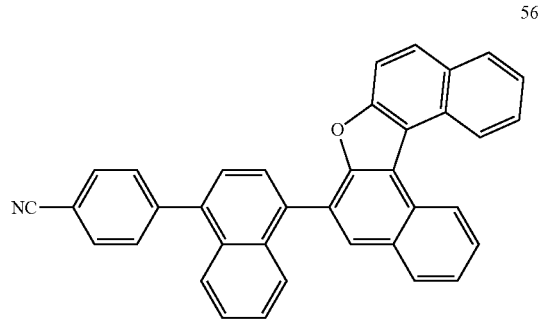
56
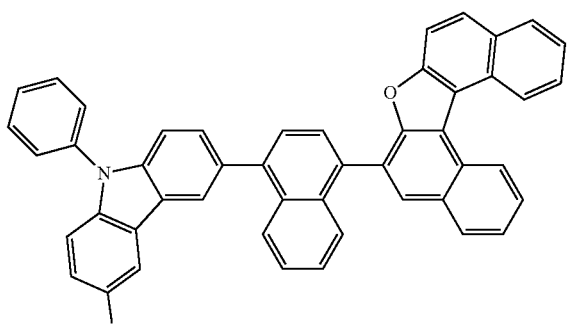
57
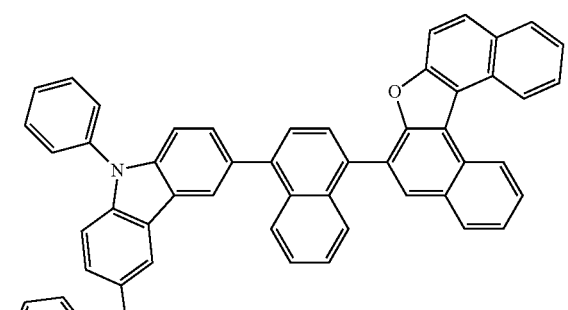
58
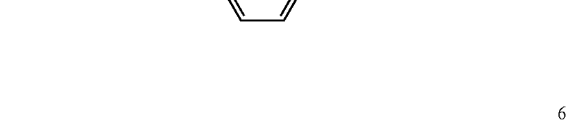
59
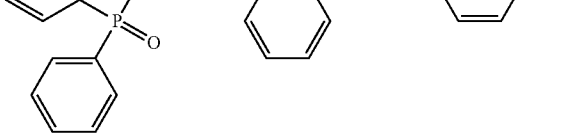
60

61
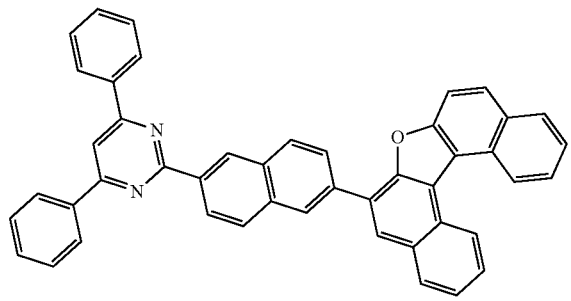
62
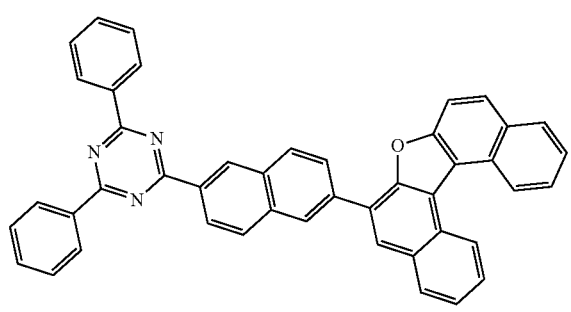
63
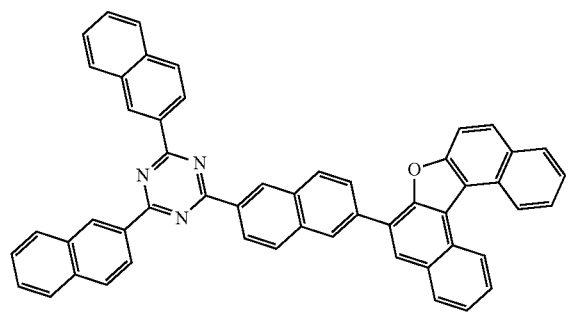
64
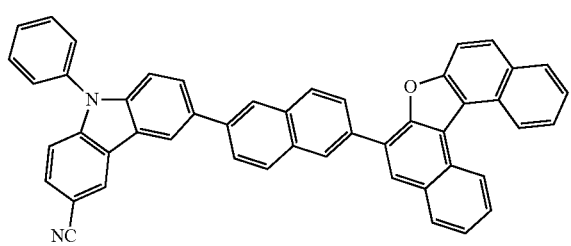
65
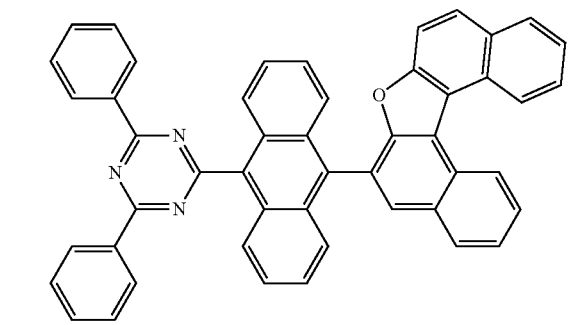
66
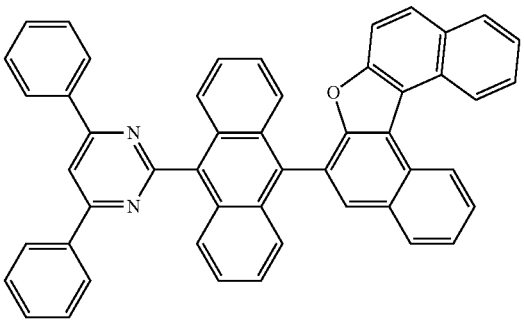
67
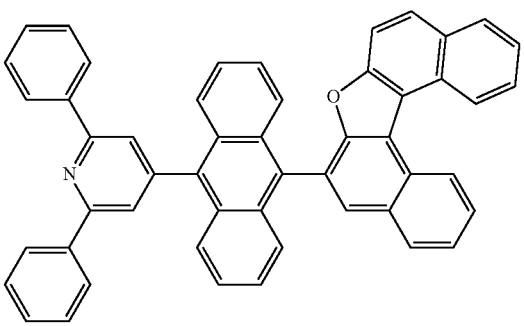
68
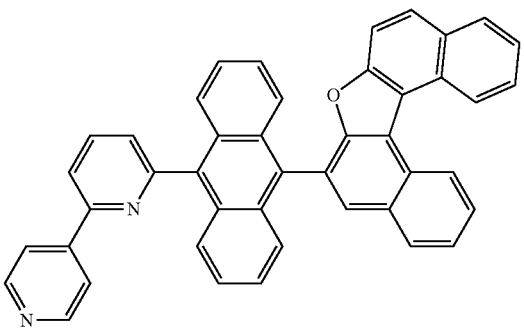
69
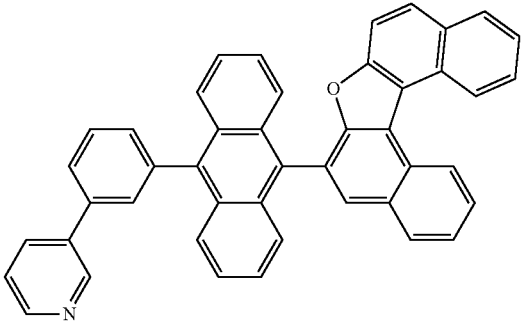

70
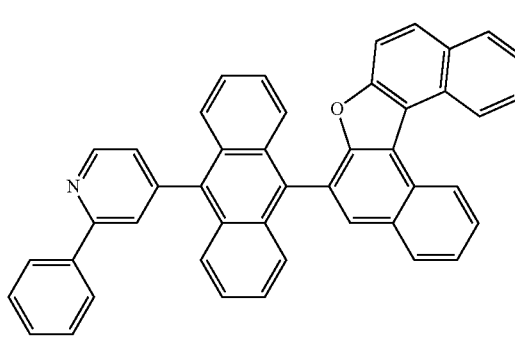
71
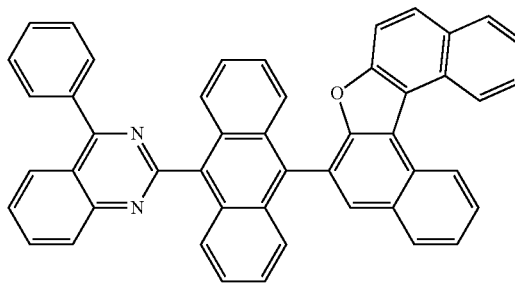
72
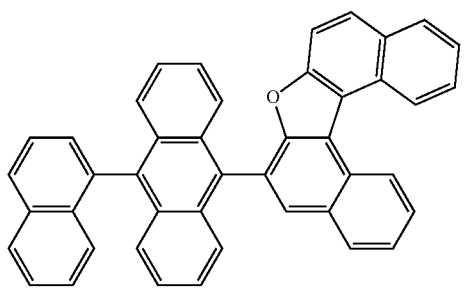
73
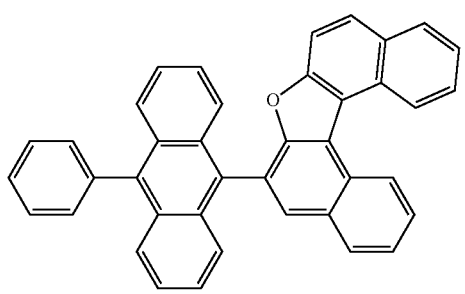
74
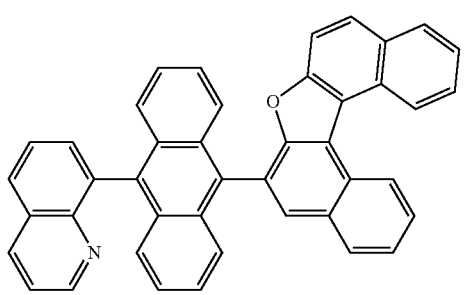
75
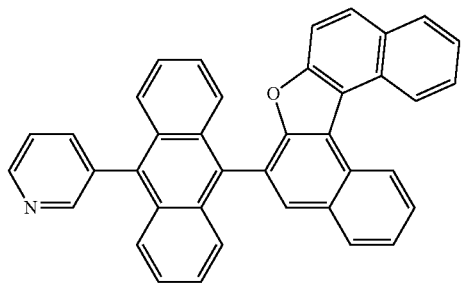
76
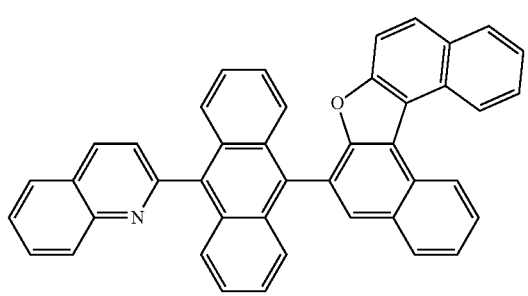
77
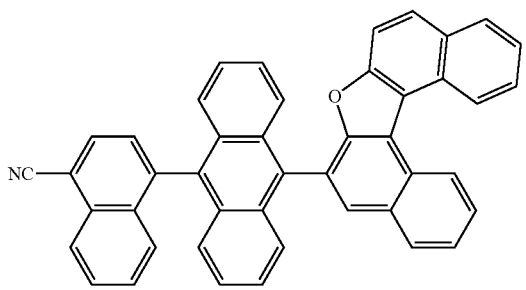
78
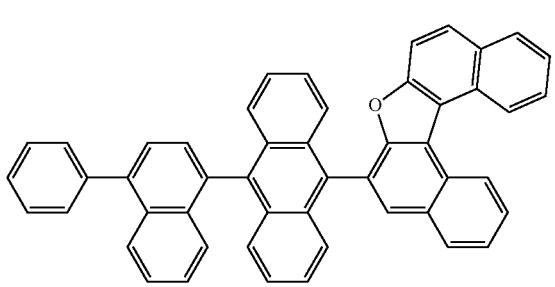
79
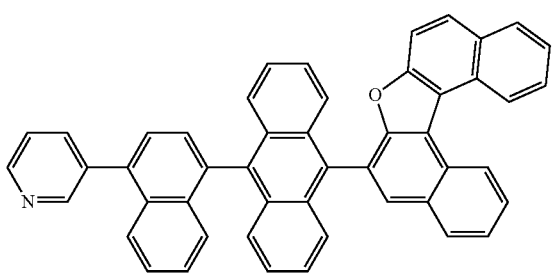

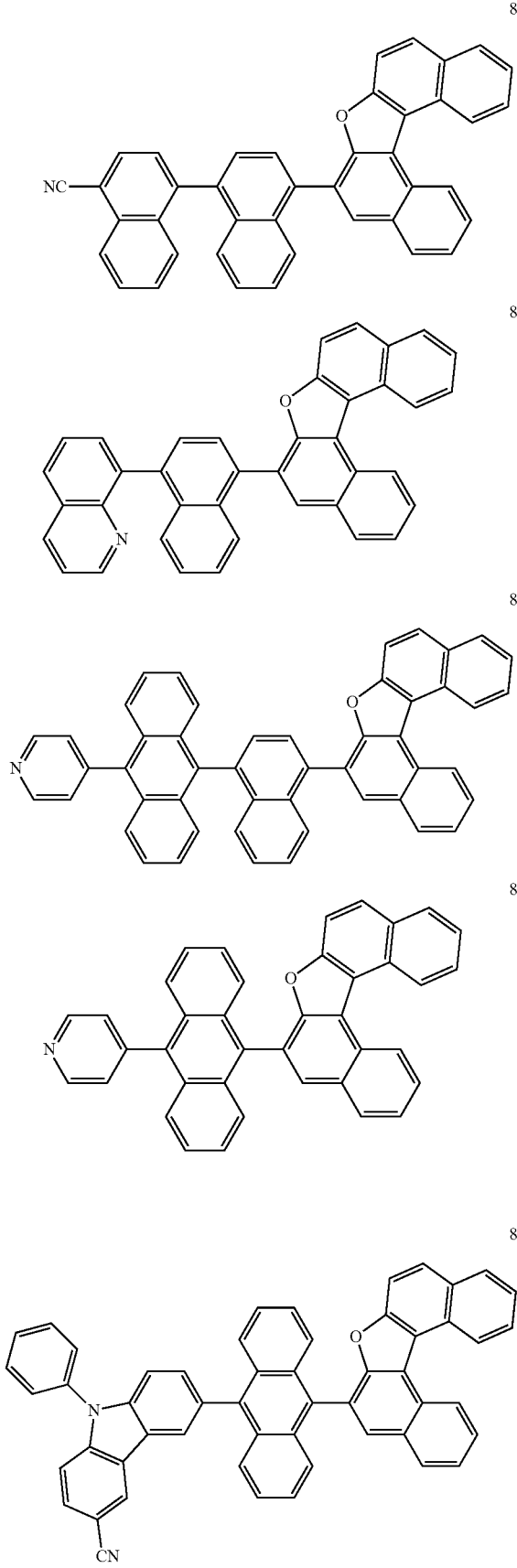
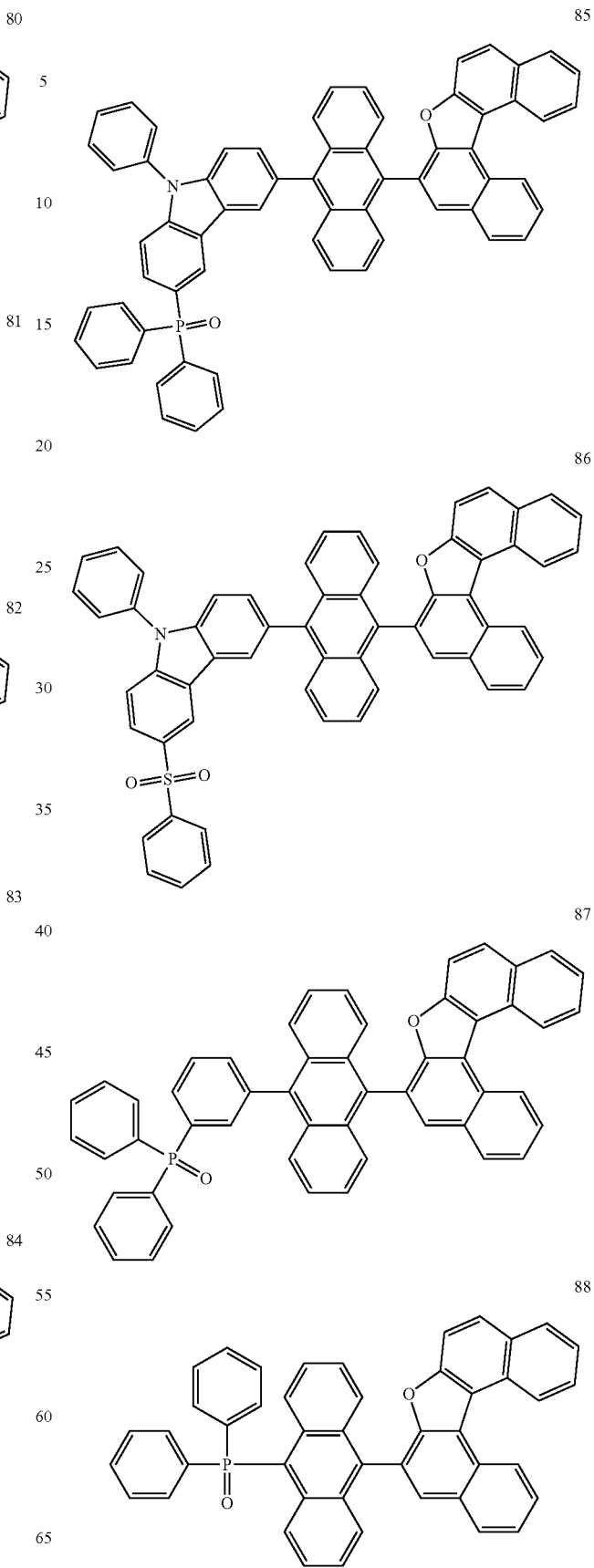

89
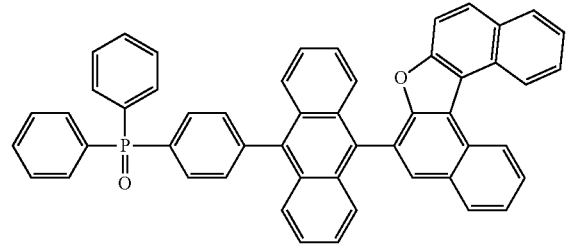
90
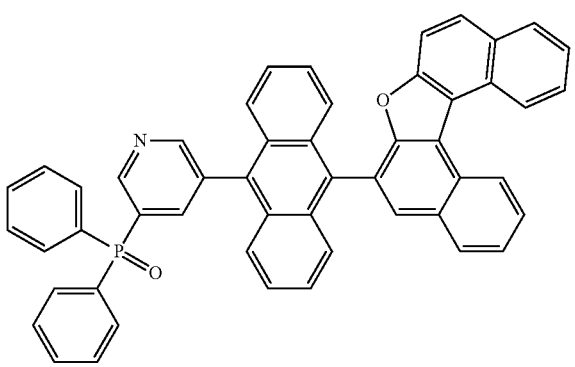
91
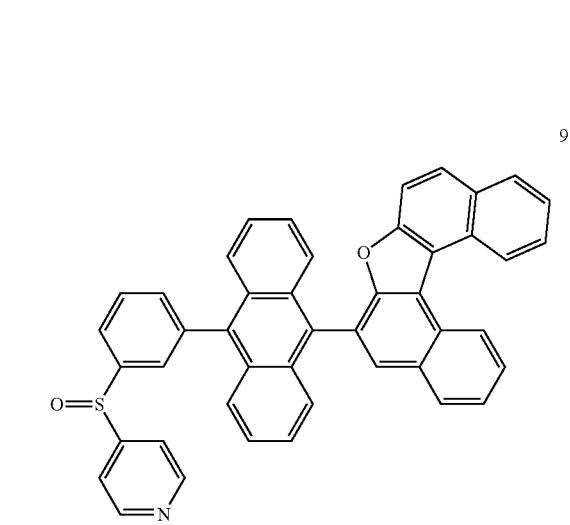
92
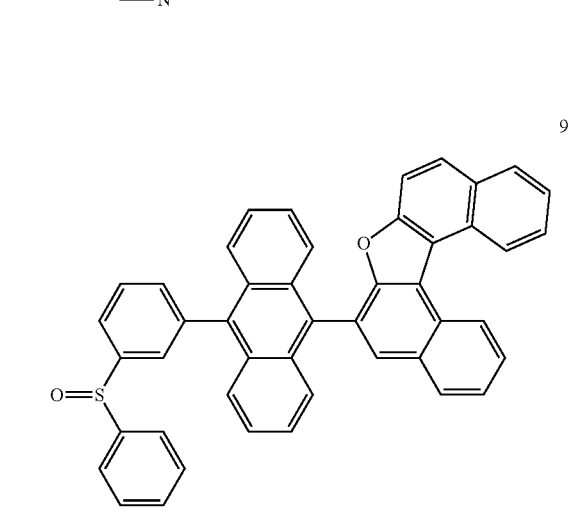
93
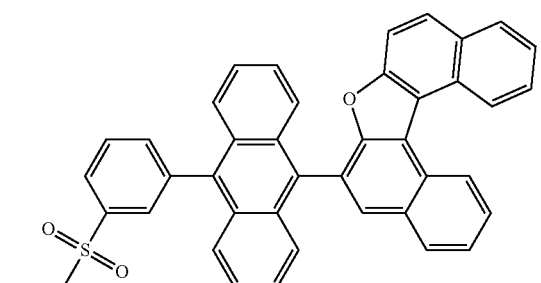
94
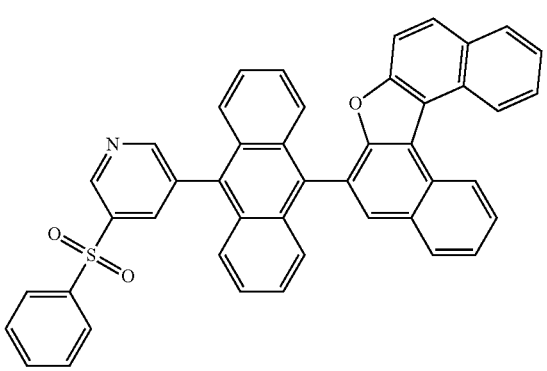
95
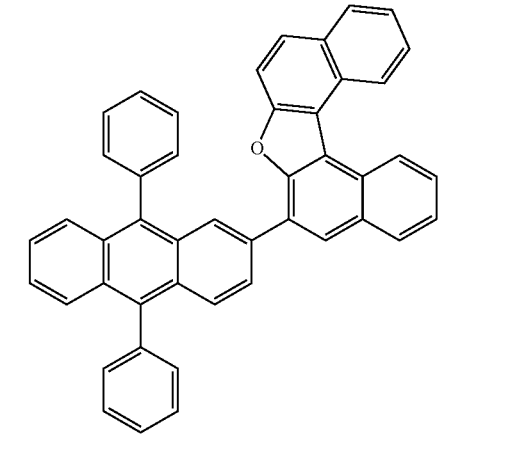
96

-continued

97

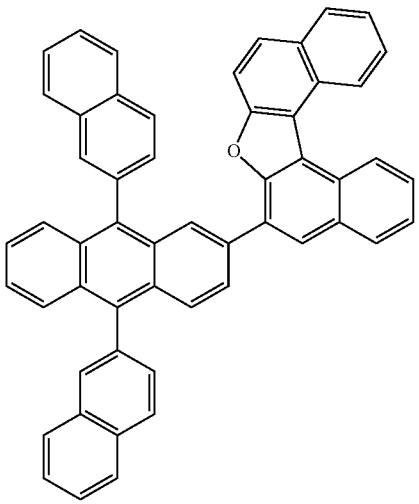

As used herein, the term the "organic layer" refers to a single layer and/or a plurality of layers disposed (e.g., positioned) between the first electrode and the second electrode in an organic light-emitting device. A material included in the "organic layer" is not limited to an organic material.

The drawing is a schematic view of an organic light-emitting device 10 according to an embodiment. The organic light-emitting device 10 includes a first electrode 110, an organic layer 150, and a second electrode 190.

Hereinafter, a structure and a method of manufacturing the organic light-emitting device according to an embodiment will be described with reference to the drawing.

Referring to the drawing, a substrate may be additionally disposed under the first electrode 110 or on the second electrode 190. The substrate may be a glass substrate or transparent plastic substrate, each with excellent mechanical strength, thermal stability, transparency, surface smoothness, ease of handling, and/or water resistance.

The first electrode 110 may be formed by depositing or sputtering a material for forming the first electrode on the substrate. When the first electrode 110 is an anode, the material for the first electrode may be selected from materials with a high work function so as to facilitate hole injection. The first electrode 110 may be a reflective electrode, a semi-transmissive electrode, or a transmissive electrode. The material for the first electrode may be a transparent and highly conductive material, and non-limiting examples of such material include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one selected from magnesium (Mg), aluminum (Al), aluminum-lithium (Al—Li), calcium (Ca), magnesium-indium (Mg'In), and magnesium-silver (Mg—Ag) may be used.

The first electrode 110 may have a single-layer structure, or a multi-layer structure including a plurality of layers. For example, the first electrode 110 may have a triple-layer structure of ITO/Ag/ITO, but embodiments are not limited thereto.

The organic layer 150 may be disposed on the first electrode 110. The organic layer 150 may include an emission layer.

The organic layer 150 may further include a hole transport region disposed between the first electrode and the emission layer, and an electron transport region disposed between the emission layer and the second electrode.

The hole transport region may include a hole transport layer (HTL) and at least one selected from a hole injection layer (HIL) and a buffer layer; and the electron transport region may include an electron transport layer (ETL) and at least one selected from a hole blocking layer (HBL) and an electron injection layer (EIL), but embodiments of the present disclosure are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein the layers of each structure are sequentially stacked from the first electrode 110 in this stated order, but embodiments of the present disclosure are not limited thereto.

When the hole transport region includes a hole injection layer, the hole injection layer may be formed on the first electrode 110 by using one or more suitable methods, such as vacuum-deposition, spin coating, casting, Langmuir-Blodgett (LB) method, ink-jet printing, laser-printing, and/or laser-induced thermal imaging (LITI).

When the hole injection layer is formed by vacuum deposition, the deposition may be performed, for example, at a deposition temperature of about 100° C. to about 500° C., at a vacuum degree of about $10^{-8}$ torr to about $10^{-3}$ torr, and a deposition rate of about 0.01 Å/sec to about 100 Å/sec, in consideration of a compound for forming the hole injection layer to be deposited and a structure of the hole injection layer to be formed.

When the hole injection layer is formed by spin coating, the coating may be performed, for example, at a coating speed of about 2,000 rpm to about 5,000 rpm and at a temperature of about 80° C. to about 200° C., in consideration of a compound for forming the hole injection layer to be deposited and a structure of the hole injection layer to be formed.

When the hole transport region includes a hole transport layer, the hole transport layer may be formed on the first electrode 110 or the hole injection layer by using one or more suitable methods, such as vacuum-deposition, spin coating, casting, LB method, ink-jet printing, laser-printing, and/or LITI. When the hole transport layer is formed by vacuum-deposition and/or spin coating, conditions for vacuum-deposition and coating may be similar to the above-described vacuum-deposition and coating conditions for forming the hole injection layer.

The hole transport region may include at least one selected from m-MTDATA, TDATA, 2-TNATA, NPB, 8-NPB, TPD, a spiro-TPD, a spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201 below, and a compound represented by Formula 202 below:

-continued
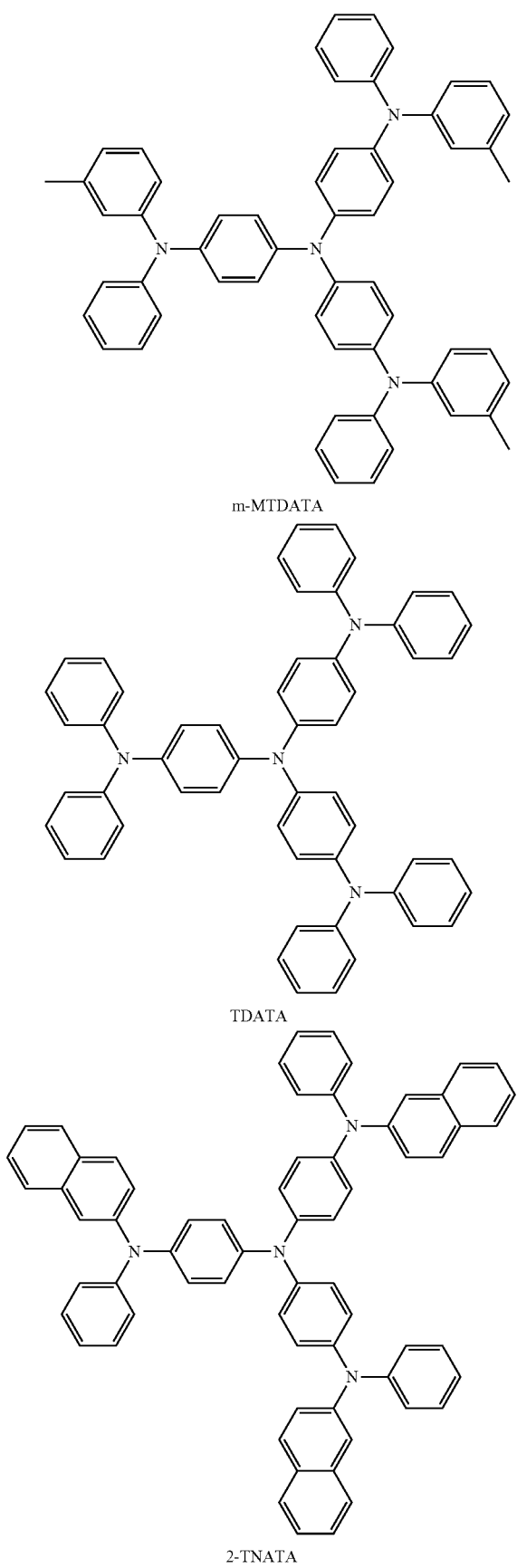
m-MTDATA
TDATA
2-TNATA
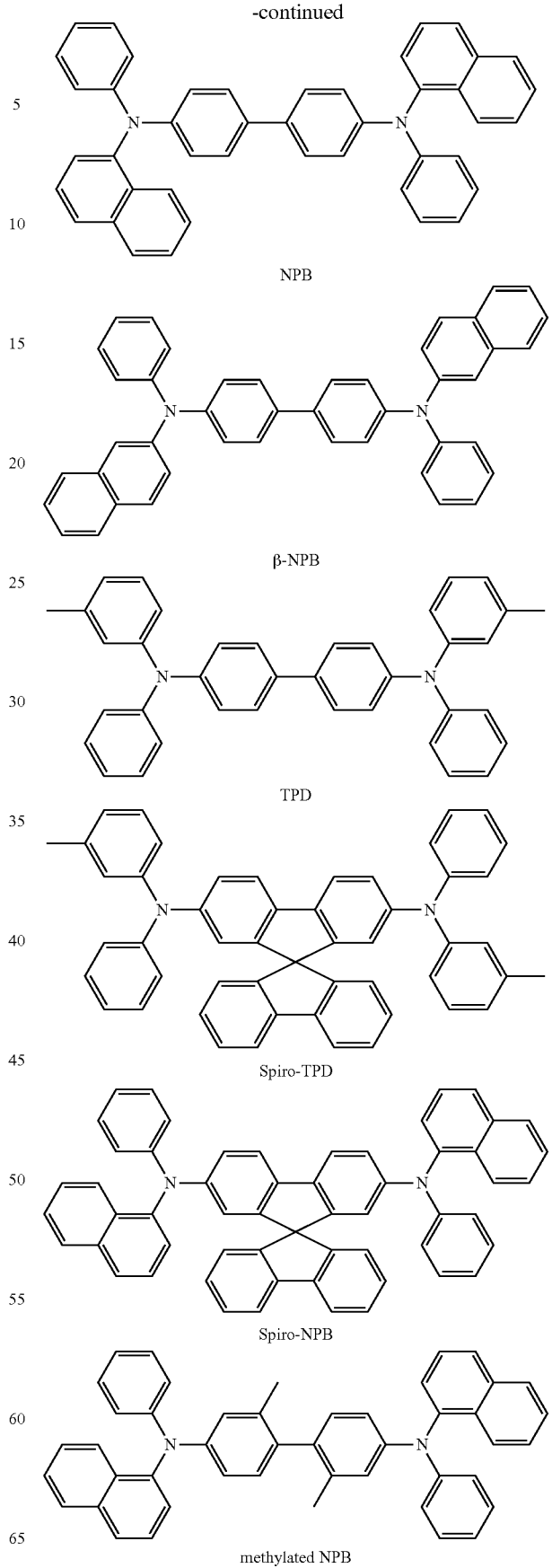
NPB
β-NPB
TPD
Spiro-TPD
Spiro-NPB
methylated NPB

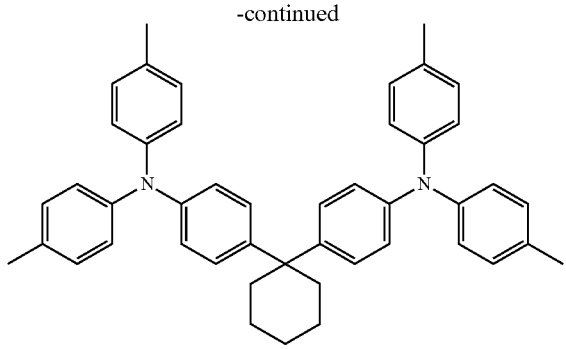

TAPC

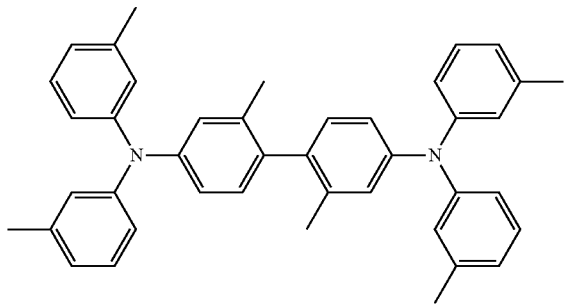

HMTPD

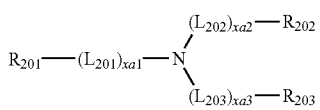

Formula 201

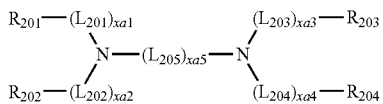

Formula 202

In Formulae 201 and 202, $L_{201}$ to $L_{205}$ may be each independently selected from a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xa1 to xa4 may be each independently selected from 0, 1, 2, and 3; and xa5 may be selected from 1, 2, 3, 4, and 5;

$R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formulae 201 and 202, $L_{201}$ to $L_{205}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently selected from 0, 1, and 2;

xa5 may be selected from 1, 2, and 3;

$R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments are not limited thereto.

The compound represented by Formula 201 may be represented by Formula 201A:

Formula 201A

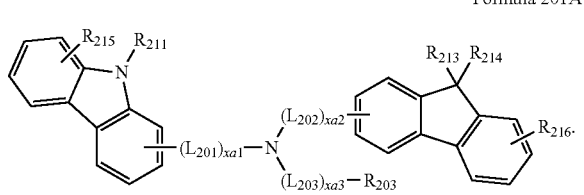

In some embodiments, the compound represented by Formula 201 may be represented by Formula 201A-1, but embodiments are not limited thereto:

Formula 201A-1

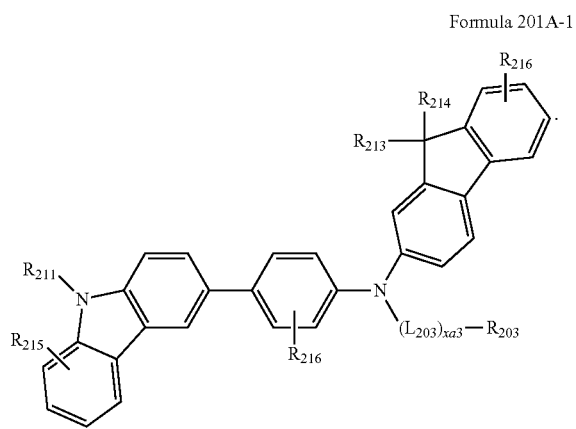

In some embodiments, the compound represented by Formula 202 may be represented by Formula 202A, but embodiments are not limited thereto:

Formula 202A

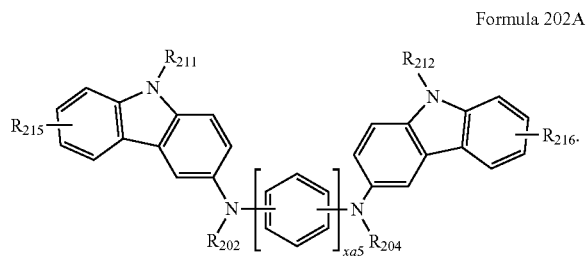

In Formulae 201A, 201A-1, and 202A, the descriptions of $L_{201}$ to $L_{203}$, xa1 to xa3, xa5, and $R_{202}$ to $R_{204}$ may be the same as provided herein; description of $R_{211}$ may be the same as the one provided in connection with $R_{203}$; and $R_{213}$ to $R_{216}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In some embodiments, in Formulae 201A-1 and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently selected from 0 and 1;

$R_{203}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be selected from 1 and 2.

In Formulae 201A and 201A-1, $R_{213}$ and $R_{214}$ may link to each other form a saturated ring or an unsaturated ring.

In some embodiments, $R_{211}$ in Formula 201A may be a substituted or unsubstituted phenyl group or a substituted or unsubstituted pyridyl group.

In some embodiments, $R_{213}$ and $R_{214}$ in Formula 201A may be each independently a methyl group or a phenyl group.

In some embodiments, the hole transport layer of the hole transport region may include the compound represented by Formula 201A.

The compound represented by Formula 201A may include any of compounds below, but embodiments are not limited thereto:

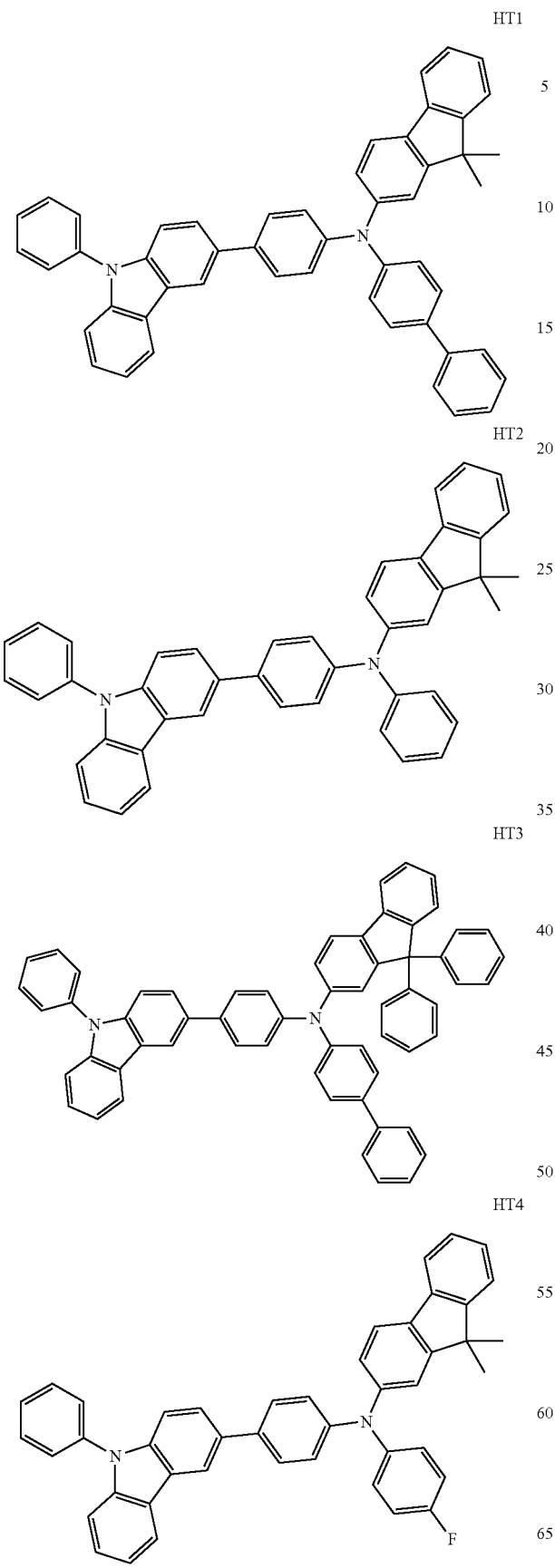

-continued
HT8
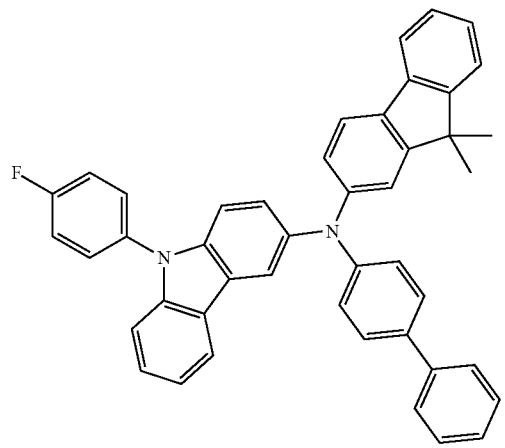
HT11
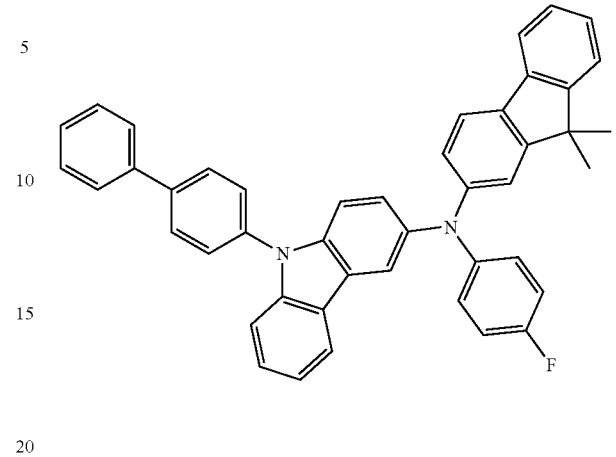
HT9
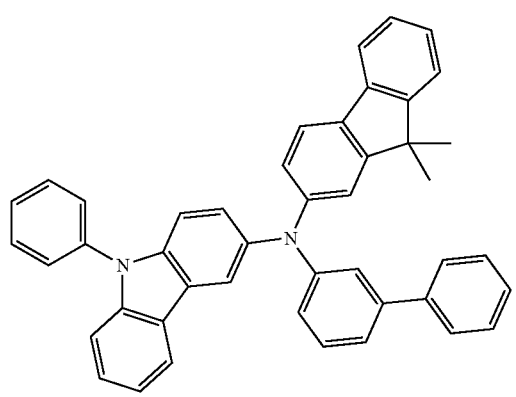
HT12
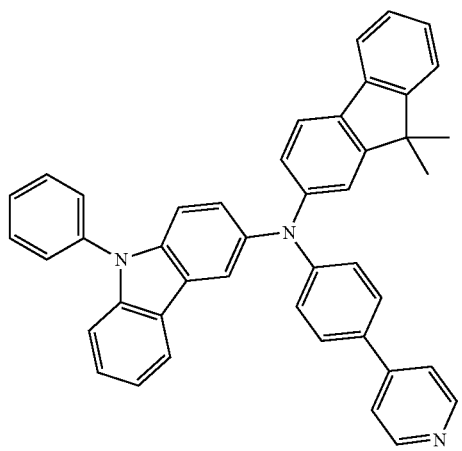
HT10
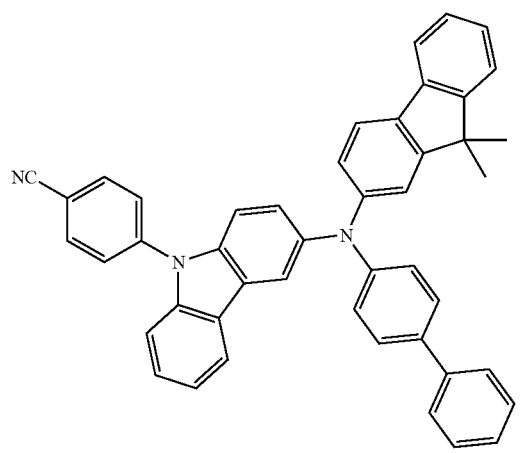
HT13
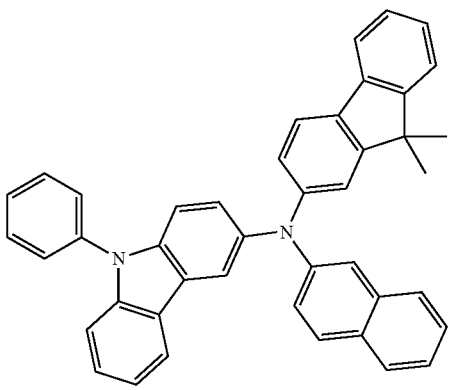

HT14
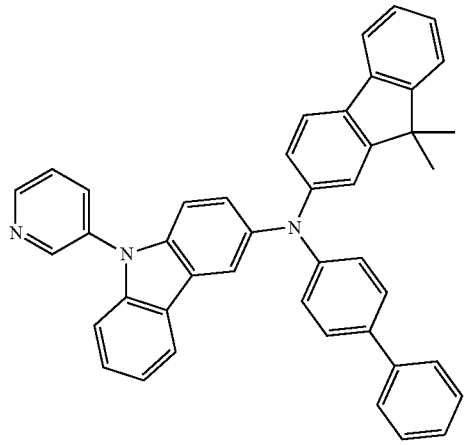
HT15
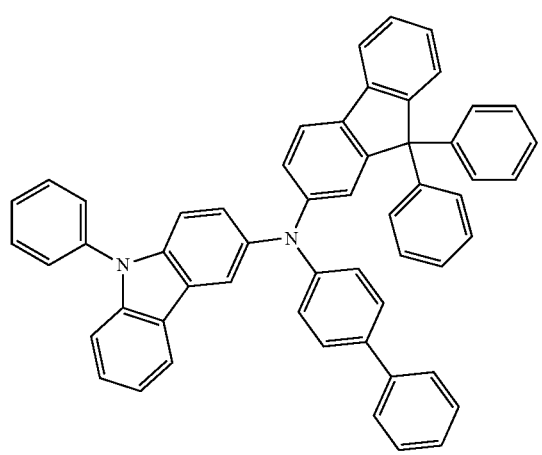
HT16
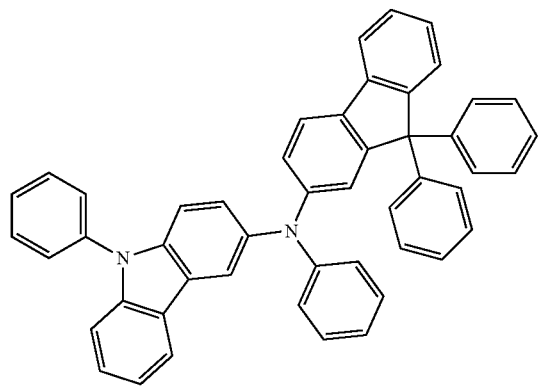
HT17
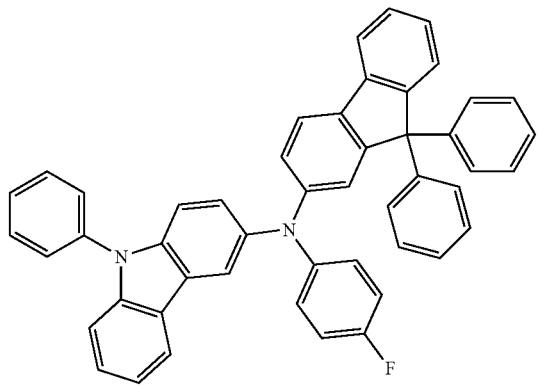
HT18
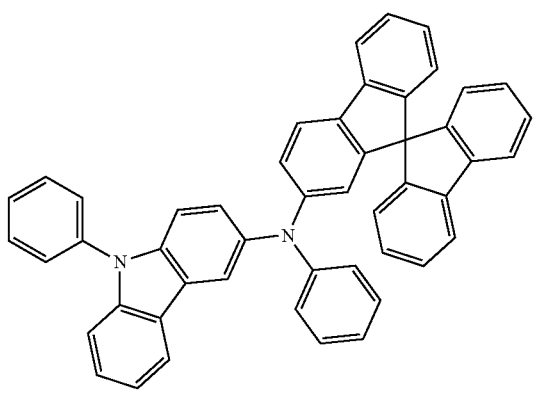
HT19
HT20
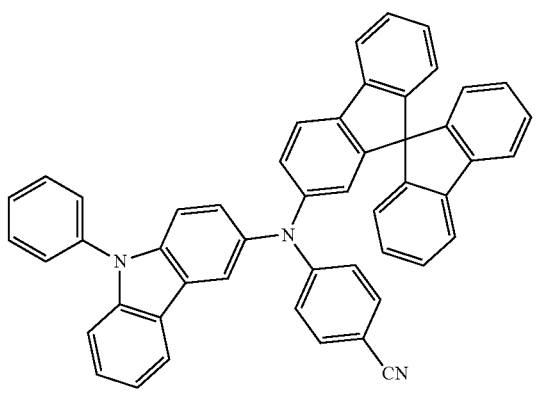

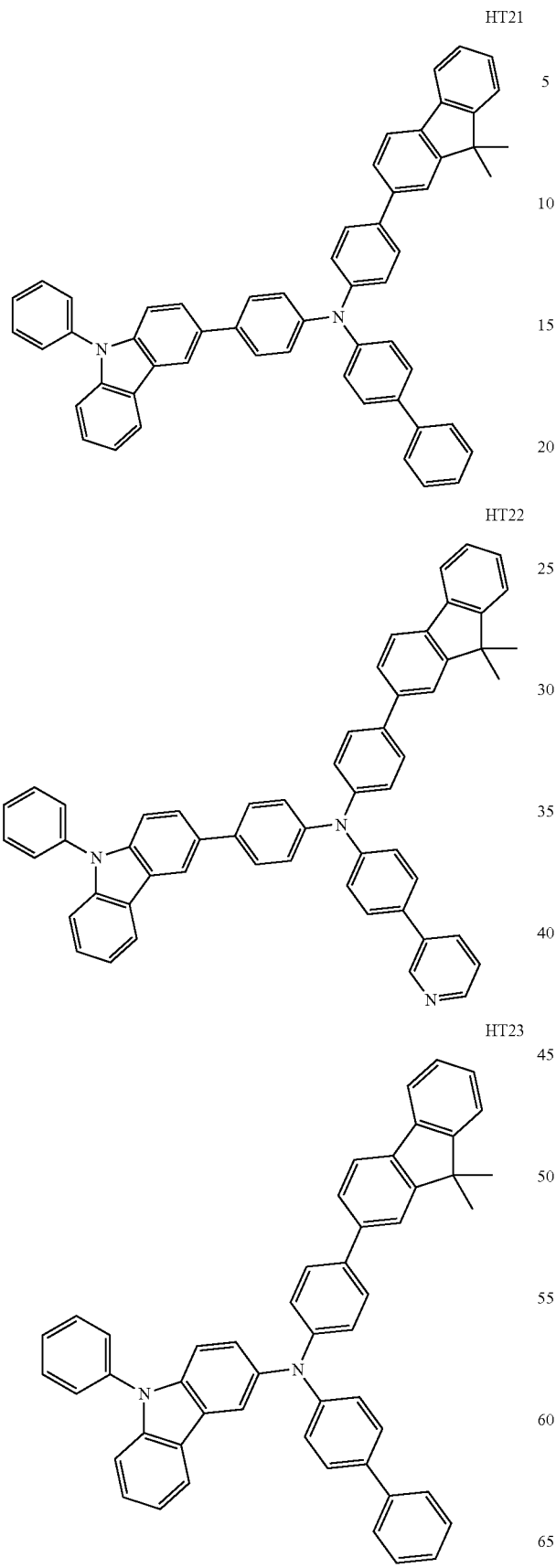
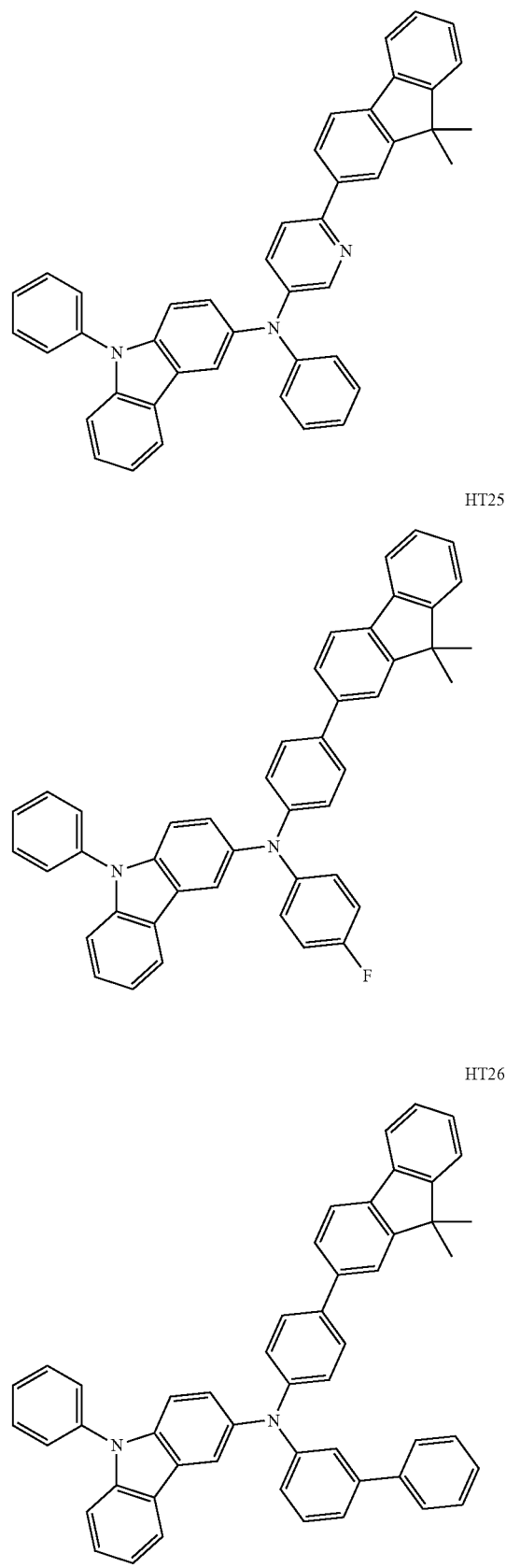

HT27
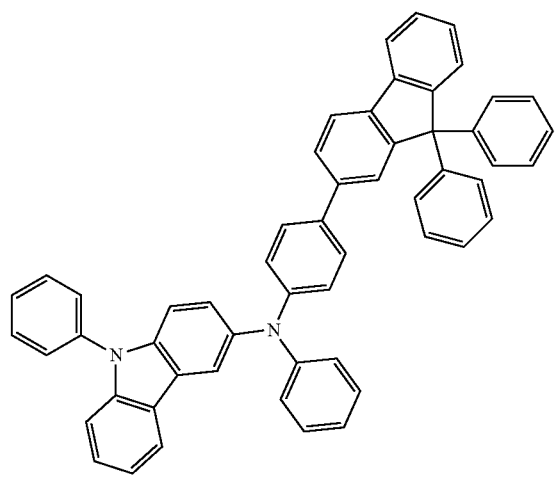
HT30
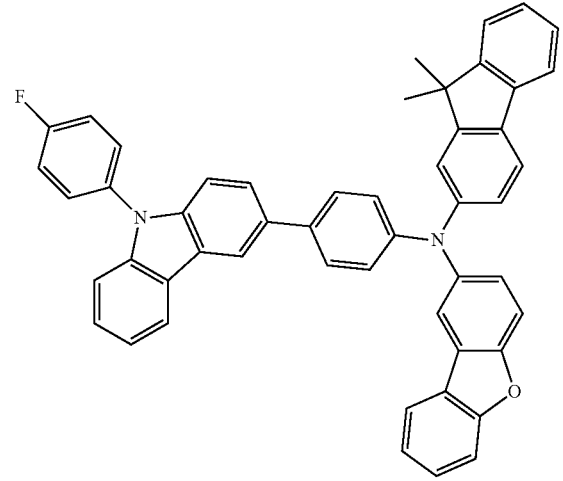
HT28
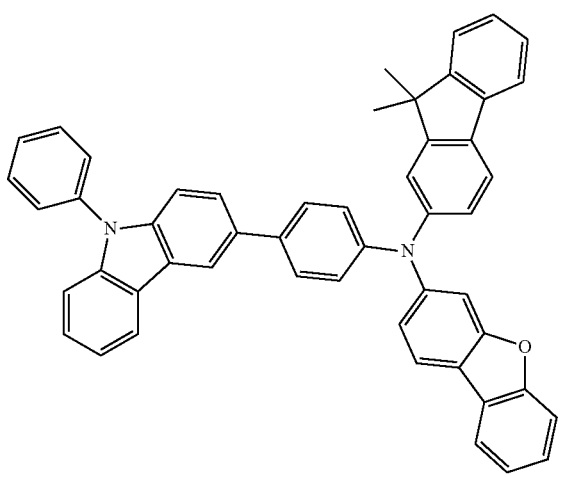
HT31
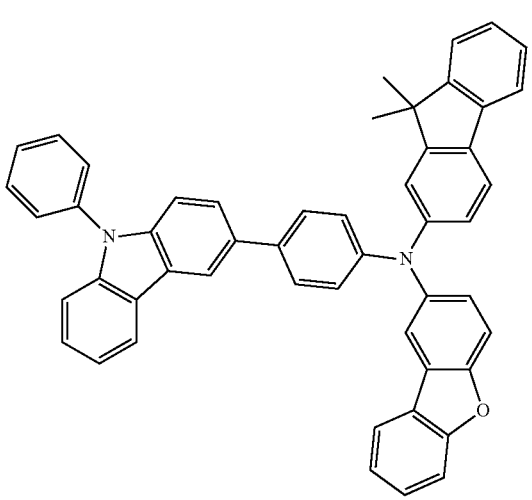
HT29
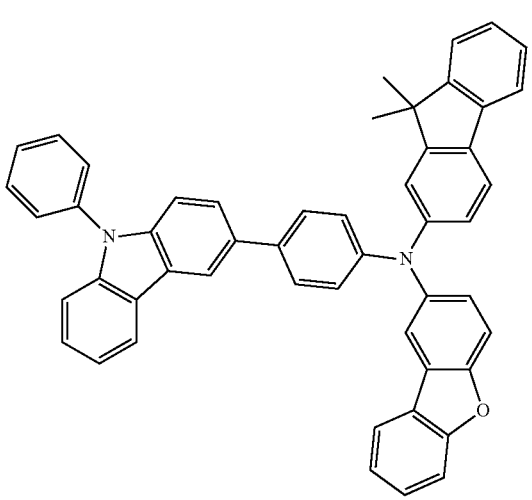
HT32
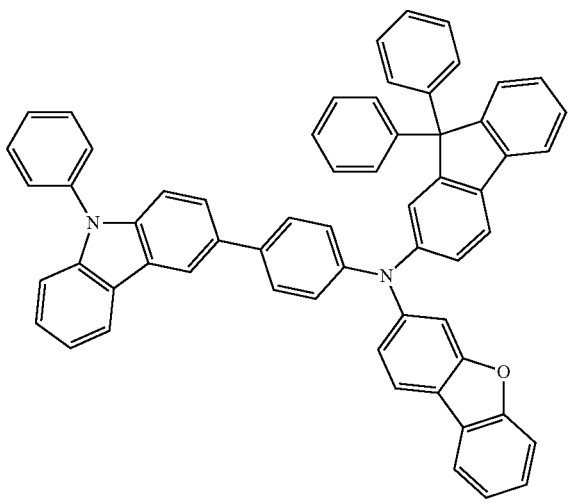

-continued

HT33

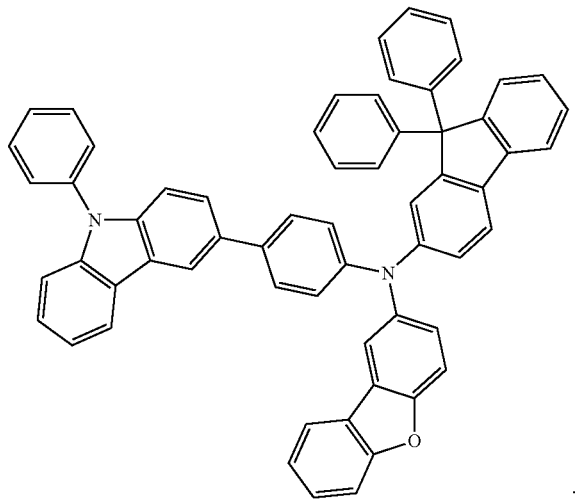

A thickness of the hole transport region may be in a range of about 100 Å to about 10,000 Å, for example, about 100 Å to about 1,000 Å. When the hole transport region includes a hole injection layer and a hole transport layer, the thickness of the hole injection layer may be in a range of about 100 Å to about 10,000 Å, for example, about 100 Å to about 1,000 Å; and the thickness of the hole transport layer may be in a range of about 50 Å to about 2,000 Å, for example, about 100 Å to about 1,500 Å.

When the thicknesses of the hole transport region, the hole injection layer, and the hole transport layer are within any of these ranges, excellent (or suitable) hole transport characteristics may be obtained without a substantial increase in driving voltage.

The hole transport region may further include, in addition to the materials mentioned above, a charge-generating material to improve conductive properties. The charge-generating material may be homogeneously or non-homogeneously dispersed throughout the hole transport region.

The charge-generating material may be, for example, a p-dopant. The p-dopant may be one selected from a quinone derivative, a metal oxide, and a cyano group-containing compound, but embodiments are not limited thereto. Non-limiting examples of the p-dopant include quinone derivatives (such as tetracyanoquinonedimethane (TCNQ) and/or 2,3,5,6-tetrafluoro-tetracyano-1,4-benzoquinonedimethane (F4-TCNQ)); metal oxides (such as tungsten oxide and/or molybdenum oxide); and Compound HT-D1 illustrated below.

Compound HT-D1

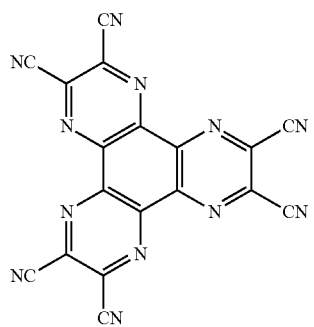

F4-TCNQ

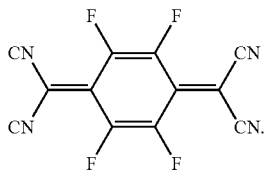

The hole transport region may further include a buffer layer and/or an electron blocking layer, in addition to the hole injection layer and hole transport layer described above. Since the buffer layer may compensate for an optical resonance distance according to a wavelength of light emitted from the emission layer, light-emission efficiency of the formed organic light-emitting device may be improved. As a material included in the buffer layer, any of materials that are included in the hole transport region may be used. The electron blocking layer may prevent or reduce the injection of electrons from the electron transport region.

An emission layer may be formed on the first electrode 110 or the hole transport region by using one or more suitable methods, such as vacuum-deposition, spin coating, casting, LB method, ink-jet printing, laser-printing, and/or LITI. When the emission layer is formed by vacuum-deposition and/or spin coating, deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, and/or a blue emission layer, according to a sub pixel. Alternatively, the emission layer may have a stacked structure of a red emission layer, a green emission layer, and a blue emission layer, or may include a red-light emission material, a green-light emission material, and a blue-light emission material, which are mixed with each other in a single layer, to emit white light.

The emission layer may include a host and a dopant.

The host may include a compound represented by Formula 3 according to an embodiment of the present disclosure.

Formula 3

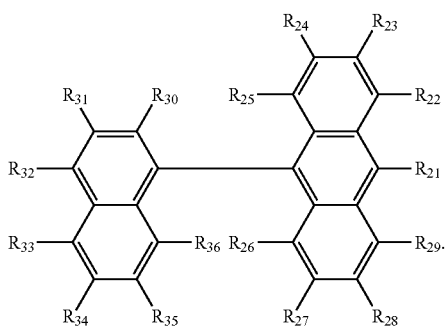

In Formula 3, $R_{21}$ to $R_{36}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

at least one substituent of the substituted $C_1$-$C_{60}$ alkyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})Q_{22})$, and —$B(Q_{26})(Q_{27})$; and
—$Si(Q_{23})(Q_{24})(Q_{25})$, wherein $Q_{11}$ to $Q_{17}$ and $Q_{21}$ to $Q_{27}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formula 3, $R_{22}$, $R_{24}$ to $R_{29}$, $R_{30}$, and $R_{33}$ to $R_{36}$ may be each independently hydrogen or deuterium.

In some embodiments, the compound represented by Formula 3 may be one of compounds below:

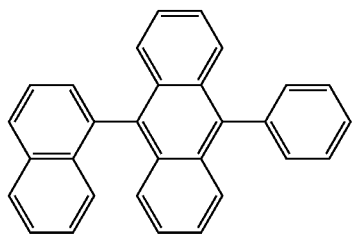

H1

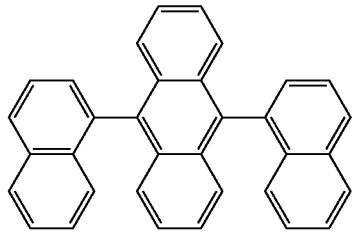

H2

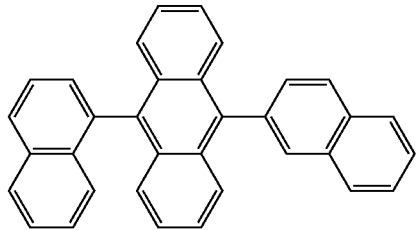

H3

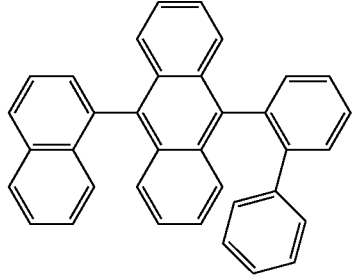

H4

H5
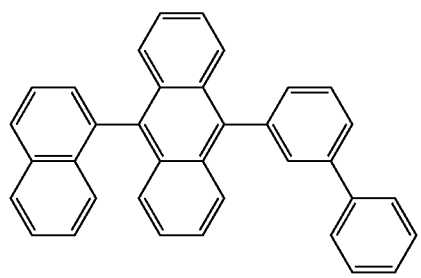
H6
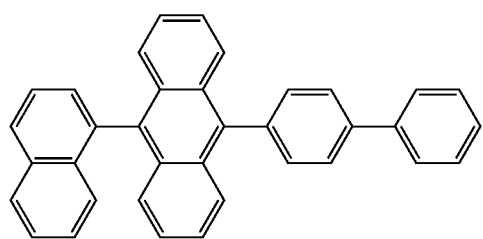
H7
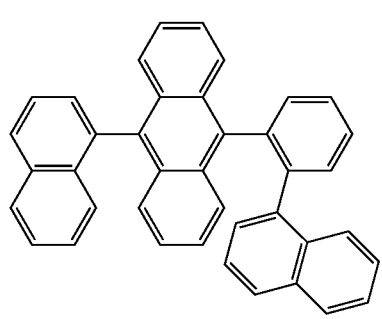
H8
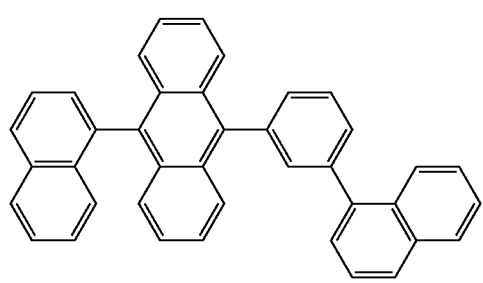
H9
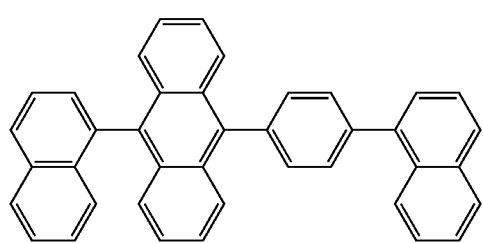
H10
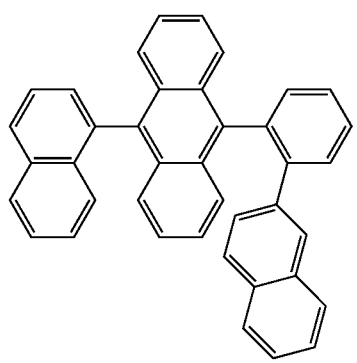
H11
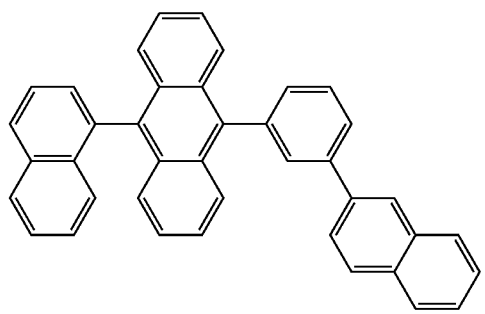
H12
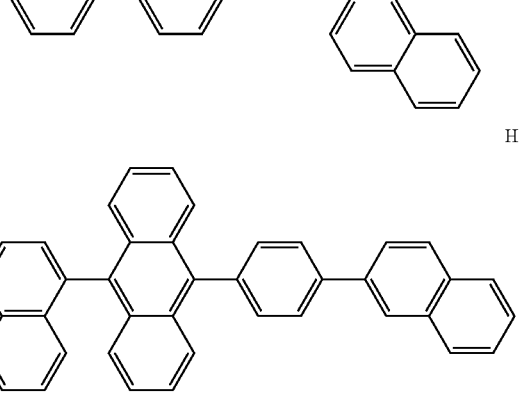
H13
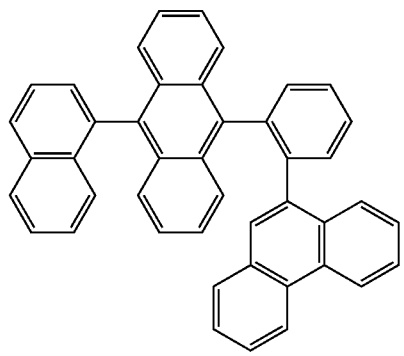
H14
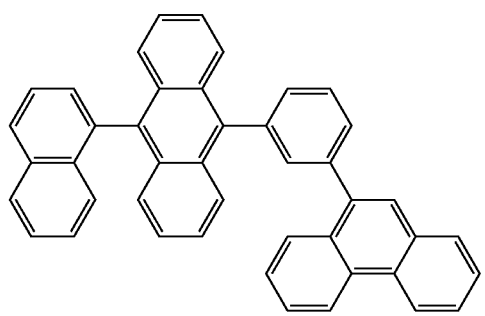

H15
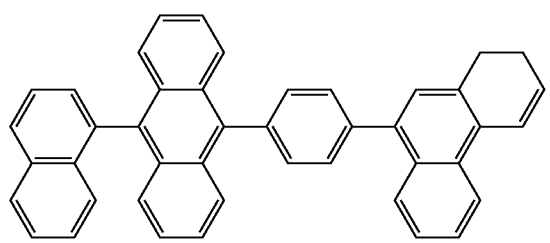
H16
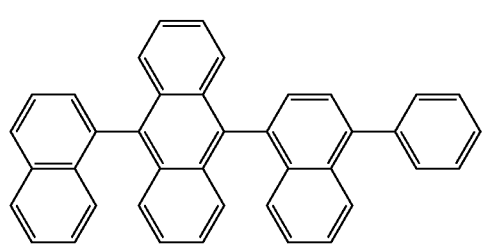
H17
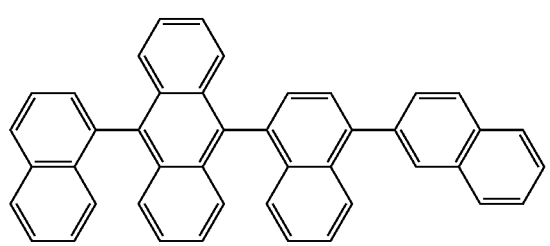
H18
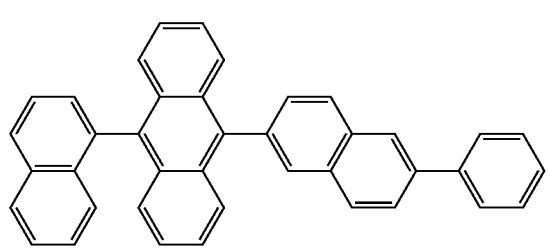
H19
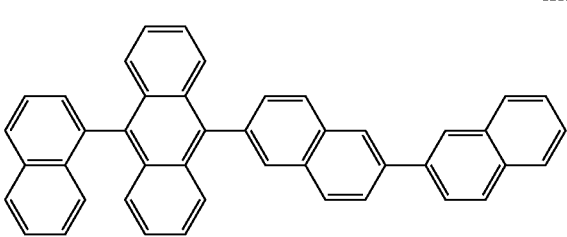
H20
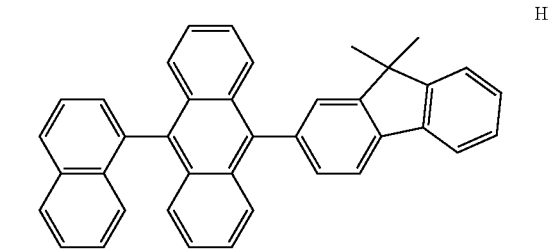
H21
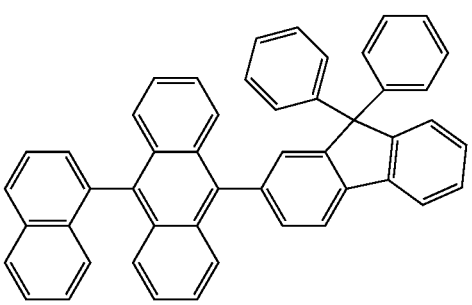
H22
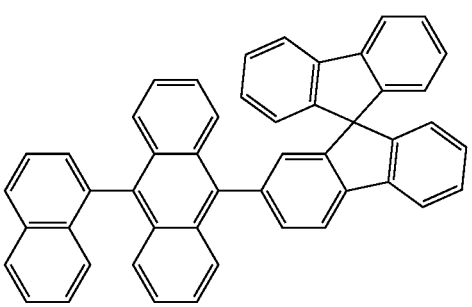
H23
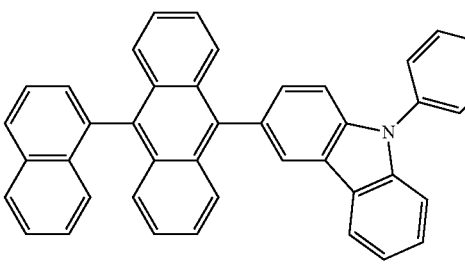
H24
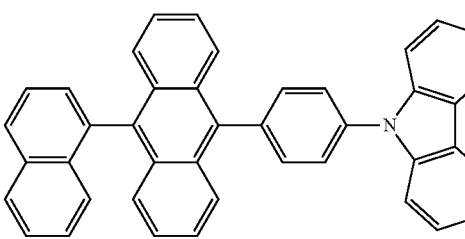
H25
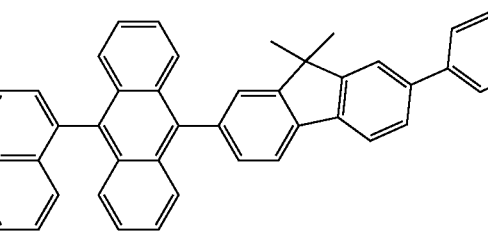
H26
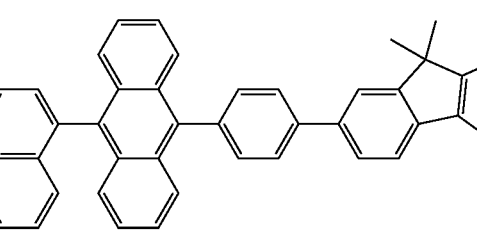

H27
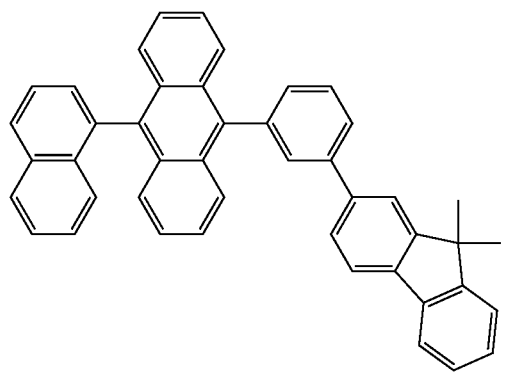
H28
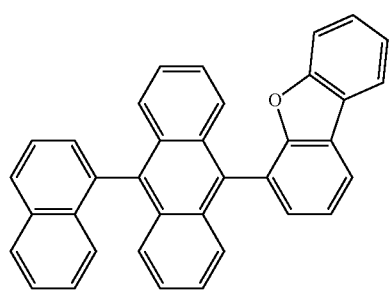
H29
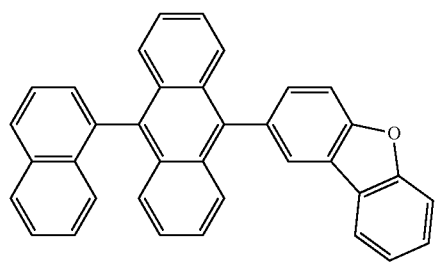
H30
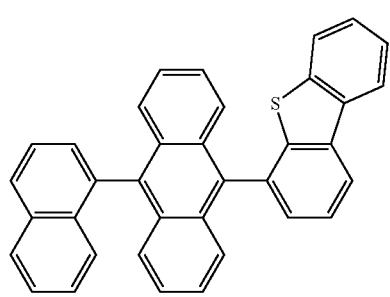
H31
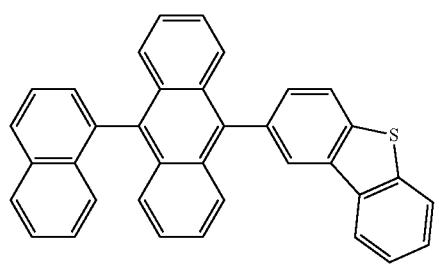
H32
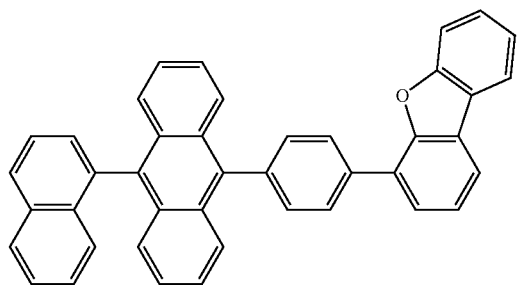
H33
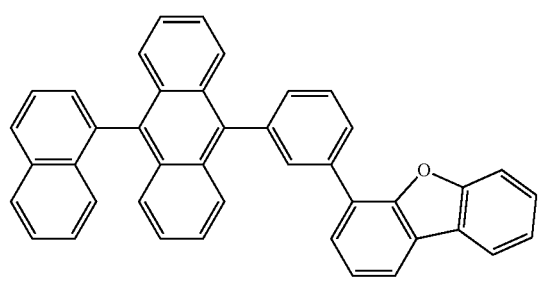
H34
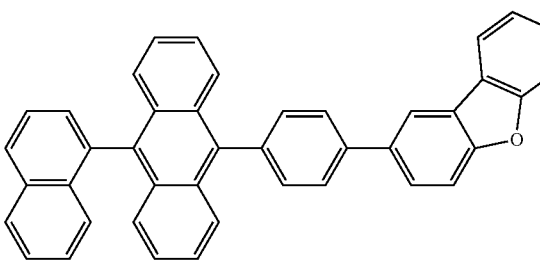
H35
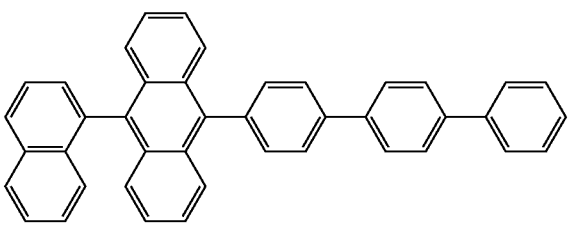
H36
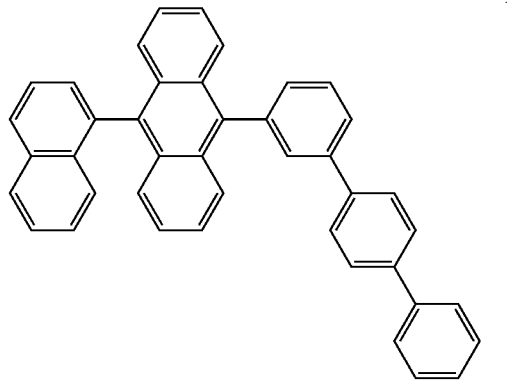

H37
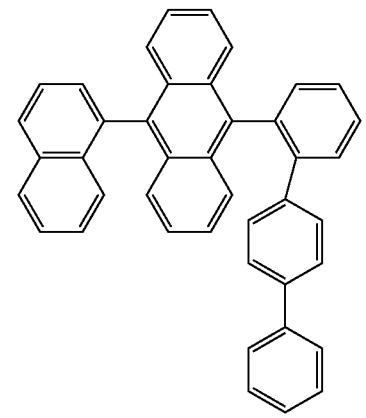
H38
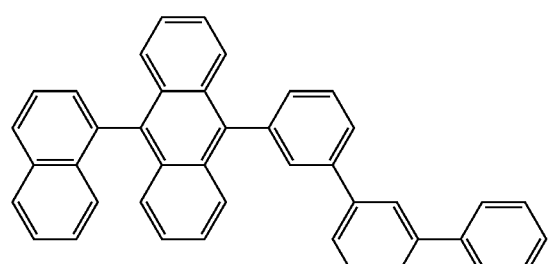
H39
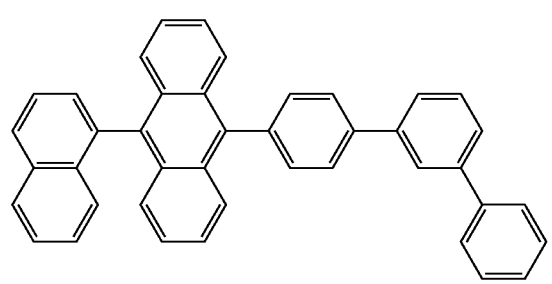
H40
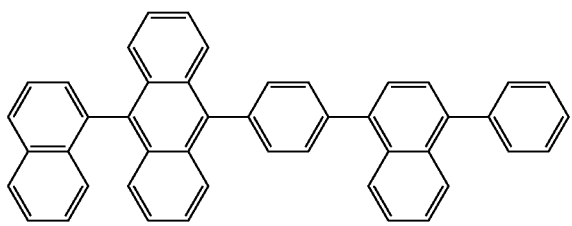
H41
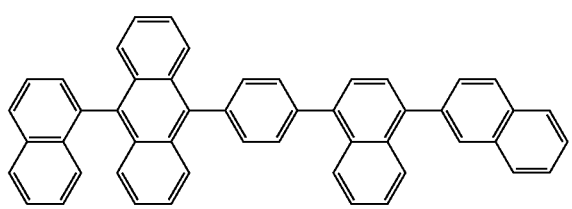
H42
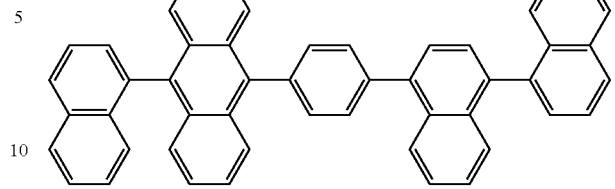
H43
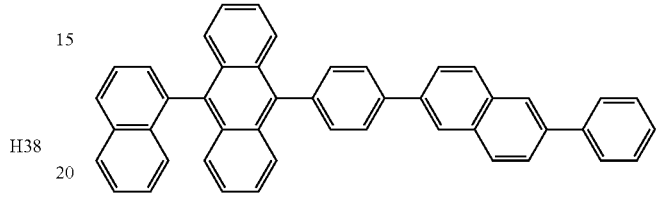
H44
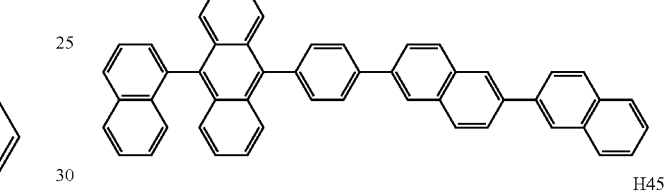
H45
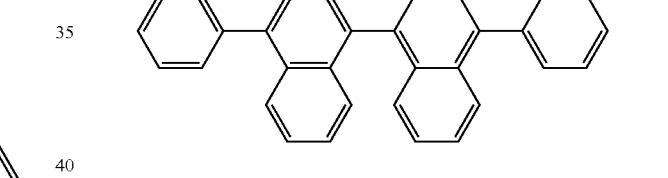
H46
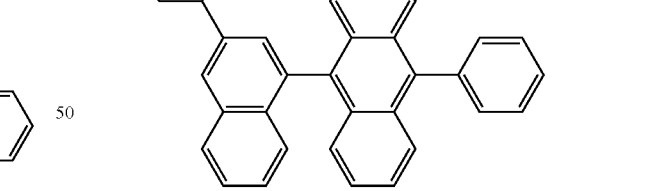
H47
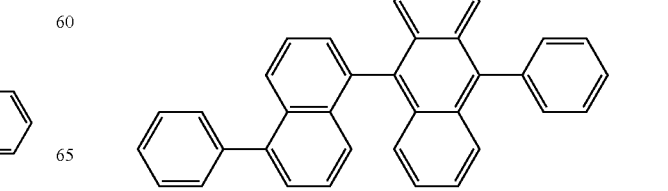

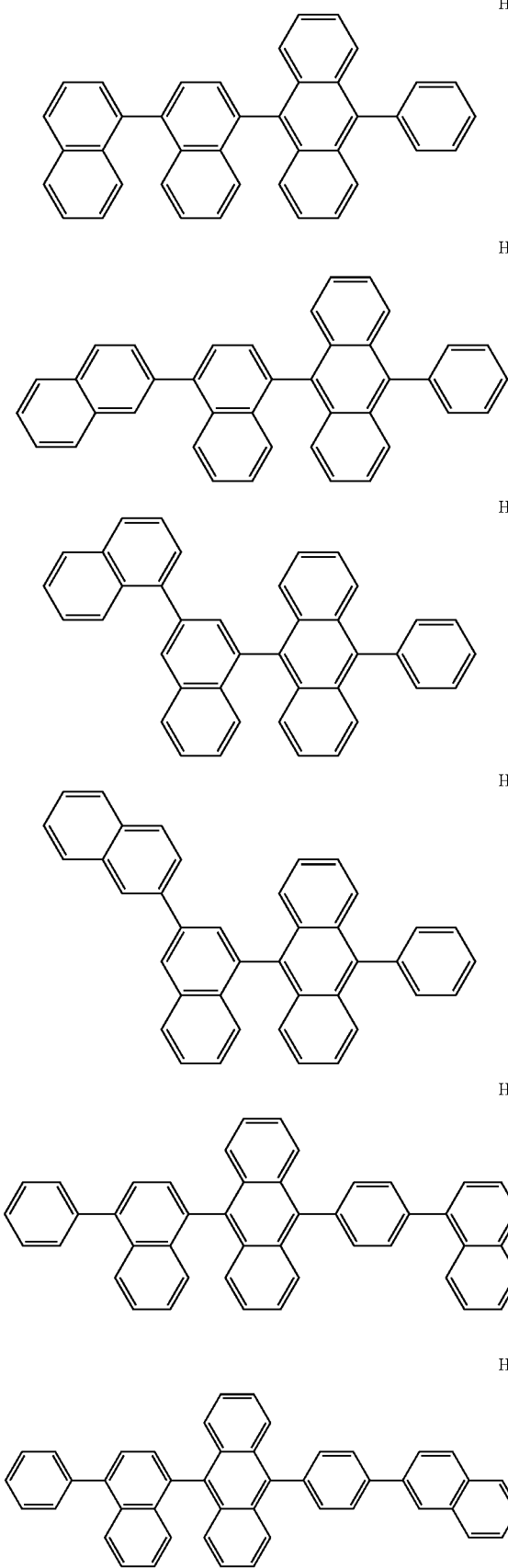
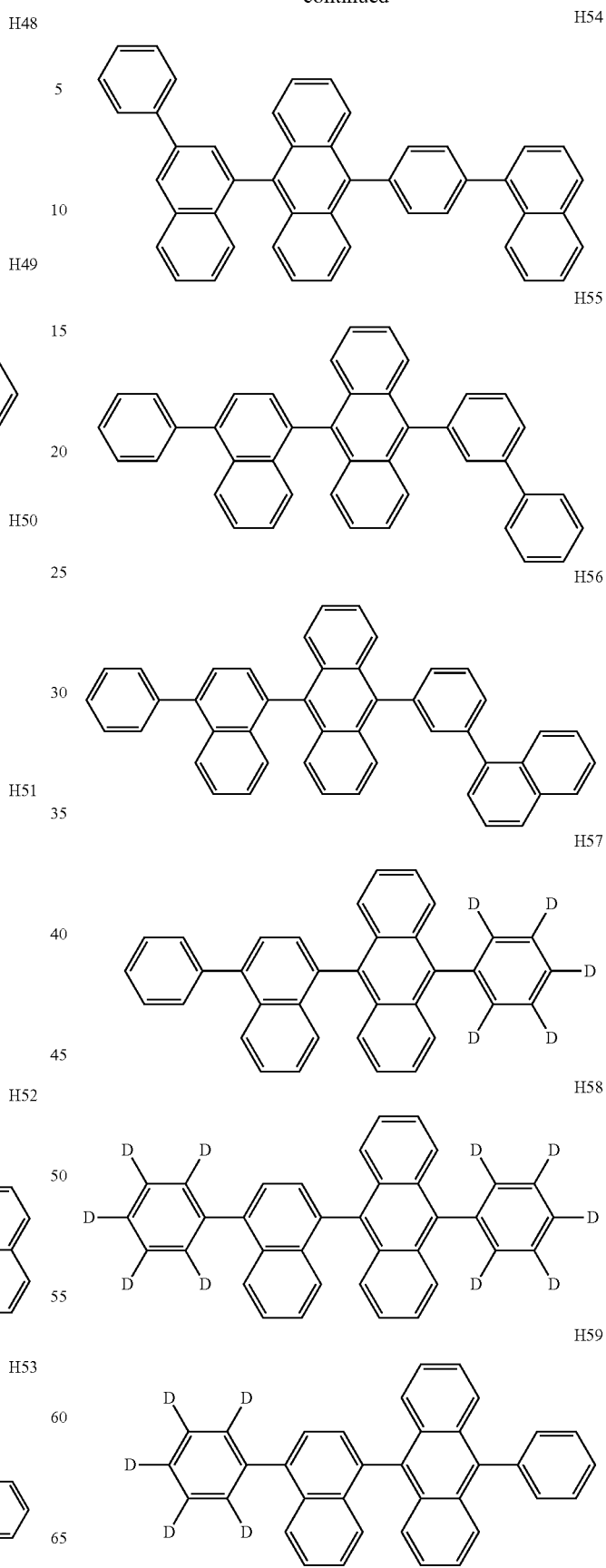

-continued
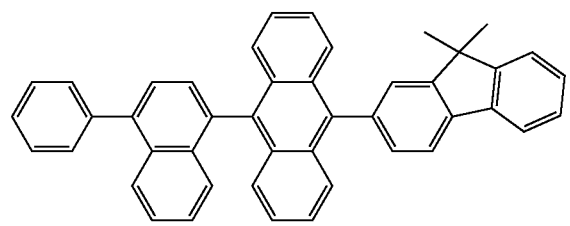
H60
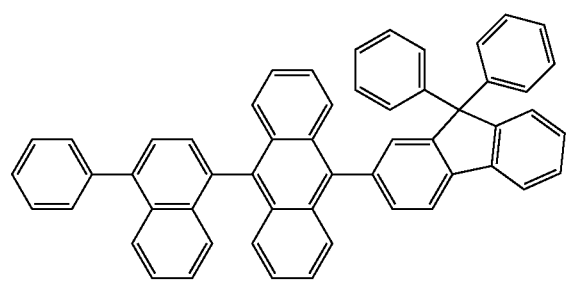
H61
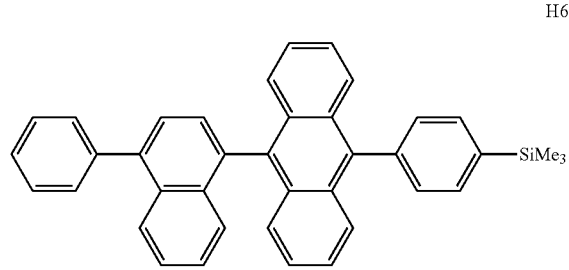
H62
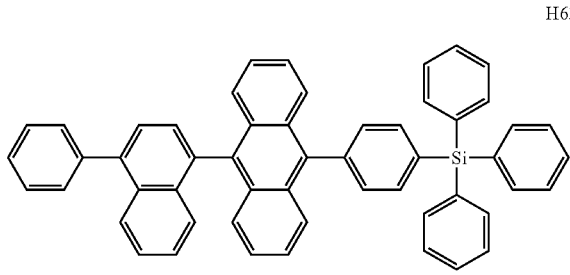
H63
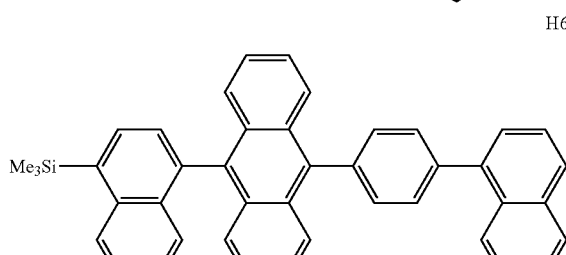
H64
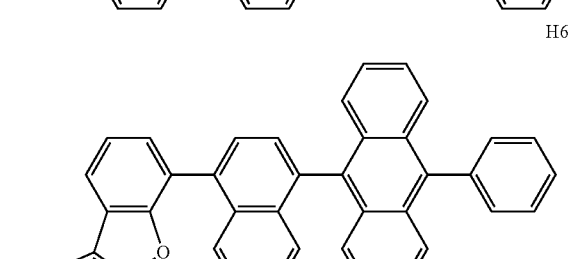
H65
-continued
H66
H67
H68
H69
H70

H71 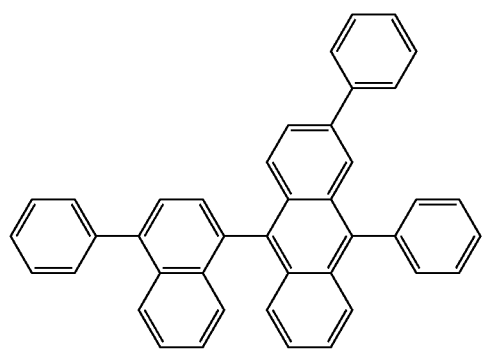
H72 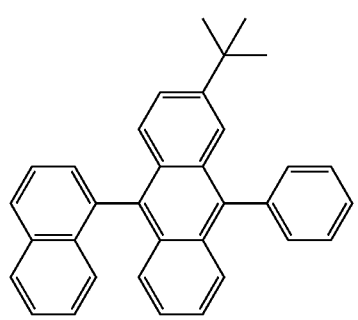
H73 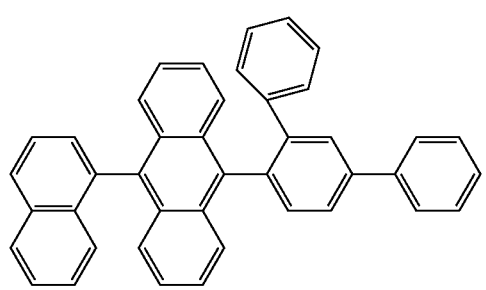
H74 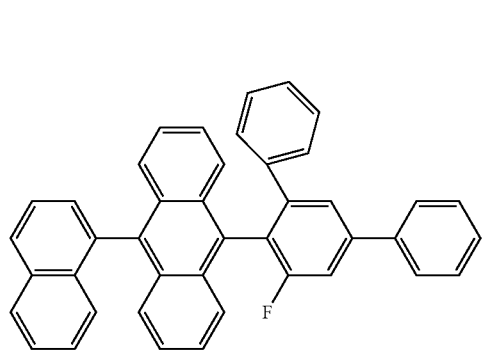
H75 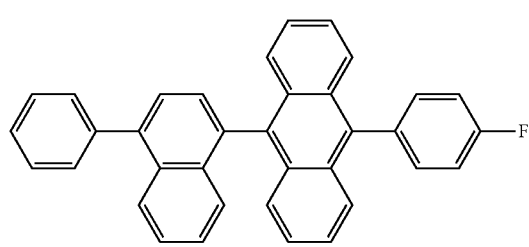
H76 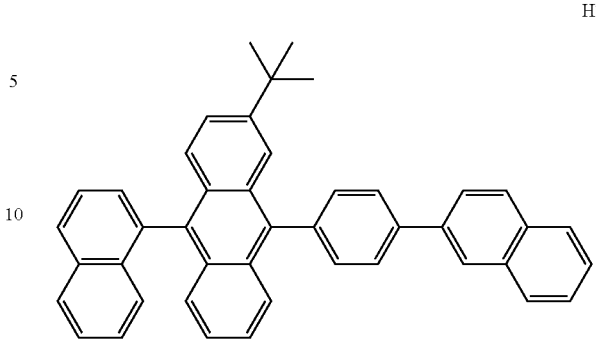
H77 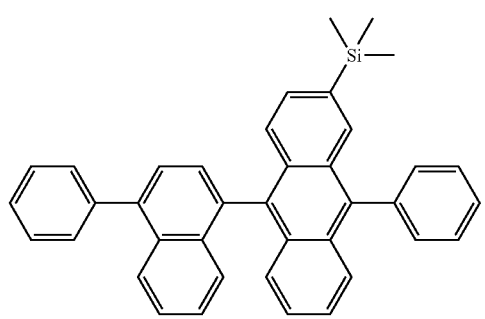
H78 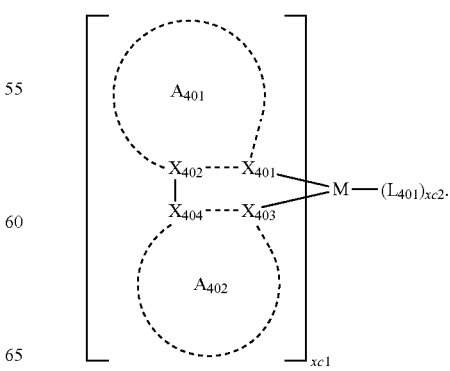
The dopant may include at least one selected from a suitable fluorescent dopant and a suitable phosphorescent dopant.
The phosphorescent dopant may include an organometallic complex represented by Formula 401 below:
Formula 401

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

rings $A_{401}$ and $A_{402}$ may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isooxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran and substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$), wherein wherein $Q_{401}$ to $Q_{407}$, $Q_{411}$ to $Q_{417}$, and $Q_{421}$ to $Q_{427}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

$L_{401}$ may be an organic ligand;

xc1 may be 1, 2, or 3;

xc2 may be selected from 0, 1, 2, and 3.

$L_{401}$ may be a monovalent, a divalent, or a trivalent organic ligand. In some embodiments, $L_{401}$ may be selected from a halogen ligand (e.g., Cl and/or F), a diketone ligand (e.g., acetylacetonate, 1,3-diphenyl-1,3-propane dionate, 2,2,6,6-tetramethyl-3,5-heptanedionate, and/or hexafluoroacetonate), a carboxylic acid ligand (e.g., picolinate, dimethyl-3-a pyrazolecarboxylate, and/or benzoate), a carbon monoxide ligand, an isonitrile ligand, a cyano group ligand, and a phosphorus ligand (e.g., phosphine and/or phosphite), but embodiments are not limited thereto.

When $A_{401}$ in Formula 401 has a plurality of substituents, the plurality of substituents of $A_{401}$ may bind to each other to form a saturated or unsaturated ring.

When $A_{402}$ in Formula 401 has a plurality of substituents, the plurality of substituents of $A_{402}$ may bind to each other to form a saturated or unsaturated ring.

When xc1 in Formula 401 is two or more, a plurality of ligands

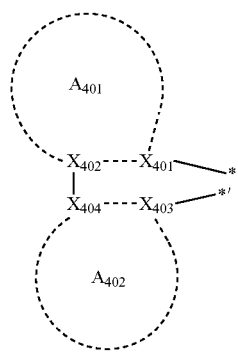

in Formula 401 may be identical to or different from each other. In Formula 401, when xc1 is 2 or more, $A_{401}$ and $A_{402}$ may each independently be connected to respective $A_{401}$ and $A_{402}$ of an adjacent ligand, either directly (e.g., via bond such as a single bond) or via a linking group (e.g., a $C_1$-$C_5$ alkylene group, —N(R')— (where, R' is a $C_1$-$C_{10}$ alkyl group or a $C_6$-$C_{20}$ aryl group), and/or —C(=O)—).

The phosphorescent dopant may include at least one selected from Compounds PD1 to PD74 below, but embodiments are not limited thereto.

PD1

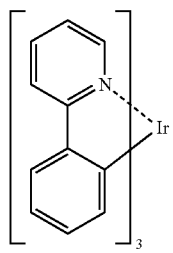

PD2

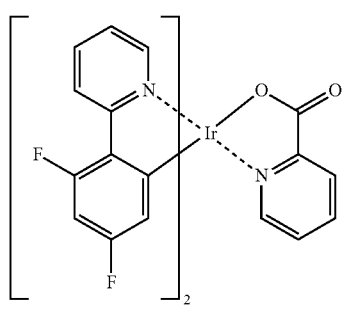

PD3

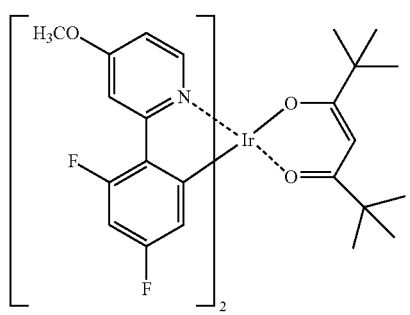

PD4

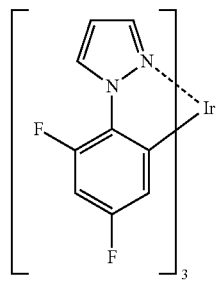

PD5

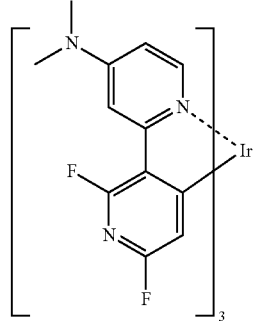

PD6

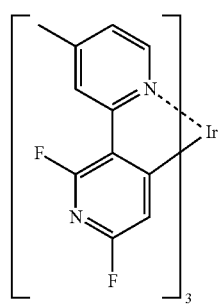

PD7

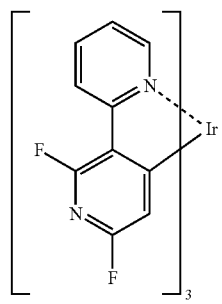

PD8

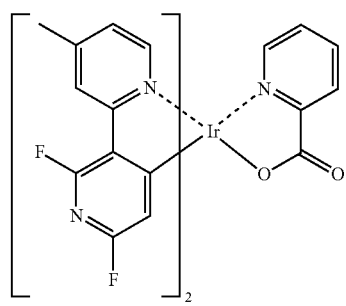

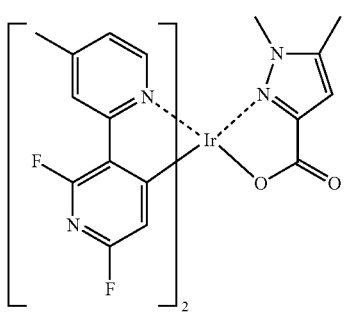
PD9
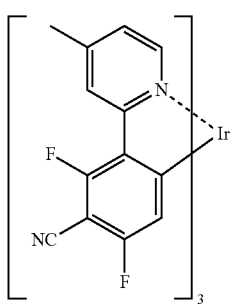
PD10
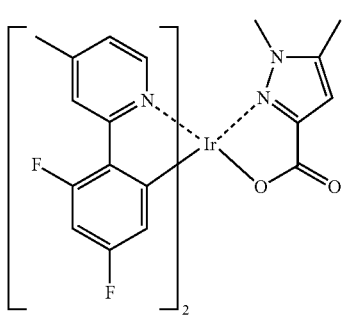
PD11
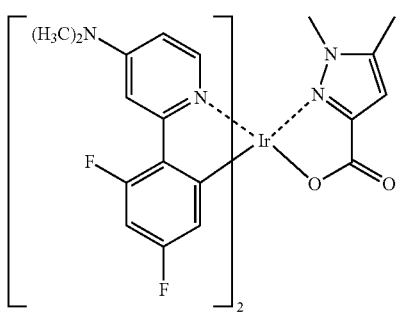
PD12
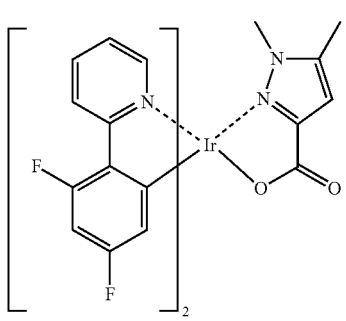
PD13
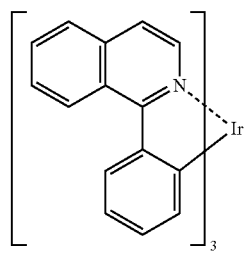
PD14
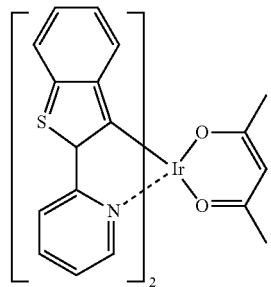
PD15
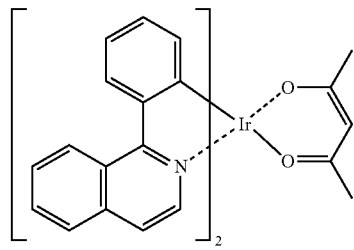
PD16
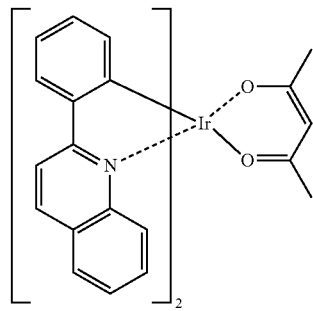
PD17
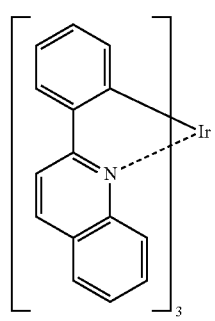
PD18

-continued
PD23 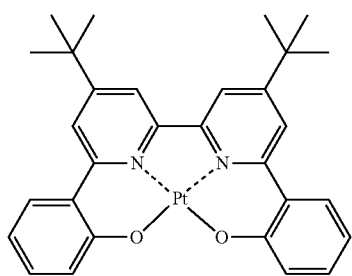
PD24 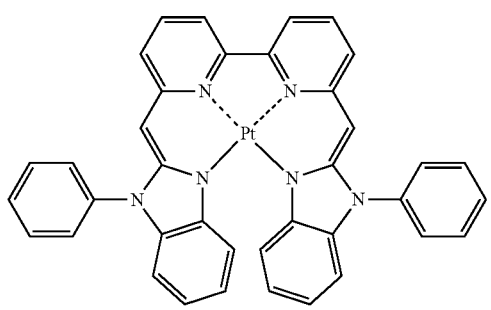
PD25 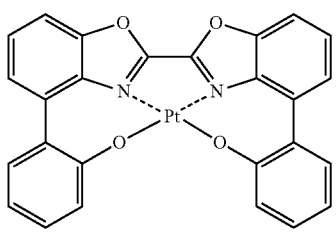
PD26 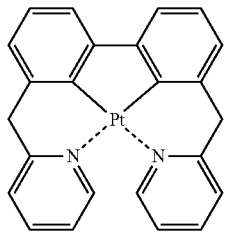
PD27 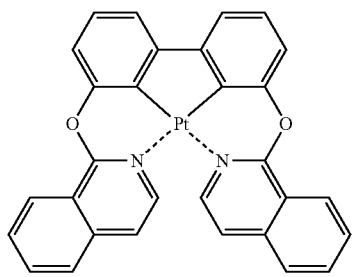
PD28 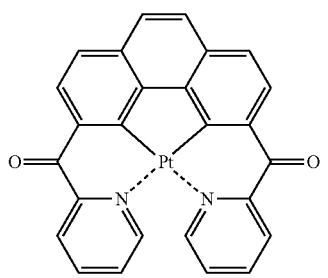
-continued
PD29 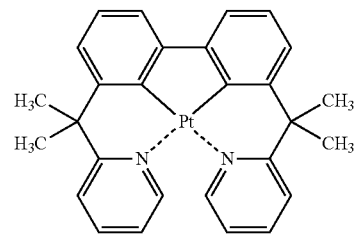
PD30 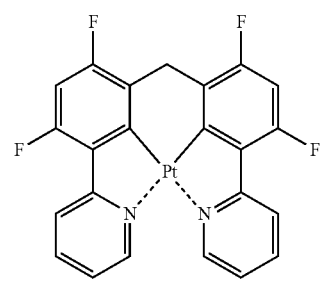
PD31 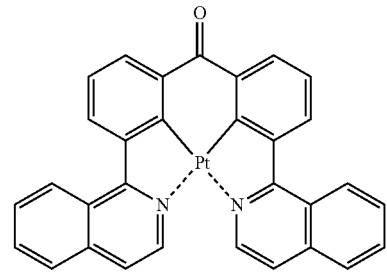
PD32 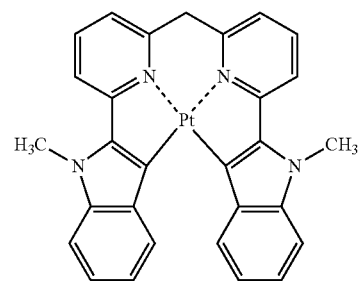
PD33 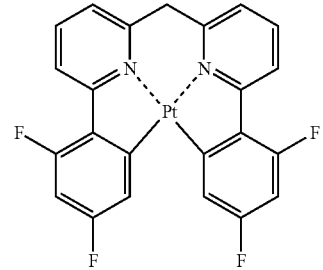
PD34 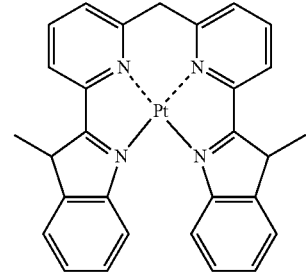

PD35
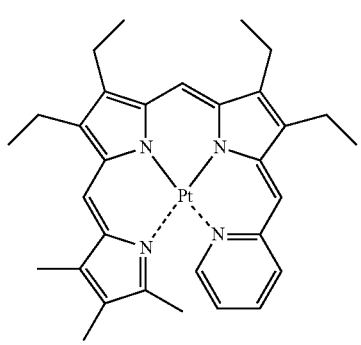
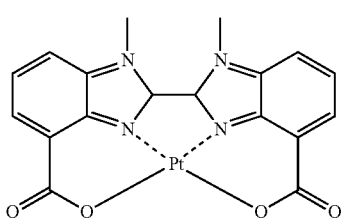
PD40
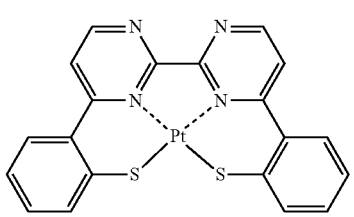
PD41
PD36
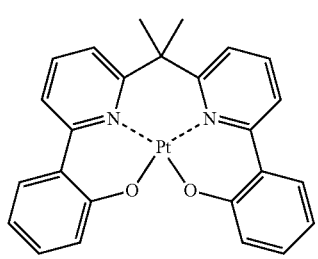
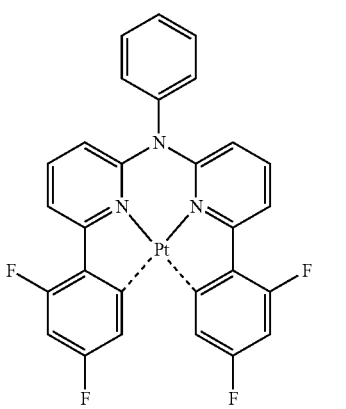
PD42
PD37
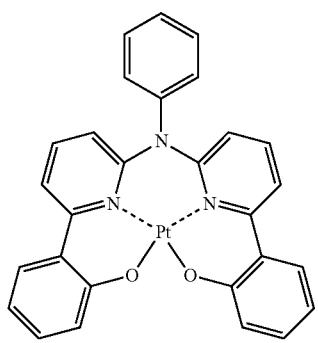
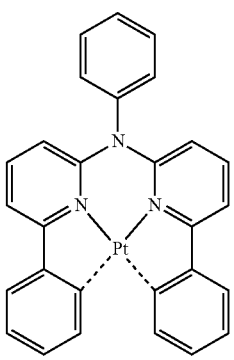
PD43
PD38
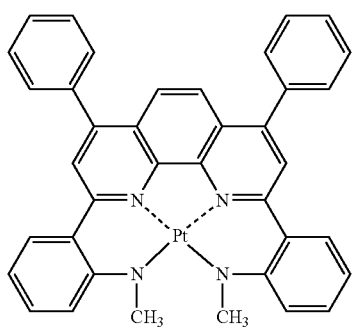
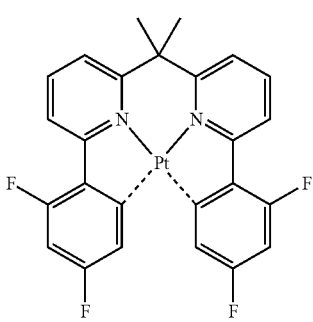
PD44
PD39
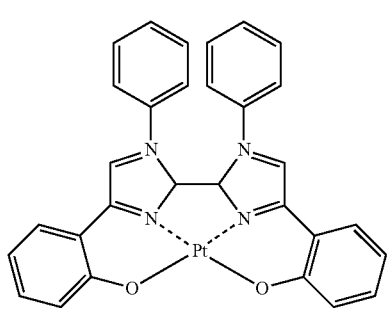

-continued
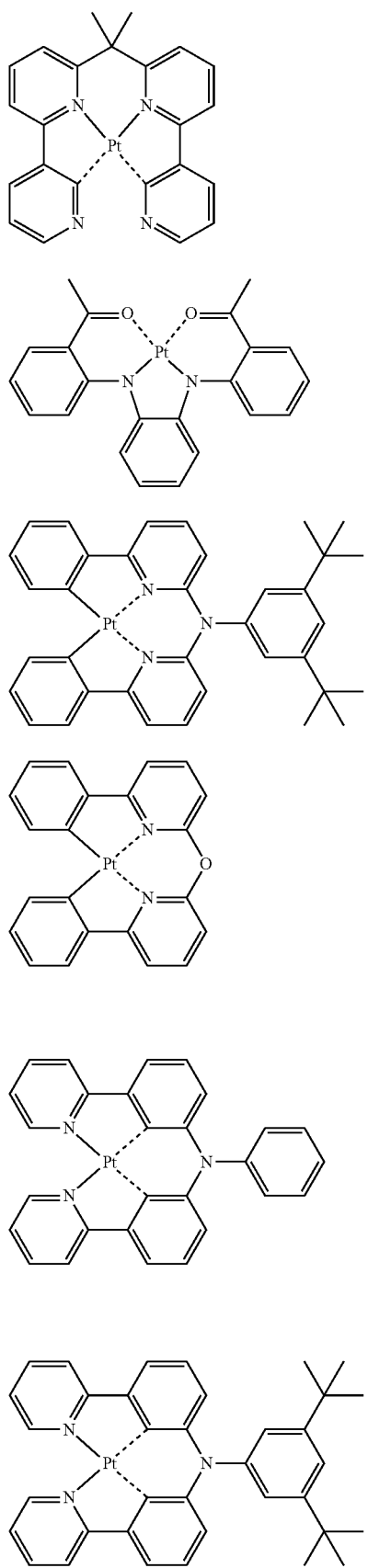
PD45
PD46
PD47
PD48
PD49
PD50
-continued
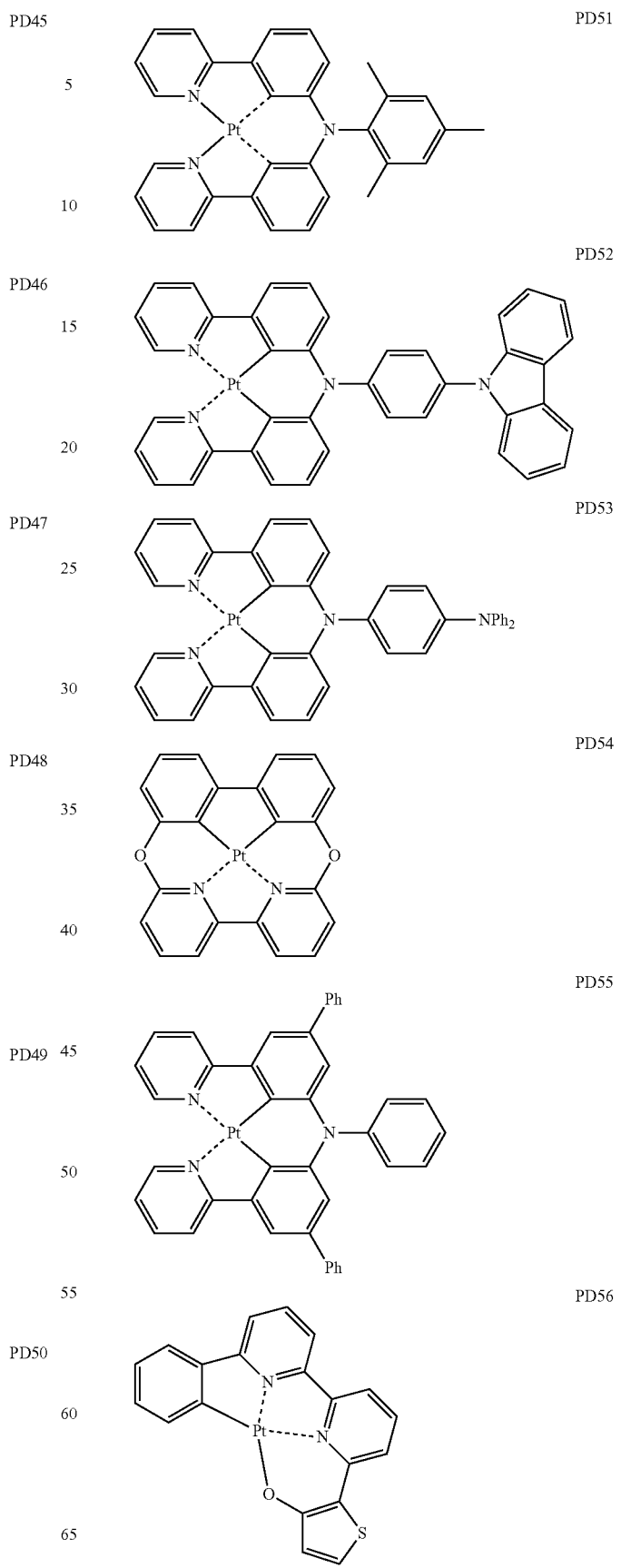
PD51
PD52
PD53
PD54
PD55
PD56

-continued
PD57
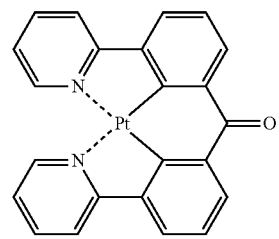
PD58
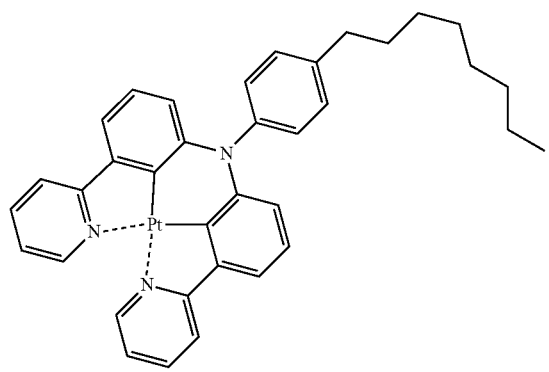
PD59
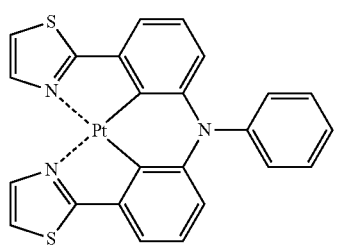
PD60
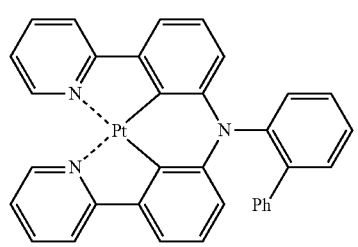
PD61
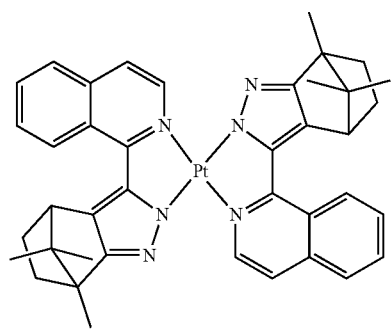
-continued
PD62
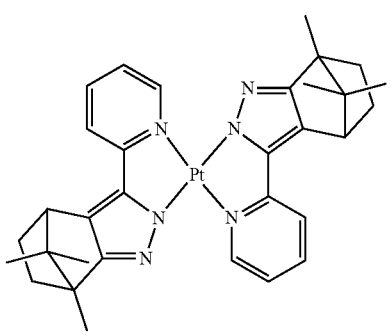
PD63
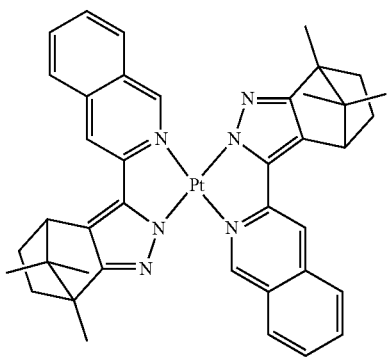
PD64
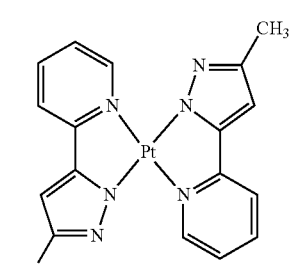
PD65
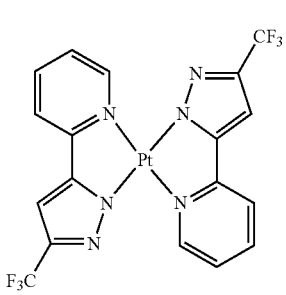
PD66
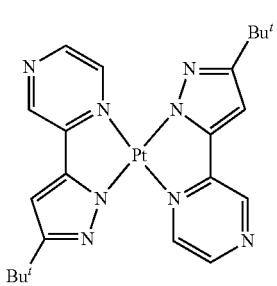

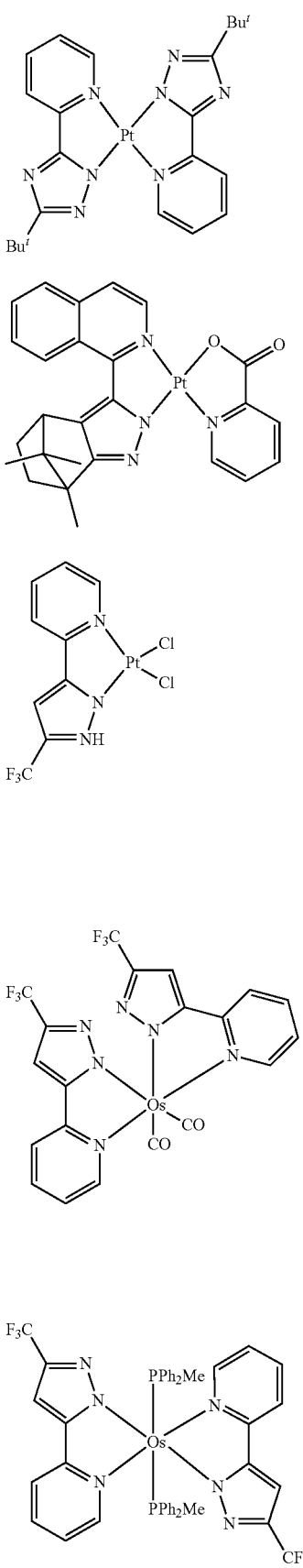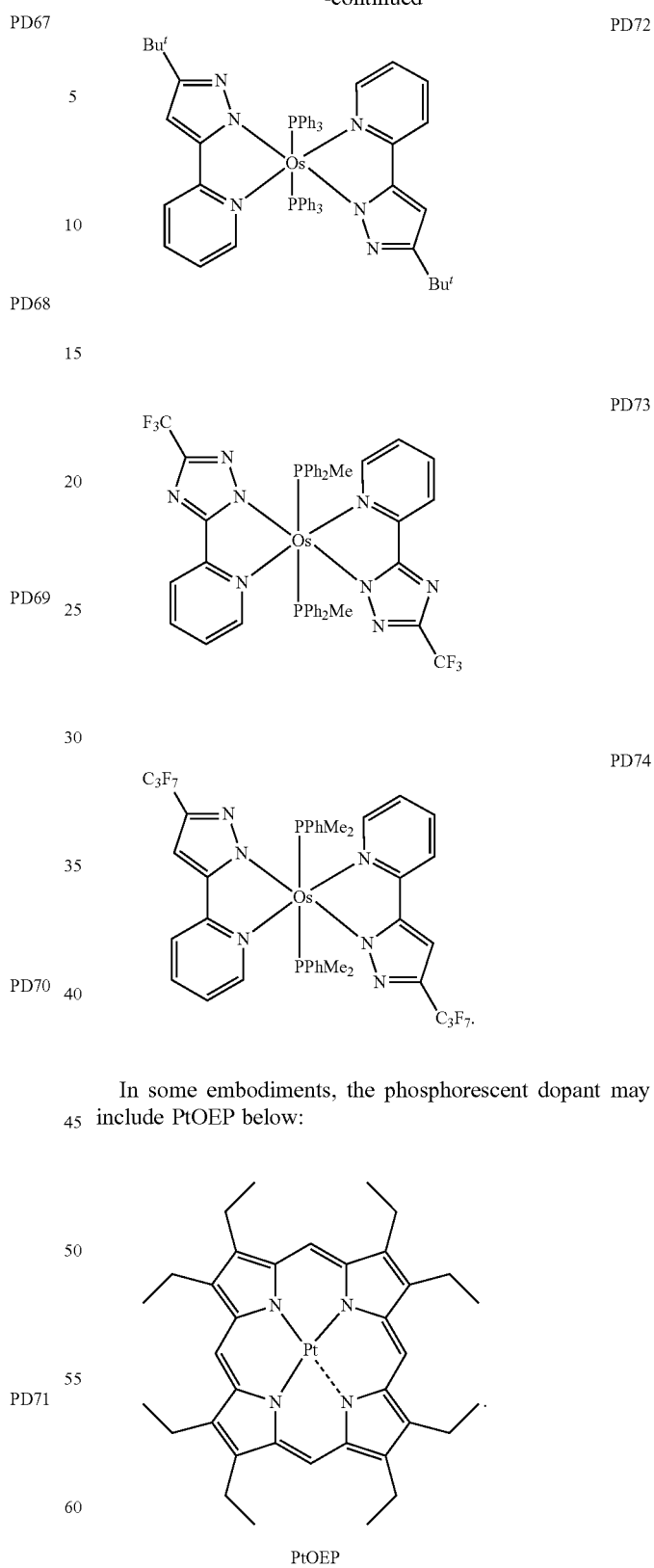
In some embodiments, the phosphorescent dopant may include PtOEP below:
PtOEP
The fluorescent dopant may include at least one selected from DPVBi, DPAVBi, TBPe, DCM, DCJTB, Coumarin 6, and C545T.

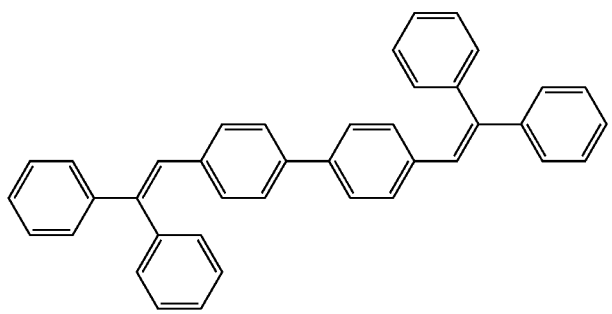
DPVBi
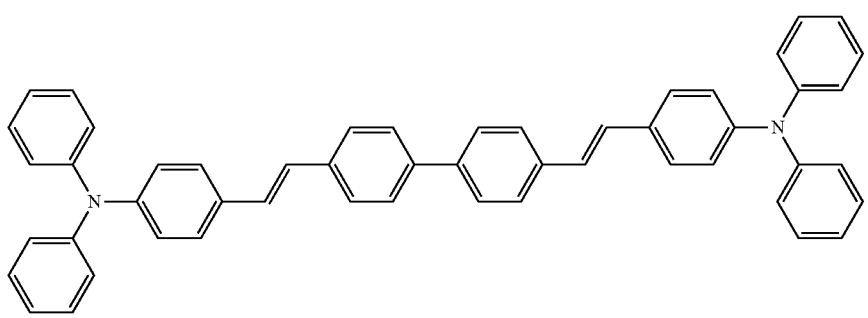
DPAVBi
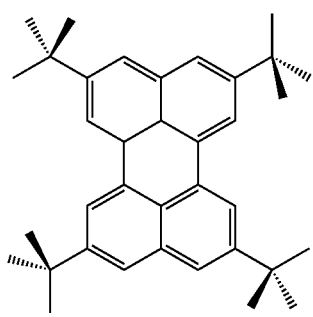
TBPe
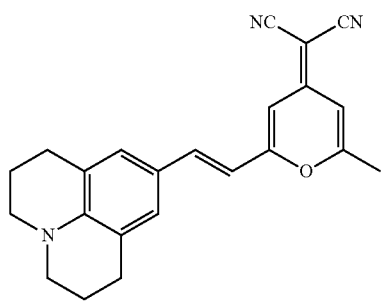
DCM
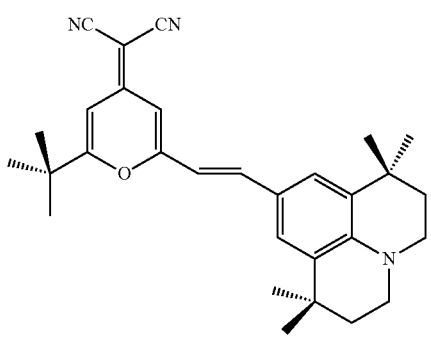
DCJTB
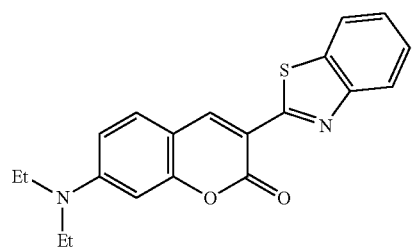
Coumarin 6

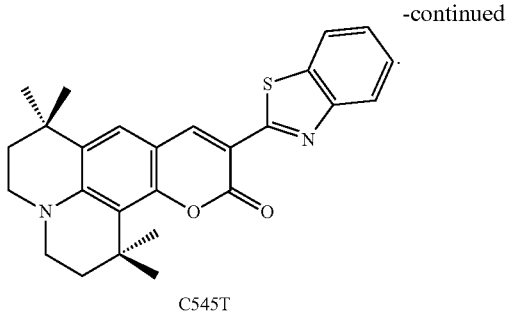

C545T

In some embodiments, the fluorescent dopant may include a compound represented by Formula 501:

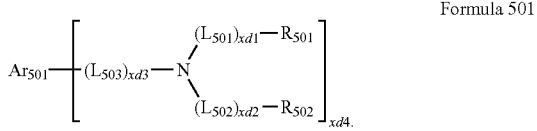

In Formula 501,

Ar$_{501}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (where, $Q_{501}$ to $Q_{503}$ are each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

descriptions of $L_{501}$ to $L_{503}$ may each independently be the same as the one provided in connection with $L_{203}$;

$R_{501}$ and $R_{502}$ may be each independently selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group and a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently selected from 0, 1, 2, and 3; and xb4 may be selected from 1, 2, 3, and 4.

The fluorescent host may include at least one selected from compounds FD1 to FD8 below:

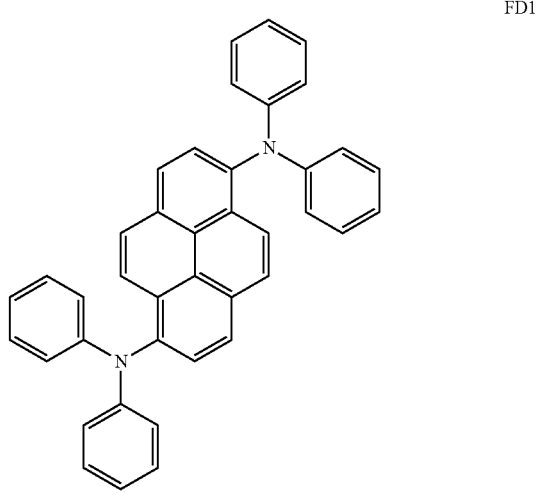

FD1

-continued
FD2
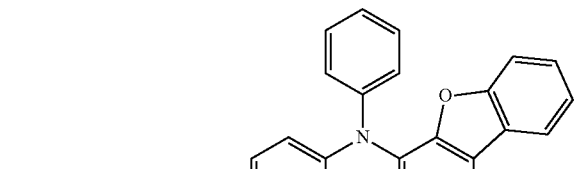
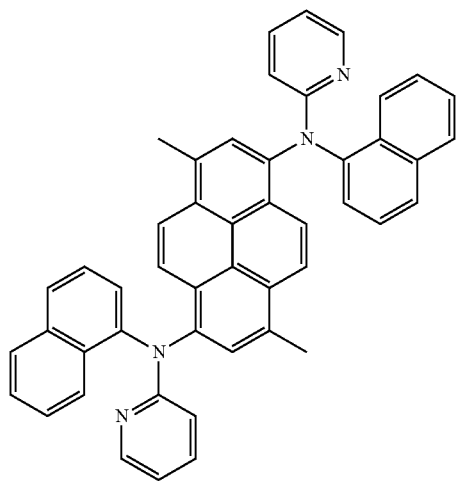
FD3
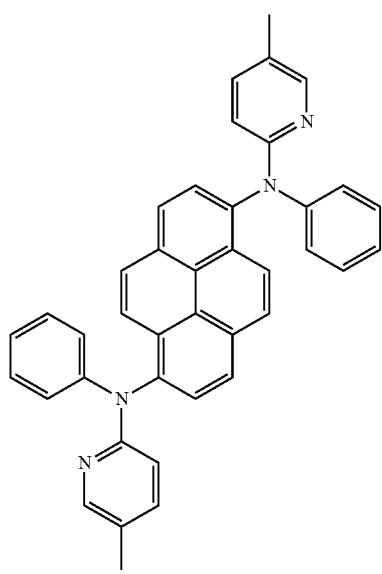
FD4
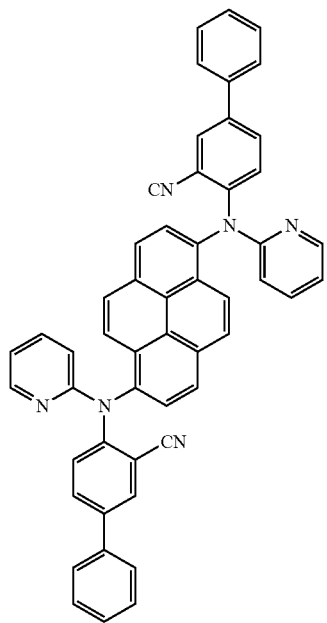
-continued
FD5
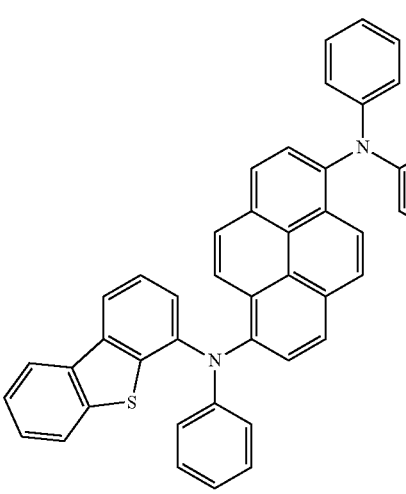
FD6
FD7
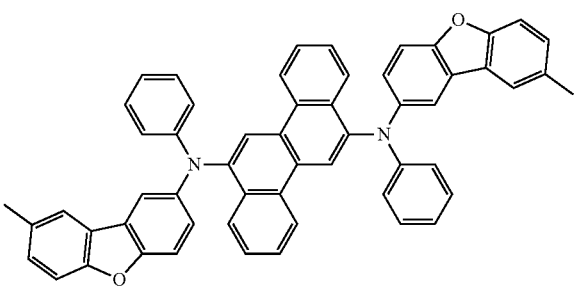
FD8
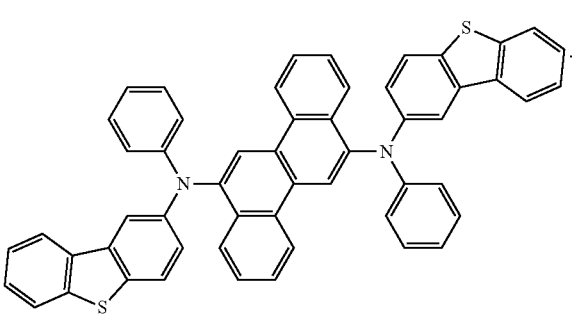

An amount of the dopant in the emission layer may be, for example, in a range of about 0.01 parts to about 15 parts by weight based on 100 parts by weight of the host, but embodiments are not limited thereto.

A thickness of the emission layer may be in a range of about 100 Å to about 1,000 Å, for example, about 200 Å to about 600 Å. When the thickness of the emission layer is within any of these ranges, excellent (or suitable) light-emission characteristics may be obtained without a substantial increase in driving voltage.

An electron transport region may be disposed on the emission layer.

The electron transport region may include at least one selected from a hole blocking layer, an electron transport layer (ETL), and an electron injection layer, but embodiments are not limited thereto.

When the electron transport region includes a hole blocking layer, the hole blocking layer may be formed on the emission layer by using one or more suitable methods, such as vacuum-deposition, spin coating, casting, LB method, ink-jet printing, laser-printing, and/or LITI. When the hole blocking layer is formed by vacuum-deposition and/or spin coating, deposition and coating conditions for the hole blocking layer may be determined by referring to the deposition and coating conditions for the hole injection layer.

The hole blocking layer may include, for example, at least one selected from BCP and Bphen, but embodiments are not limited thereto:

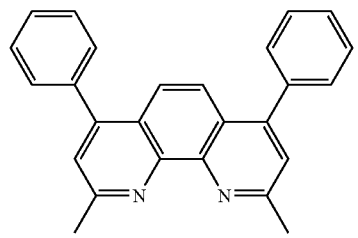

BCP

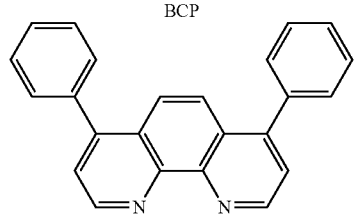

BPhen

A thickness of the hole blocking layer may be in a range of about 20 Å to about 1,000 Å, for example, about 30 Å to about 300 Å. When the thickness of the hole blocking layer is within any of these ranges, excellent (or suitable) hole blocking characteristics may be obtained without a substantial increase in driving voltage.

The electron transport region may have a structure of electron transport layer/electron injection layer or a structure of hole blocking layer/electron transport layer/electron injection layer, wherein the layers of each structure are sequentially stacked from the emission layer in the stated order, but embodiments are not limited thereto.

In some embodiments, the organic layer 150 of the organic light-emitting device includes an electron transport region between the emission layer and the second electrode 190, wherein the electron transport region may include an electron transport layer. The electron transport layer may be formed as a plurality of layers. In some embodiments, the electron transport region may include a first electron transport layer and a second electron transport layer.

The electron transport layer may include at least one selected from BCP, Bphen, Alq$_3$, BAlq, TAZ, and NTAZ, in addition to the compound represented by Formula 1 according to an embodiment of the present disclosure.

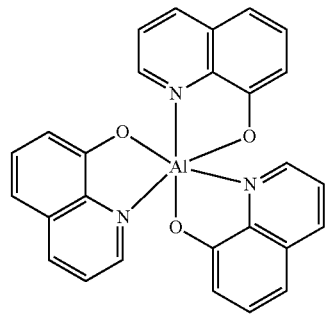

Alq$_3$

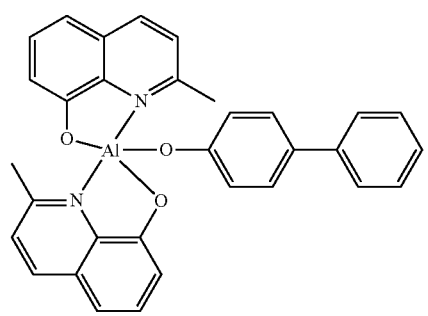

BAlq

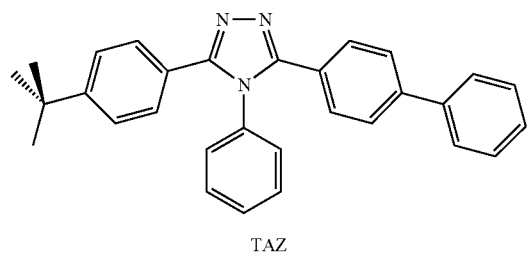

TAZ

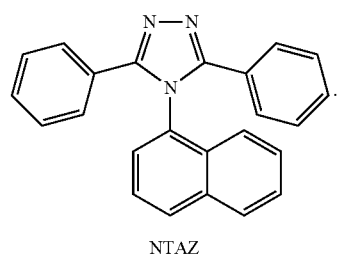

NTAZ

In some embodiments, the electron transport layer may include at least one selected from a compound represented by Formula 601 and a compound represented by Formula 602 illustrated below:

$$Ar_{601}-[(L_{601})_{xe1}-E_{601}]_{xe2}.$$  Formula 601

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (where, $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

description of $L_{601}$ may be the same as the one provided in connection with $L_{203}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

xe1 may be selected from 0, 1, 2, and 3; and xe2 may be selected from 1, 2, 3, and 4.

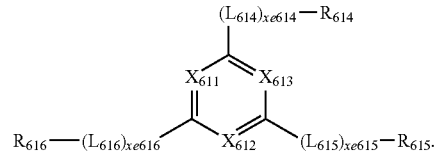

Formula 602

In Formula 602, $X_{611}$ may be N or C-($L_{611}$)$_{xe611}$-$R_{611}$, $X_{612}$ may be N or C-($L_{612}$)$_{xe612}$-$R_{612}$, $X_{613}$ may be N or C-($L_{613}$)$_{xe613}$-$R_{613}$, and at least one selected from $X_{611}$ to $X_{613}$ may be N;

descriptions of $L_{611}$ to $L_{616}$ may be each independently the same as the one provided in connection with $L_{203}$;

$R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may each independently be selected from Compounds ET1 to ET15 illustrated below:

ET1

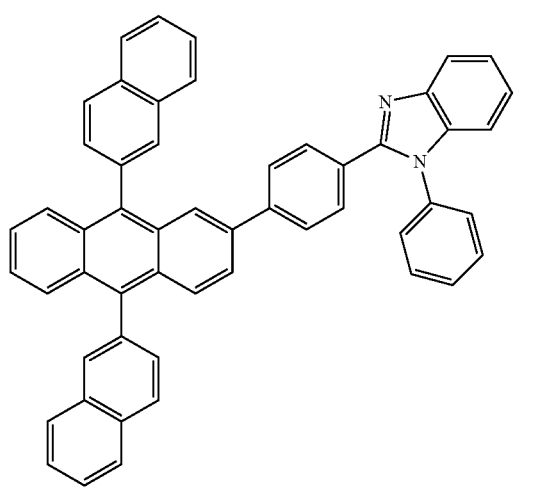

ET2

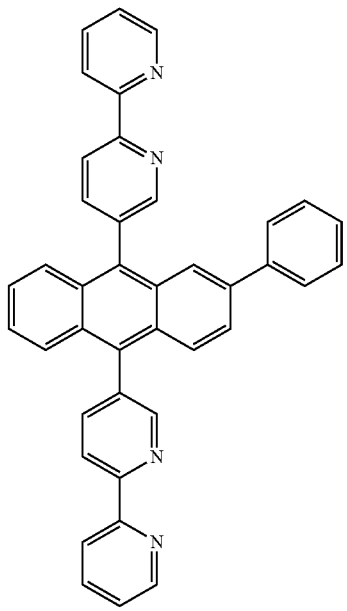

ET3

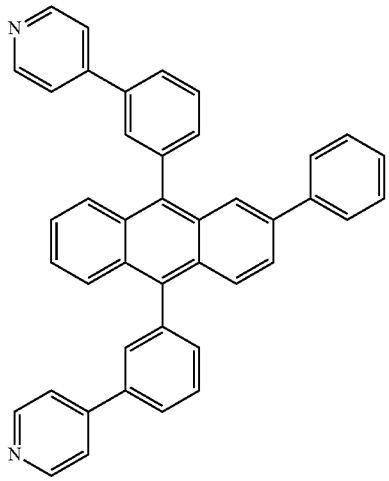

ET4

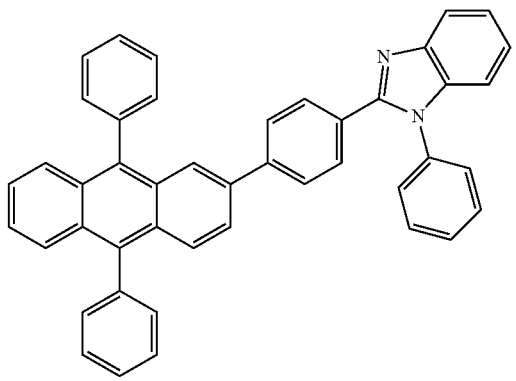

ET5
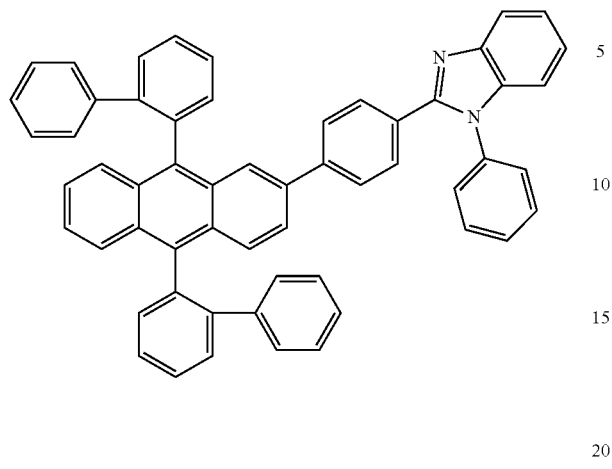
ET8
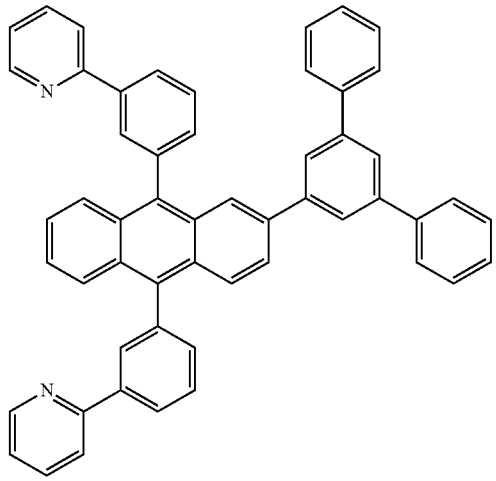
ET6
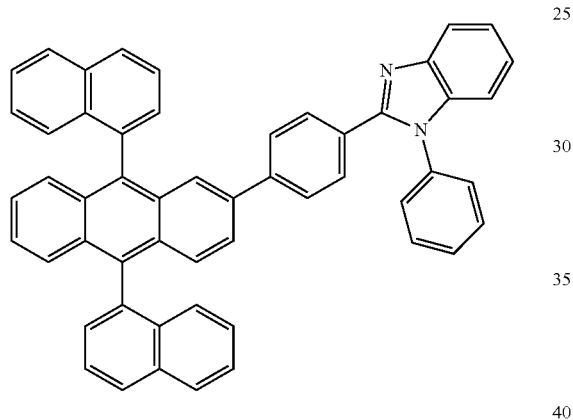
ET7
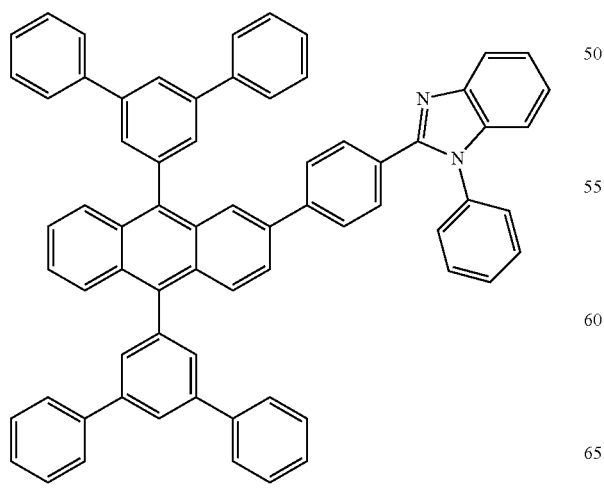
ET9
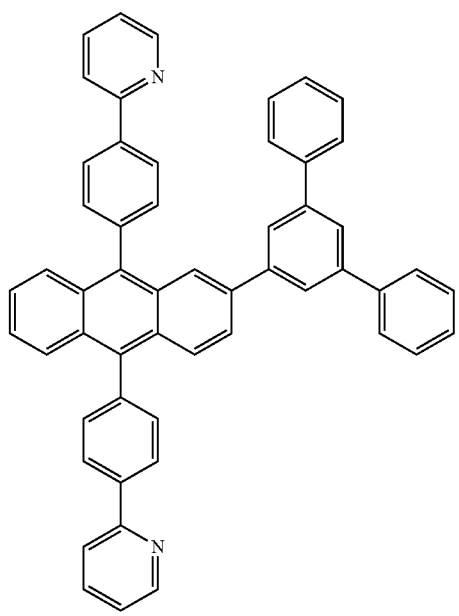

ET10

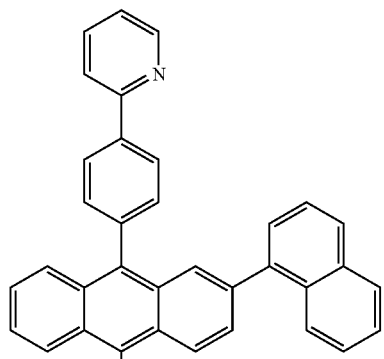

ET11

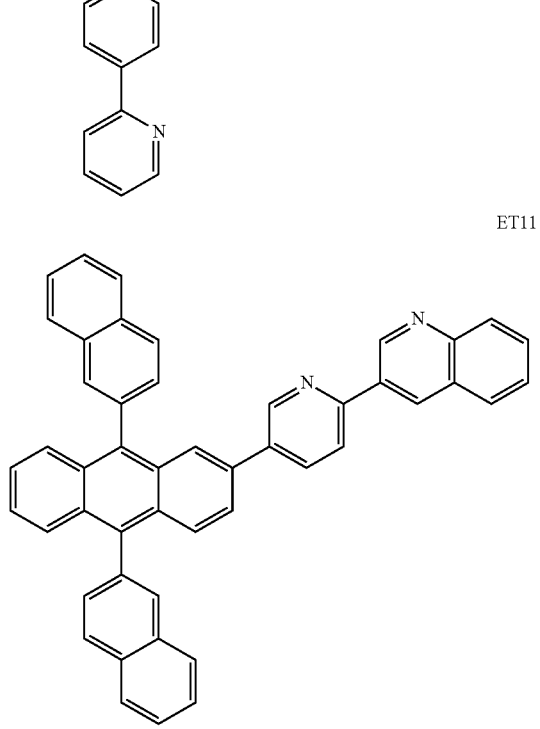

ET12

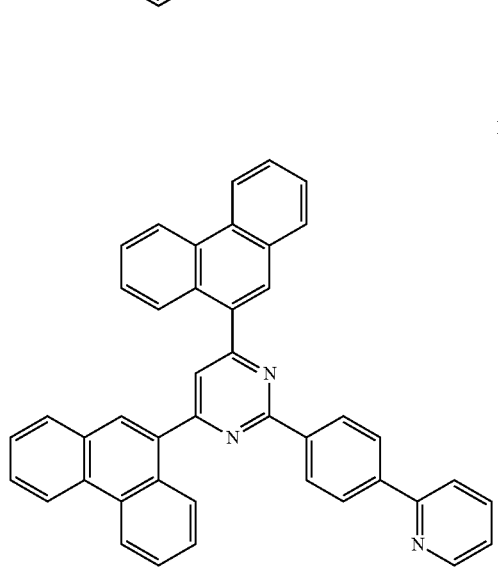

ET13

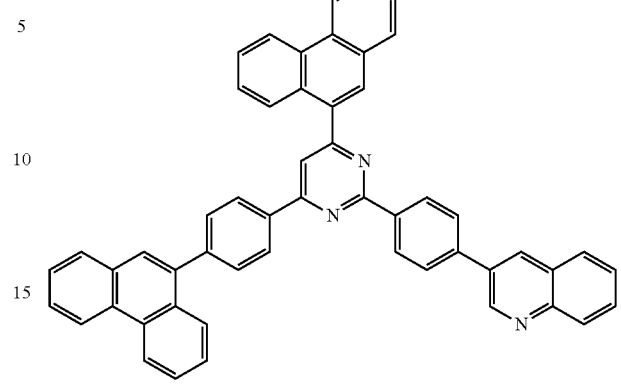

ET14

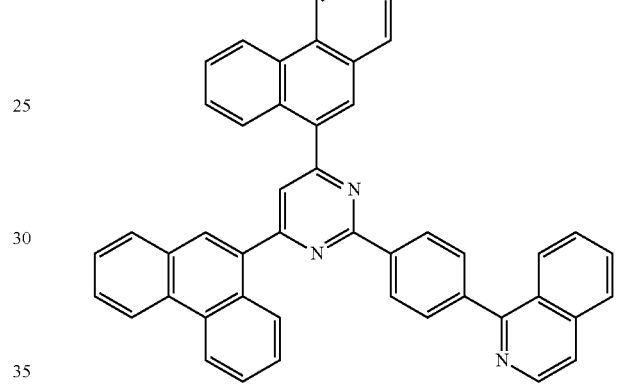

ET15

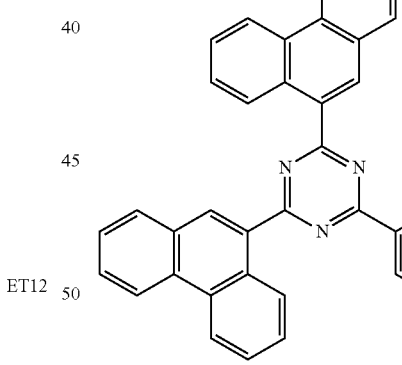

A thickness of the electron transport layer may be in a range of about 100 Å to about 1,000 Å, for example, about 150 Å to about 500 Å. When the thickness of the electron transport layer is within any of these ranges, excellent (or suitable) electron transport characteristics may be obtained without a substantial increase in driving voltage.

The electron transport layer may further include a metal-containing material, in addition to the materials described above.

The metal-containing material may include a Li complex. The Li complex may include, for example, Compound ET-D1 (lithium quinolate, LiQ) and/or Compound ET-D2.

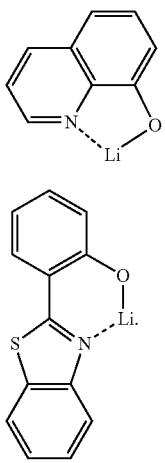

ET-D1

ET-D2

The electron transport region may include an electron injection layer that facilitates electron injection from the second electrode 190.

The electron injection layer may be formed on the electron transport layer by using one or more suitable methods, such as vacuum-deposition, spin coating, casting, LB method, ink-jet printing, laser-printing, and/or LITI. When the electron injection layer is formed by vacuum-deposition and/or spin coating, vacuum-deposition and coating conditions for the electron injection layer may be determined by referring to the vacuum-deposition and coating conditions for the hole injection layer.

The electron injection layer may include at least one selected from LiF, NaCl, CsF, Li$_2$O, BaO, and LiQ.

A thickness of the electron injection layer may be in a range of about 1 Å to about 100 Å, for example, about 3 Å to about 90 Å. When the thickness of the electron injection layer is within any of these ranges, excellent (or suitable) electron injection characteristics may be obtained without a substantial increase in driving voltage.

The second electrode 190 may be disposed on the organic layer 150. The second electrode 190 may be a cathode (that is an electron injection electrode), and in this regard, a material for forming the second electrode 190 may be any suitable material having a low work function, for example, a metal, an alloy, an electrically conductive compound, or a mixture thereof. Non-limiting examples of the material for forming the second electrode 190 include lithium (Li), magnesium (Mg), aluminum (Al), aluminum-lithium (Al—Li), calcium (Ca), magnesium-indium (Mg'In), and magnesium-silver (Mg—Ag). In some embodiments, the material for forming the second electrode 190 may be ITO and/or IZO. The second electrode 190 may be a reflective electrode, a semi-transmissive electrode, or a transmissive electrode.

The organic layer of the organic light-emitting device according to an embodiment may be formed by vacuum-depositing the compound(s) according to the present embodiments or using a wet method in which the compound(s) according to the present embodiments is(are) prepared in the form of a solution, and then the solution of the compound(s) is used for coating.

The organic light-emitting device according to an embodiment may be included in various flat panel display apparatuses, for example, in a passive matrix organic light-emitting display apparatus and/or an active matrix organic light-emitting display apparatus. For example, when the organic light-emitting device is included in an active matrix organic light-emitting display apparatus, a first electrode disposed on a substrate may be a pixel electrode, and the first electrode may be electrically connected (e.g., coupled) to a source electrode or a drain electrode of a thin film transistor. In addition, the organic light-emitting device may be included in a flat panel display apparatus that may display images on both sides of the display panel.

Hereinbefore, the organic light-emitting device has been described with reference to the drawing, but embodiments of the present disclosure are not limited thereto.

Hereinafter, definitions of substituents used herein will be presented (the number of carbon numbers used to restrict a substituent is not limited, and does not limit properties of the substituent), and unless defined otherwise, the definition of the substituent is consistent with a general definition thereof.

A $C_1$-$C_{60}$ alkyl group used herein may refer to a linear or branched aliphatic hydrocarbon monovalent group having 1 to 60 carbon atoms, and non-limiting examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein may refer to a divalent group having the same structure as the $C_1$-$C_{60}$ alkyl group.

A $C_1$-$C_{60}$ alkoxy group used herein may refer to a monovalent group represented by —OA$_{101}$ (wherein A$_{101}$ is the $C_1$-$C_{60}$ alkyl group), and non-limiting examples thereof are a methoxy group, an ethoxy group, and an isopropoxy group.

A $C_2$-$C_{60}$ alkenyl group used herein may refer to a hydrocarbon group having at least one carbon double bond at one or more positions along the hydrocarbon chain of the $C_2$-$C_{60}$ alkyl group (e.g., in the middle or at either terminal end of the $C_2$-$C_{60}$ alkyl group), and non-limiting examples thereof are an ethenyl group, a propenyl group, and a butenyl group. A $C_2$-$C_{60}$ alkenylene group used herein may refer to a divalent group having the same structure as the $C_2$-$C_{60}$ alkenyl group.

A $C_2$-$C_{60}$ alkynyl group used herein may refer to a hydrocarbon group having at least one carbon triple bond at one or more positions along the hydrocarbon chain of the $C_2$-$C_{60}$ alkyl group (e.g., in the middle or at either terminal end of the $C_2$-$C_{60}$ alkyl group), and non-limiting examples thereof are an ethynyl group and a propynyl group. A $C_2$-$C_{60}$ alkynylene group used herein may refer to a divalent group having the same structure as the $C_2$-$C_{60}$ alkynyl group.

A $C_3$-$C_{10}$ cycloalkyl group used herein may refer to a monovalent monocyclic saturated hydrocarbon group including 3 to 10 carbon atoms, and non-limiting examples thereof are a cyclopropyl group, a cyclobutyl group, a cyclopentyl group, a cyclohexyl group, and a cycloheptyl group. A $C_3$-$C_{10}$ cycloalkylene group used herein may refer to a divalent group having the same structure as the $C_3$-$C_{10}$ cycloalkyl group.

A $C_1$-$C_{10}$ heterocycloalkyl group used herein may refer to a monovalent monocyclic group including at least one heteroatom selected from N, O, P, and S as a ring-forming atom and 2 to 10 carbon atoms. Non-limiting examples thereof are a tetrahydrofuranyl group and a tetrahydrothiophenyl group. A $C_1$-$C_{10}$ heterocycloalkylene group used herein may refer to a divalent group having the same structure as the $C_1$-$C_{10}$ heterocycloalkyl group.

A $C_3$-$C_{10}$ cycloalkenyl group used herein may refer to a monovalent monocyclic group that has 3 to 10 carbon atoms and at least one double bond in its ring, and which is not aromatic. Non-limiting examples thereof are a cyclopentenyl group, a cyclohexenyl group, and a cycloheptenyl group.

A $C_3$-$C_{10}$ cycloalkenylene group used herein may refer to a divalent group having the same structure as the $C_3$-$C_{10}$ cycloalkenyl group.

A $C_1$-$C_{10}$ heterocycloalkenyl group used herein may refer to a monovalent monocyclic group including at least one heteroatom selected from N, O, P, and S as a ring-forming atom, 2 to 10 carbon atoms, and at least one double bond in its ring. Non-limiting examples of the $C_1$-$C_{10}$ heterocycloalkenyl group are a 2,3-hydrofuranyl group and a 2,3-hydrothiophenyl group. A $C_1$-$C_{10}$ heterocycloalkenylene group used herein may refer to a divalent group having the same structure as the $C_1$-$C_{10}$ heterocycloalkenyl group.

A $C_6$-$C_{60}$ aryl group used herein may refer to a monovalent group including a carbocyclic aromatic system having 6 to 60 carbon atoms, and a $C_6$-$C_{60}$ arylene group used herein may refer to a divalent group including a carbocyclic aromatic system having 6 to 60 carbon atoms. Non-limiting examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include a plurality of rings, the respective rings may be fused to each other.

A $C_1$-$C_{60}$ heteroaryl group used herein may refer to a monovalent group having a carbocyclic aromatic system including at least one hetero atom selected from N, O, P, and S as a ring-forming atom and 1 to 60 carbon atoms. A $C_1$-$C_{60}$ heteroarylene group used herein may refer to a divalent group having a carbocyclic aromatic system including at least one hetero atom selected from N, O, P, and S as a ring-forming atom and 1 to 60 carbon atoms. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include a plurality of rings, the respective rings may be fused to each other.

A $C_6$-$C_{60}$ aryloxy group used herein may refer to a monovalent group represented by —$OA_{102}$ (wherein $A_{102}$ is the $C_6$-$C_{60}$ aryl group), and a $C_6$-$C_{60}$ arylthio group used herein may refer to a monovalent group represented by —$SA_{103}$ (wherein $A_{103}$ is the $C_6$-$C_{60}$ aryl group).

A monovalent non-aromatic condensed polycyclic group used herein may refer to a monovalent group that has two or more rings condensed to each other, and has only carbon atoms (e.g., the number of carbon atoms may be in a range of 8 to 60) as ring forming atoms, wherein the molecular structure as a whole is non-aromatic. A divalent non-aromatic condensed polycyclic group used herein may refer to a divalent group having the same structure as the monovalent non-aromatic condensed polycyclic group.

A monovalent non-aromatic condensed heteropolycyclic group used herein may refer to a monovalent group that has two or more rings condensed to each other, has at least one hetero atom selected from N, O, P, and S as a ring-forming atom, other than carbon atoms (e.g., the number of carbon atoms may be in a range of 2 to 60), wherein the molecular structure as a whole is non-aromatic. An example of the monovalent non-aromatic condensed heteropolycyclic group is a carbazolyl group. A divalent non-aromatic condensed heteropolycyclic group used herein may refer to a divalent group having the same structure as the monovalent non-aromatic condensed heteropolycyclic group.

At least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, wherein $Q_{11}$ to $Q_{17}$, $Q_{21}$ to $Q_{27}$, and $Q_{31}$ to $Q_{37}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, at least one substituent of the substituted $C_3$-$C_{10}$ cycloalkylene group, substituted $C_1$-$C_{10}$ heterocycloalkylene group, substituted $C_3$-$C_1$ cycloalkenylene group, substituted $C_1$-$C_{10}$ heterocycloalkenylene group, substituted $C_6$-arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —N($Q_{11}$)($Q_{12}$), —Si($Q_{13}$)($Q_{14}$)($Q_{15}$), and —B($Q_{16}$)($Q_{17}$);

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

"Ph" used herein may refer to a phenyl group, "Me" may refer to a methyl group, "Et" may refer to an ethyl group, and "ter-Bu" or "Bu$^t$" may refer to a tert-butyl group.

Hereinafter, an organic light-emitting device according to an embodiment will be described in more detail with reference to Examples. However, these examples are provided for illustrative purposes only, and should not in any sense be interpreted as limiting the scope of the present disclosure.

SYNTHESIS EXAMPLES

Synthesis Example 1

Synthesis of Compound 2

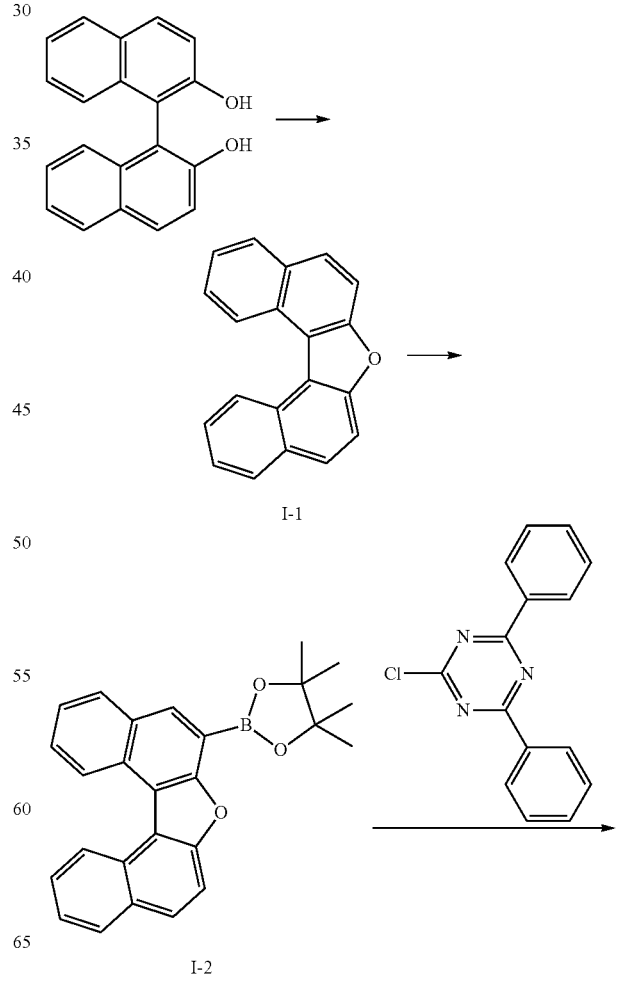

Synthesis Example 2

Synthesis of Compound 9

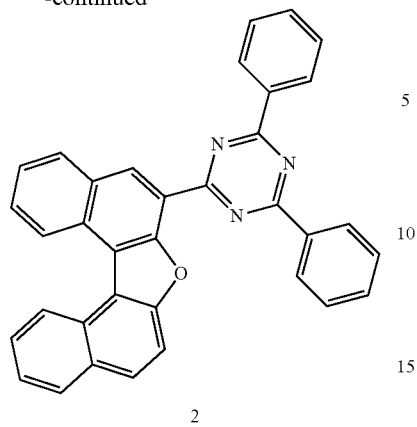

2

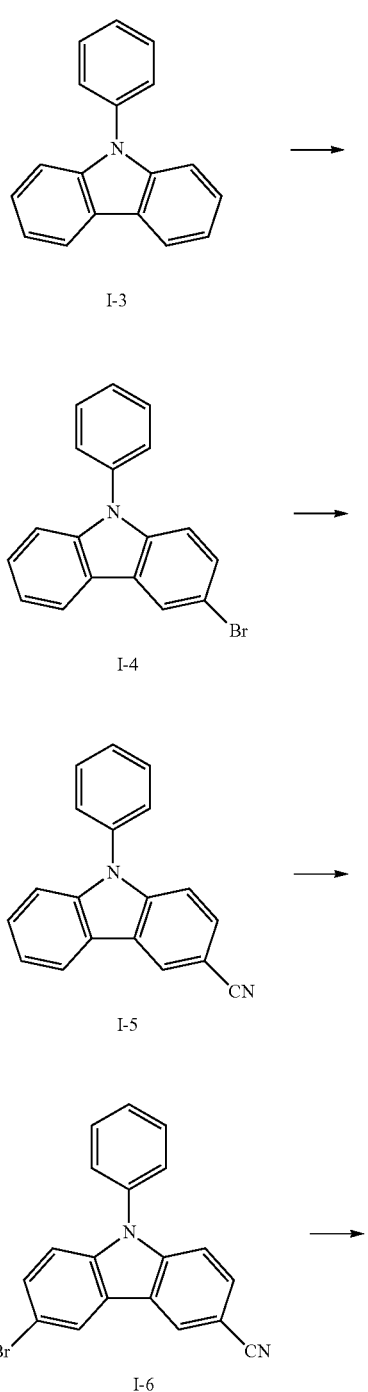

Synthesis of Intermediate I-1

5.73 g (20 mmol) of (1,1'-binaphthalene)-2,2'-diol and 4.10 g (20 mmol) of p-TsOH were dissolved in 150 mL in toluene, and the solution was stirred at 100° C. for 12 hours. The reaction solution was cooled to room temperature, potassium carbonate solution was added thereto, and an organic layer was extracted therefrom by using 60 mL of ethylacetate three times. The organic layer thus collected was dried with magnesium sulfate, and the residue obtained after evaporating a solvent therefrom was separated and purified by using a silica gel column chromatography to obtain 3.76 g of Intermediate I-1 (yield: 70%). The compound thus produced was confirmed by using Liquid chromatography-mass spectrometry (LC-MS).

$C_{20}H_{12}O$ cal. 268.09, found 268.07.

Synthesis of Intermediate I-2

3.76 g (14 mmol) of Intermediate I-1 was dissolved in 80 mL of THF, and 5.6 mL of n-BuLi (2.5M in Hexane) was added thereto at −78° C. After about 1 hour, 3.64 mL (18.2 mmol) of 2-isopropoxy-4,4,5,5-tetramethyl-1,3,2-dioxaborolane was added thereto, and the resulting solution was stirred at room temperature for 5 hours. The resultant was washed with water and 30 ml of diethylether three times. The diethylether layer thus collected was dried with magnesium sulfate, and the residue obtained after evaporating a solvent therefrom was separated and purified by using a silica gel column chromatography to obtain 4.97 g of Intermediate I-2 (yield: 90%). The compound thus produced was confirmed by using LC-MS.

$C_{26}H_{23}BO_3$ cal. 394.17, found 394.16

Synthesis of Compound 2

4.97 g (12.6 mmol) of Intermediate I-2, 3.37 g (12.6 mmol) of 2-chloro-4,6-diphenyl-1,3,5-triazine, 0.73 g (0.63 mmol) of Pd(PPh$_3$)$_4$, and 5.22 g (37.8 mmol) of K$_2$CO$_3$ were dissolved in 80 mL of a solvent mixture THF/H$_2$O (at a volume ratio of 2/1), and the reaction solution was stirred at a temperature of 80° C. for 12 hours. The resultant obtained therefrom was cooled to room temperature, and an organic layer was extracted by using 30 mL of water and 30 mL of ethylacetate three times. The organic layer thus collected was dried with magnesium sulfate, and the residue obtained after evaporating a solvent therefrom was separated and purified by using a silica gel column chromatography to obtain 5.03 g of Compound 2 (yield: 80%). The compound thus produced was confirmed by using LC-MS and $^1$H NMR.

$C_{35}H_{21}N_3O$ 499.17, found 499.16

-continued

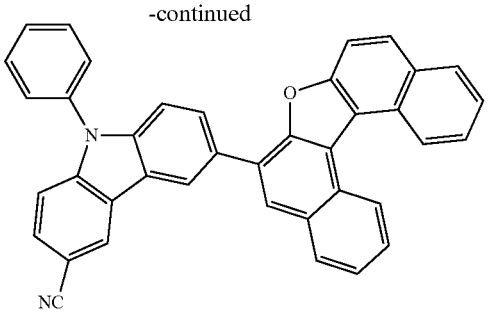

9

Synthesis of Intermediate I-3

5.02 g (30 mmol) of 9H-carbazole, 4.71 g (30 mmol) of bromobenzene, 1.14 g (18 mmol) of copper power, and 6.22 g (45 mmol) of $K_2CO_3$ were dissolved in 80 mL of o-dichlorobenzene, and the reaction solution was stirred at a temperature of 180° C. for 24 hours. The resulting reaction solution was cooled to room temperature, and an organic layer was extracted therefrom by using 60 mL of water and 50 mL of ethylacetate three times. The organic layer thus collected was dried with magnesium sulfate, and the residue obtained after evaporating a solvent therefrom was separated and purified by using a silica gel column chromatography to obtain 5.47 g of Intermediate I-3 (yield: 75%). The compound thus produced was confirmed by using LC-MS.

$C_{18}H_{13}N$ cal. 243.10, found 243.13

Synthesis of Intermediate I-4

4.00 g (22.5 mmol) of N-bromosuccinimide was added to a solution prepared by completely dissolving 5.47 g (22.5 mmol) of Intermediate I-3 in 80 mL of $CH_2Cl_2$, and the reaction solution was stirred at room temperature for 12 hours. An organic layer was extracted from the reaction solution by using 60 mL of water and 50 mL of $CH_2Cl_2$ three times. The organic layer thus collected was dried with magnesium sulfate, and the residue obtained after evaporating a solvent therefrom was recrystallized by using methanol to obtain 6.16 g of Intermediate I-4 (yield: 85%). The compound thus produced was confirmed by using LC-MS.

$C_{18}H_{12}BrN$ cal. 321.02, found 321.05

Synthesis of Intermediate I-5

6.16 g (19.1 mmol) of Intermediate I-4 and 2.57 g (28.7 mmol) of CuCN were dissolved in 70 mL of DMF, stirred for 24 hr at 150° C. and the reaction solution was cooled to room temperature, and an organic layer was extracted therefrom by adding 60 mL of ammonia water and 60 mL of water and using 50 mL of $CH_2Cl_2$ three times. The organic layer thus collected was dried with magnesium sulfate, and the residue obtained after evaporating a solvent therefrom was separated and purified by using a silica gel column chromatography to obtain 4.71 g of Intermediate I-5 (yield: 92%). The compound thus produced was confirmed by using LC-MS.

$C_{19}H_{12}N_2$ cal. 268.10, found 268.12

Synthesis of Intermediate I-6

3.13 g (17.6 mmol) of N-bromosuccinimide was added to a solution prepared by completely dissolving 4.71 g (17.6 mmol) of Intermediate I-5 in 80 mL of $CH_2Cl_2$ and the reaction solution was stirred at room temperature for 8 hours. 60 mL of water was added to the resulting reaction solution, and an organic layer was extracted therefrom by using 50 mL of $CH_2Cl_2$ three times. The organic layer thus collected was dried with magnesium sulfate, and the residue obtained after evaporating a solvent therefrom was recrystallized by using methanol to obtain 5.81 g of Intermediate I-6 (yield: 95%). The compound thus produced was confirmed by using LC-MS.

$C_{19}H_{11}BrN_2$ cal. 346.01, found 346.03

Synthesis of Compound 9

Compound 9 was obtained in the same (or substantially the same) manner as in the synthesis of Compound 2, except that Intermediate I-6 was used instead of 2-chloro-4,6-diphenyl-1,3,5-triazine. The compound thus produced was confirmed by using LC-MS and $^1$H NMR.

$C_{39}H_{22}N_2O$ cal. 534.17, found 534.18

Synthesis Example 3

Synthesis of Compound 25

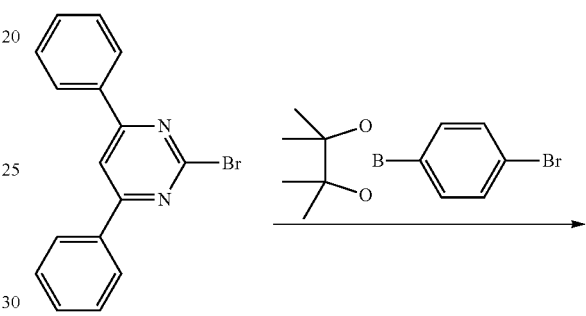

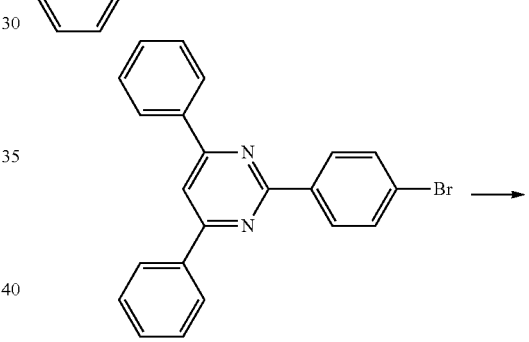

I-7

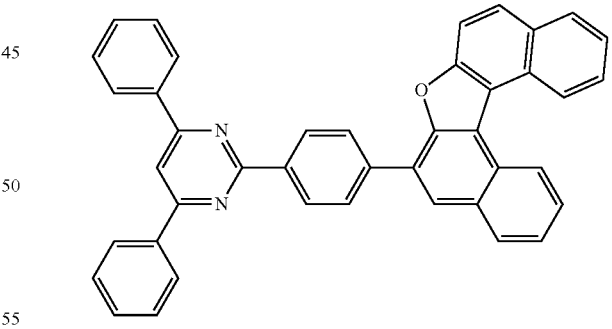

25

Synthesis of Intermediate I-7

6.22 g (20 mmol) of 2-bromo-4,6-diphenylpyrimidine, 4.24 g (15 mmol) of 2-(4-bromophenyl)-4,4,5,5-tetramethyl-1,3,2-dioxaborolane, 1.7 g (0.75 mmol) of $Pd(PPh_3)_4$, and 6.3 g (45 mmol) of $K_2CO_3$ were dissolved in 300 mL of a solvent mixture THF/$H_2O$ (at a volume ratio of 2/1), and the reaction solution was stirred at a temperature of 80° C. for 12 hours. The resulting reaction solution was cooled to room temperature, and an organic layer was extracted therefrom by using 60 mL of water and 60 mL of ethylacetate three times. The organic layer thus collected was dried with magnesium sulfate, and the residue obtained after evaporating a solvent therefrom was separated and purified by using a silica gel column chromatography to obtain 4.4 g of Intermediate I-7 (yield: 76%). The compound thus produced was confirmed by using LC-MS.

$C_{22}H_{15}BrN_2$ cal. 386.04, found 386.06

Synthesis of Compound 25

Compound 25 was obtained in the same (or substantially the same) manner as in the synthesis of Compound 2, except that Intermediate I-7 was used instead of 2-chloro-4,6-diphenyl-1,3,5-triazine. The compound thus produced was confirmed by using LC-MS and $^1$H NMR.

$C_{42}H_{26}N_2O$ cal. 574.20, found 574.24

Synthesis Example 4

Synthesis of Compound 34

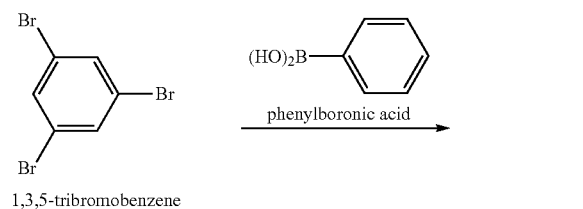

1,3,5-tribromobenzene

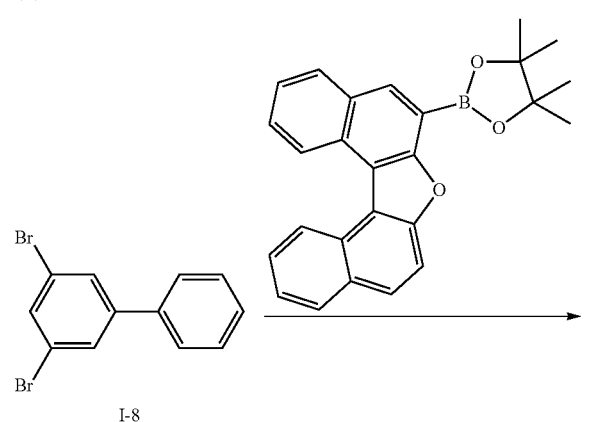

I-8

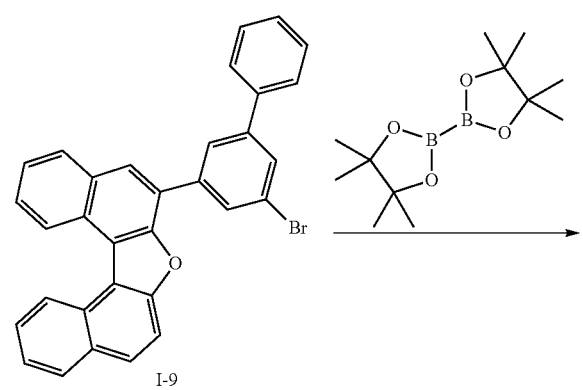

I-9

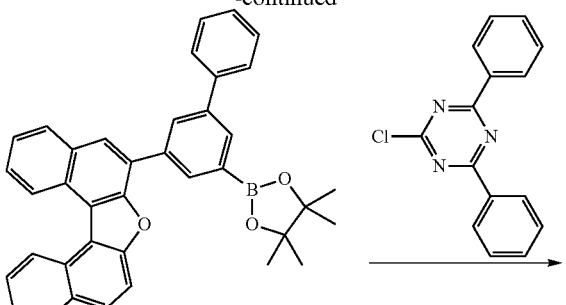

I-10

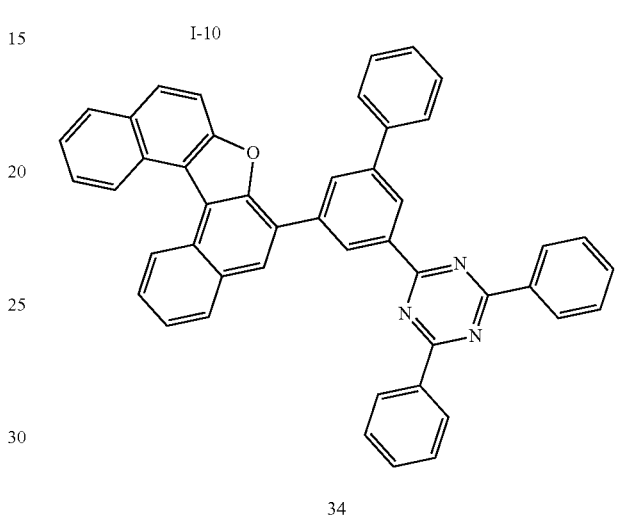

34

Synthesis of Intermediate I-8

12.6 g (40 mmol) of 1,3,5-tribromobenzene, 3.66 g (30 mmol) of phenylboronic acid, 3.4 g (1.5 mmol) of Pd(PPh$_3$)$_4$, and 12.6 g (90 mmol) of K$_2$CO$_3$ were dissolved in 350 mL of a mixture solvent THF/H$_2$O (at a volume ratio of 2/1), and the reaction solution was stirred at a temperature of 80° C. for 12 hours. The resulting reaction solution was cooled to room temperature, and an organic layer was extracted therefrom by using 60 mL of water and 60 mL of ethylacetate three times. The organic layer thus collected was dried with magnesium sulfate, and the residue obtained after evaporating a solvent therefrom was separated and purified by using a silica gel column chromatography to obtain 5.9 g of Intermediate I-8 (yield: 63%). The compound thus produced was confirmed by using LC-MS.

$C_{12}H_8Br_2$ cal. 309.90. found 309.92

Synthesis of Intermediate I-9

5.9 g (19 mmol) of Intermediate I-8, 5.91 g (15 mmol) of Intermediate I-2, 1.7 g (0.75 mmol) of Pd(PPh$_3$)$_4$, and 6.3 g (45 mmol) of K$_2$CO$_3$ were dissolved in 200 mL of a mixture solvent THF/H$_2$O (at a volume ratio of 2/1), and the reaction solution was stirred at a temperature of 80° C. for 12 hours. The resulting reaction solution was cooled to room temperature, and an organic layer was extracted therefrom by using 60 mL of water and 60 mL of ethylacetate three times. The organic layer thus collected was dried with magnesium sulfate, and the residue obtained after evaporating a solvent therefrom was separated and purified by using a silica gel column chromatography to obtain 5.24 g of Intermediate I-9 (yield: 70%). The compound thus produced was confirmed by using LC-MS.

$C_{32}H_{19}BrO$ cal. 498.06. found 498.08

Synthesis of Intermediate I-10

5.24 g (10.5 mmol) of Intermediate I-9, 2.93 g (11.6 mmol) of 4,4,4',4',5,5,5',5'-octamethyl-2,2'-bi(1,3,2-dioxaborolane), 0.37 g (0.53 mmol) of Pd(PPh$_3$)$_2$Cl$_2$, and 3.1 g (31.5 mmol) of KOAc were dissolved in 200 mL of 1,4-dioxane, and the reaction solution was stirred at a temperature of 95° C. for 12 hours. The resulting reaction solution was cooled to room temperature, and an organic layer was extracted therefrom by using 60 mL of water and 60 mL of ethylacetate three times. The organic layer thus collected was dried with magnesium sulfate, and the residue obtained after evaporating a solvent therefrom was separated and purified by using a silica gel column chromatography to obtain 4.3 g of Intermediate I-10 (yield: 70%). The compound thus produced was confirmed by using LC-MS.

C$_{38}$Fl$_{31}$BO$_3$ cal. 546.24. found 546.25

Synthesis of Compound 34

Compound 34 was obtained in the same (or substantially the same) manner as in the synthesis of Compound 2, except that Intermediate I-10 was used instead of Intermediate I-2. The compound thus produced was confirmed by using LC-MS and $^1$H NMR.

C$_{47}$H$_{29}$N$_3$O cal. 651.23. found 651.22

Synthesis Example 5

Synthesis of Compound 49

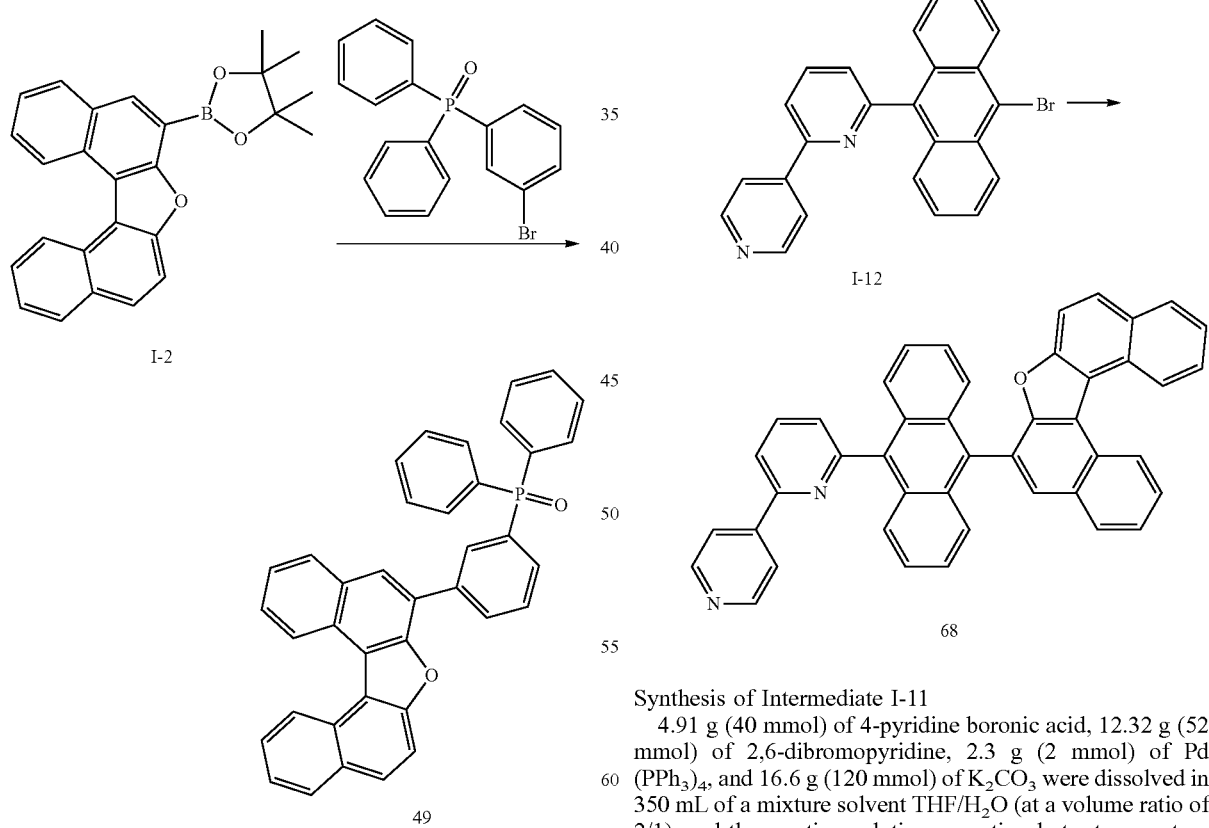

49

Synthesis of Compound 49

Compound 49 was obtained in the same (or substantially the same) manner as in the synthesis of Compound 2, except that (3-bromophenyl)diphenylphosphine oxide was used instead of 2-chloro-4,6-diphenyl-1,3,5-triazine. The compound thus produced was confirmed by using LC-MS and $^1$H NMR.

C$_{38}$H$_{25}$O$_2$P cal. 544.16, found 544.17

Synthesis Example 6

Synthesis of Compound 68

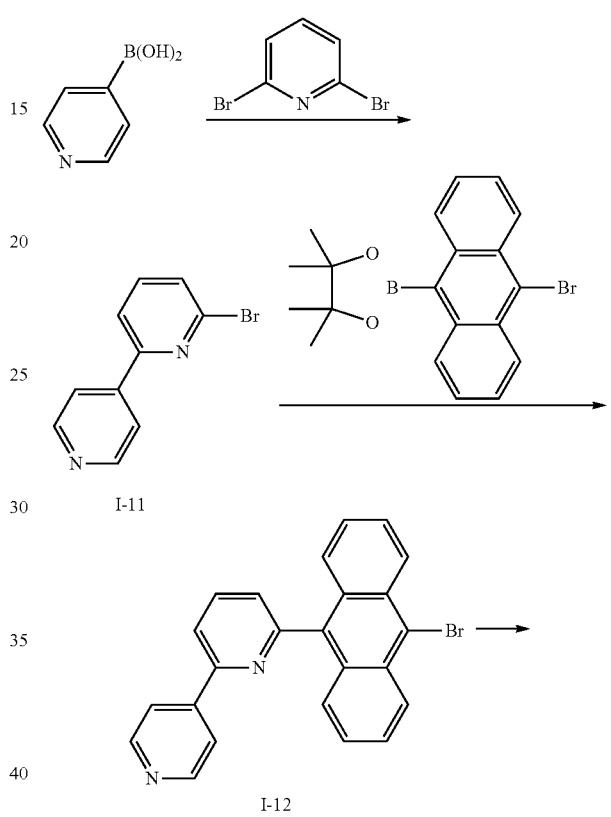

Synthesis of Intermediate I-11

4.91 g (40 mmol) of 4-pyridine boronic acid, 12.32 g (52 mmol) of 2,6-dibromopyridine, 2.3 g (2 mmol) of Pd(PPh$_3$)$_4$, and 16.6 g (120 mmol) of K$_2$CO$_3$ were dissolved in 350 mL of a mixture solvent THF/H$_2$O (at a volume ratio of 2/1), and the reaction solution was stirred at a temperature of 80° C. for 12 hours. The resulting reaction solution was cooled to room temperature, and an organic layer was extracted therefrom by using 60 mL of water and 60 mL of ethylacetate three times. The organic layer thus collected was dried with magnesium sulfate, and the residue obtained after evaporating a solvent therefrom was separated and purified by using a silica gel column chromatography to obtain 3.77 g of Intermediate I-11 (yield: 40%). The compound thus produced was confirmed by using LC-MS.

$C_{10}H_7BrN_2$ cal. 233.98, found 233.97

Synthesis of Intermediate I-12

3.77 g (16 mmol) of Intermediate I-11, 4.6 g (12 mmol) of 2-(10-bromoan anthracene-9-yl)-4,4,5,5-tetramethyl-1,3,2-dioxaborolane, 0.7 g (0.6 mmol) of Pd(PPh$_3$)$_4$, and 5 g (36 mmol) of K$_2$CO$_3$ were dissolved in 200 mL of a a mixture solvent THF/H$_2$O (at a volume ratio of 2/1), and the reaction solution was stirred at a temperature of 80° C. for 12 hours. The resulting reaction solution was cooled to room temperature, and an organic layer was extracted therefrom by using 60 mL of water and 60 mL of ethylacetate three times. The organic layer thus collected was dried with magnesium sulfate, and the residue obtained after evaporating a solvent therefrom was separated and purified by using a silica gel column chromatography to obtain 3 g of Intermediate I-12 (yield: 60%). The compound thus produced was confirmed by using LC-MS.

$C_{24}H_{15}BrN_2$ cal. 410.04, found 410.05

Synthesis of Compound 68

Compound 68 was obtained in the same (or substantially the same) manner as in the synthesis of Compound 2, except that Intermediate I-12 was used instead of 2-chloro-4,6-diphenyl-1,3,5-triazine. The compound thus produced was confirmed by using LC-MS and $^1$H NMR.

$C_{44}H_{26}N_2O$ cal. 598.20, found 598.18

Synthesis Example 7

Synthesis of Compound 73

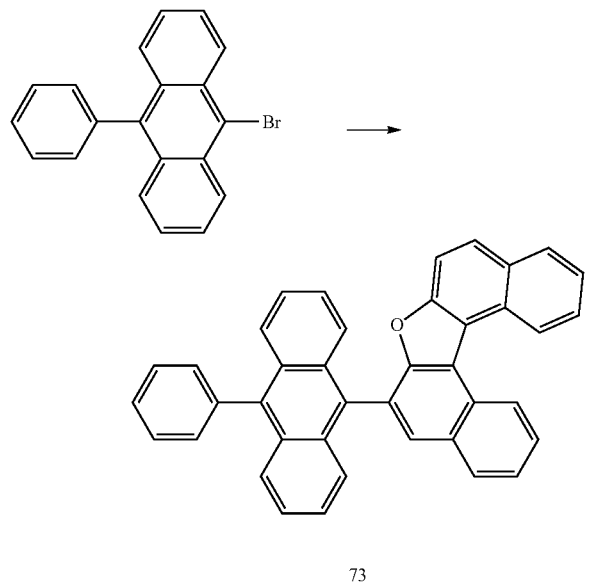

73

Synthesis of Compound 73

Compound 73 was obtained in the same (or substantially the same) manner as in the synthesis of Compound 2, except that 9-bromo-10-phenylanthracene was used instead of 2-chloro-4,6-diphenyl-1,3,5-triazine. The compound thus produced was confirmed by using LC-MS and $^1$H NMR.

$C_{40}H_{24}O$ cal. 520.18, found 520.19

Synthesis Example 8

Synthesis of Compound 96

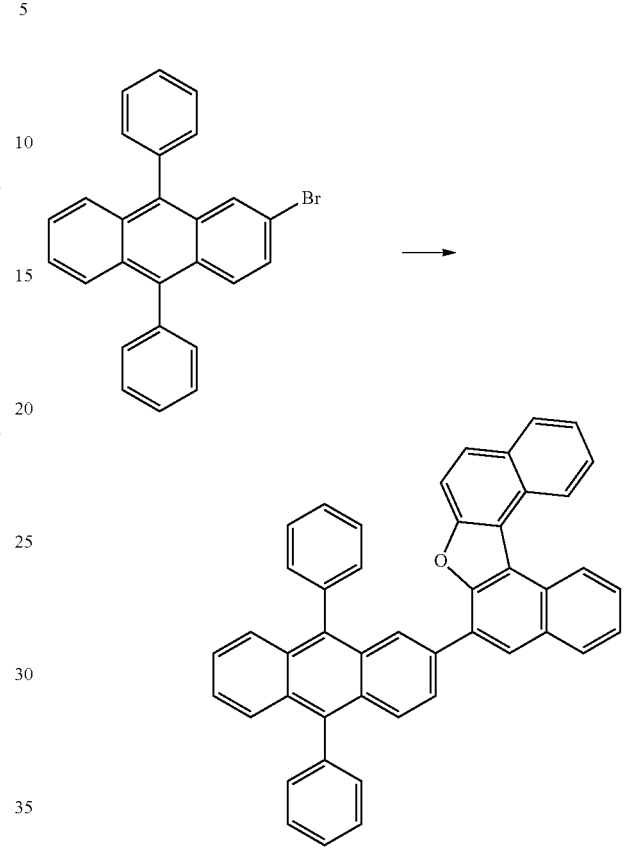

96

Synthesis of Compound 96

Compound 96 was obtained in the same (or substantially the same) manner as in the synthesis of Compound 2, except that 2-bromo-9,10-diphenylanthracene was used instead of 2-chloro-4,6-diphenyl-1,3,5-triazine. The compound thus produced was confirmed by using LC-MS and $^1$H NMR.

$C_{46}H_{28}O$ cal. 596.21, found 596.20

Synthesis of Compound H-9

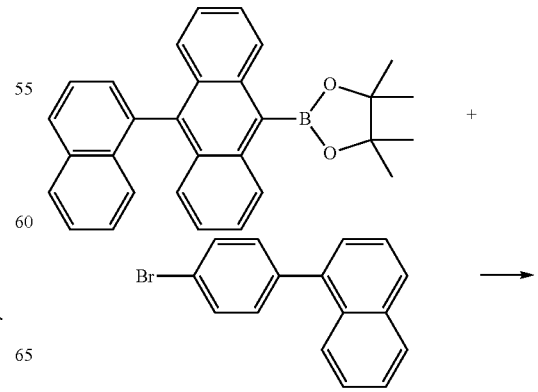

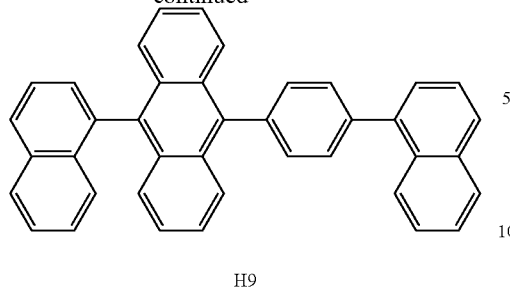

H9

4.3 g (10.0 mmol) of 10-(1-naphthyl)anthracene-9-pinacolborate, 3.1 g (11.0 mmol) of 1-(4-bromophenyl)naphthalene, 0.58 g (0.5 mmol) of Pd(PPh$_3$)$_4$, and 4.1 g (30.0 mmol) of K$_2$CO$_3$ were dissolved in 40 mL of a mixture solvent THF/H$_2$O (at a volume ratio of 2/1), and the reaction solution was stirred at a temperature of 80° C. for 5 hours. The resulting reaction solution was cooled to room temperature, and an organic layer was extracted therefrom by using 40 mL of water and 40 mL of diethylether three times. The organic layer thus collected was dried with magnesium sulfate, and the residue obtained after evaporating a solvent therefrom was separated and purified by using a silica gel column chromatography to obtain 4.3 g of Compound H-9 (yield: 84%). The compound thus produced was confirmed by using LC-MS and $^1$H-NMR.

C$_{40}$H$_{26}$: M+1 507.2

Synthesis of Compound H-45

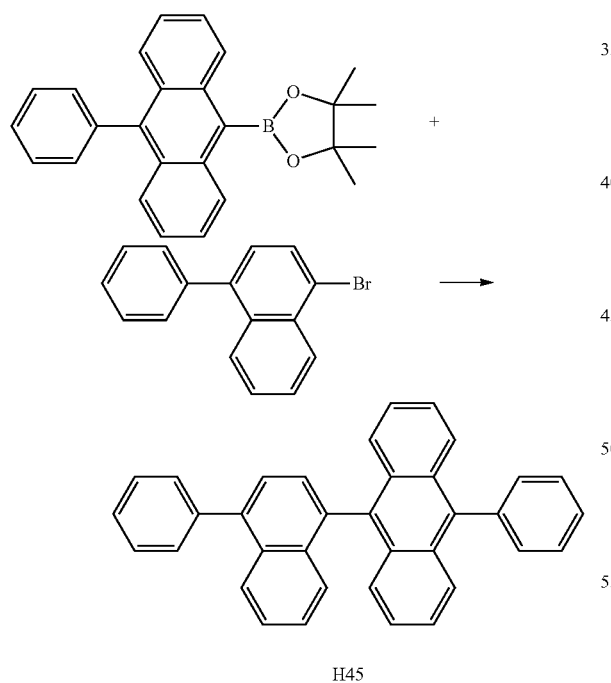

H45

Compound H-45 was obtained in the same (or substantially the same) manner as in the synthesis of Compound H-9, except that corresponding compounds (refer to the scheme above) were used, instead of the compounds used in the synthesis of Compound H-9. The compound thus produced was confirmed by using LC-MS and $^1$H NMR.

C$_{36}$H$_{24}$: M+1 457.2

Synthesis of Compound H-60

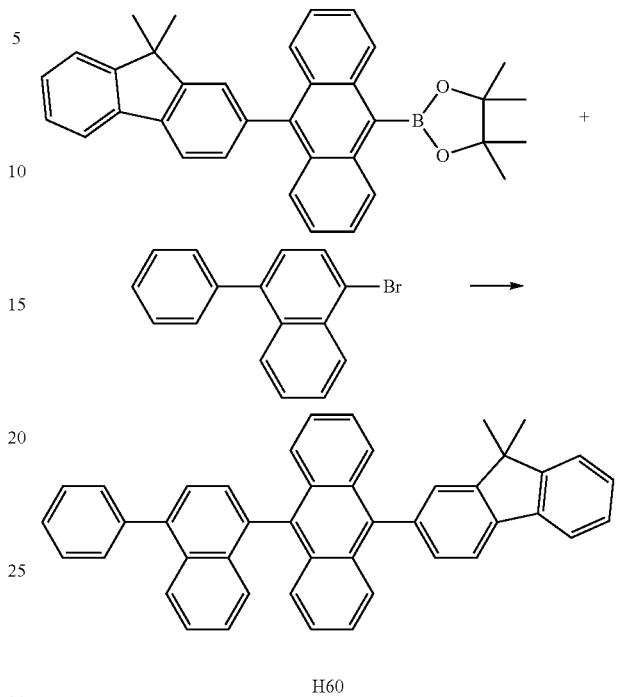

H60

Compound H-60 (yield: 81%) was obtained in the same (or substantially the same) manner as in the synthesis of Compound H-9, except that corresponding compounds (refer to the scheme above) were used, instead of the compounds used in the synthesis of Compound H-9. The compound thus produced was confirmed by using LC-MS and $^1$H NMR.

C$_{45}$H$_{32}$: M+1 573.3

Synthesis of Compound HT1

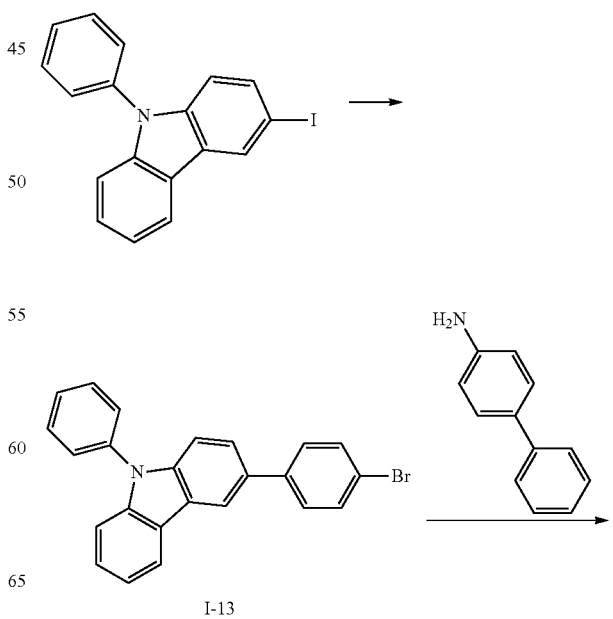

I-13

-continued

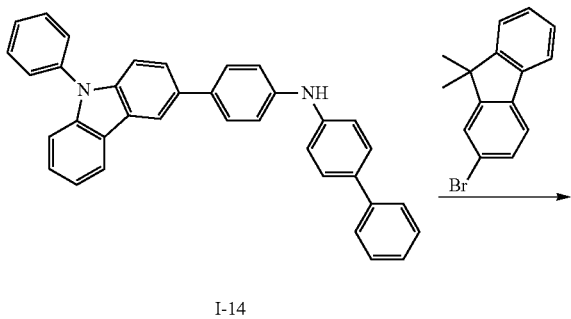

I-14

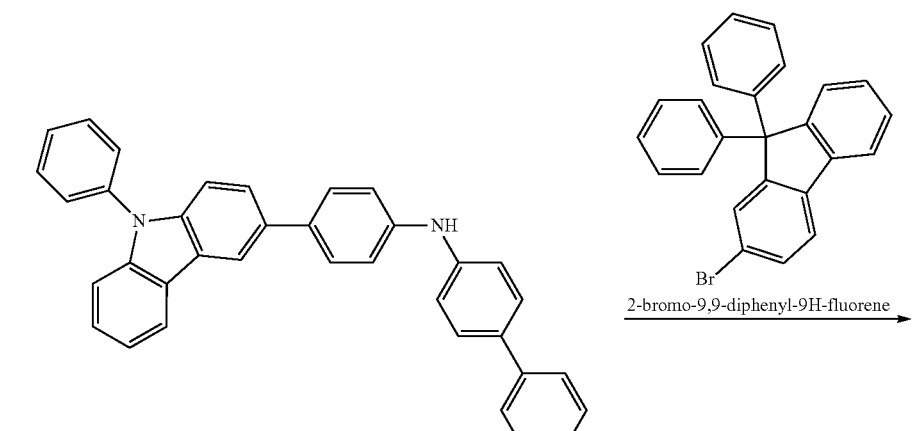

HT1

Synthesis of Intermediate I-13

5 g of 3-iodo-9-phenyl-9H-carbazole and 2.7 g of 4-bromophenylboronic acid were dissolved in a solvent mixture including 50 ml of tetrahydrofuran and 25 ml of water, and 5.6 g of potassium carbonate and 780 mg of Pd(PPh$_3$)$_4$ were added thereto. The reaction solution was allowed to react at temperature of 65° C. for 7 hours. The resulting reaction solution was cooled to room temperature, and an organic layer was extracted therefrom by using ethylacetate. The organic layer thus collected was dried with anhydrous magnesium sulfate, and the residue obtained after filtering under reduced-pressure was separated and purified by using a silica gel column chromatography to obtain 4.1 g of Intermediate I-13 (yield: 76%). The compound thus produced was confirmed by using LC-MS.

$C_{24}H_{16}BrN$ cal. 397.05, found 397.06

Synthesis of Intermediate I-14

3 g of Intermediate I-13, 3 g of 1,1'-biphenyl]-4-amine, 360 mg of Pd$_2$(dba)$_3$, 0.4 ml of 1 M P(t-Bu)$_3$, and 2.7 g of KOtBu were dissolved in 75 mL of toluene, and the reaction solution was stirred at a temperature of 85° C. for 2 hours. The resulting reaction solution was cooled to room temperature, the reaction was completed by adding water thereto, and an organic layer was extracted therefrom by using ethylacetate three times. The organic layer thus collected was dried with anhydrous magnesium sulfate, and the residue obtained after filtering under reduced-pressure was separated and purified by using a silica gel column chromatography to obtain 3.5 g of Intermediate I-14 (yield: 83%). The compound thus produced was confirmed by using LC-MS.

$C_{36}H_{26}N_2$ cal. 486.21, found 486.20

Synthesis of Compound HT1

Compound HT1 was synthesized in the same (or substantially the same) manner as in the synthesis of Intermediate I-14, except that 2-bromo-9,9-dimethyl-9H-fluorene was used instead of Intermediate I-13, and Intermediate I-14 was used instead of [1,1'-biphenyl]-4-amine. The compound thus produced was confirmed by using LC-MS and $^1$H-NMR.

$C_{40}H_{26}$: M+1 507.2

$C_{51}H_{38}N_2$ cal. 678.30 found 678.29

Synthesis of Compound HT3

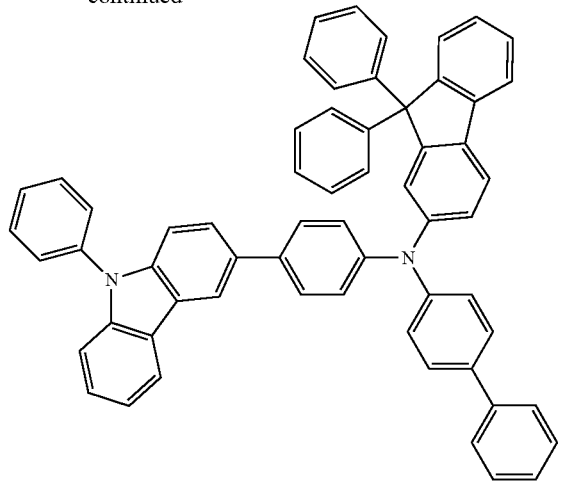

HT3

Compound HT3 was synthesized in the same (or substantially the same) manner as in the synthesis of Compound HT1, except that bromo-9,9-diphenyl-9H-fluorene was used instead of 2-bromo-9,9-dimethyl-9H-fluorene. The compound thus produced was confirmed by using LC-MS and $^1$H-NMR.

$C_{61}H_{42}N_2$ cal. 802.33 found 802.32

Synthesis of Compound HT7

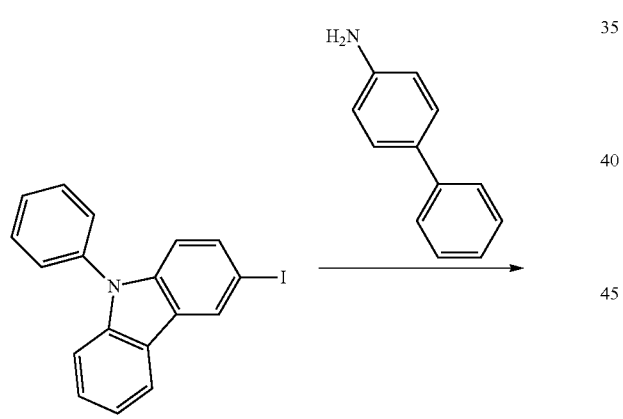

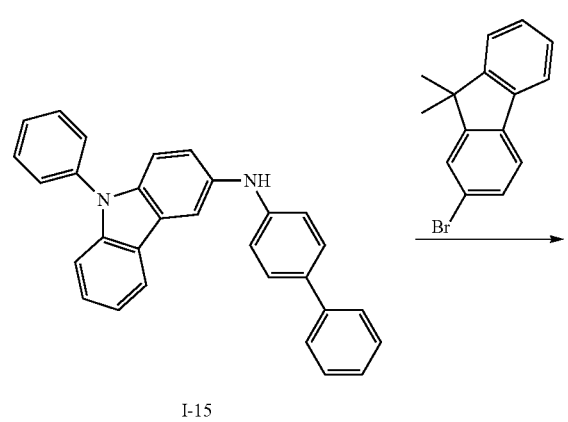

I-15

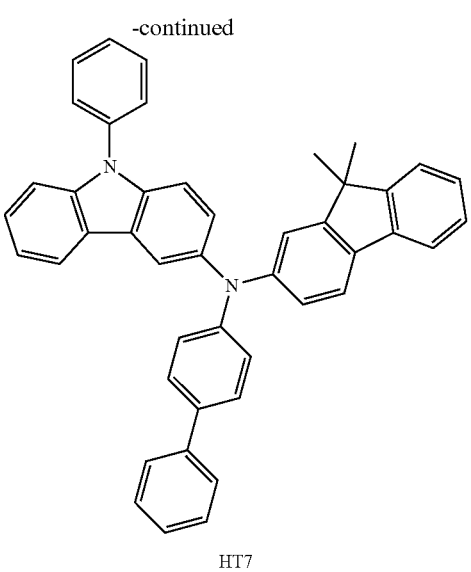

HT7

Synthesis of Intermediate I-15

Intermediate I-15 was synthesized in the same (or substantially the same) manner as in the synthesis of Intermediate I-14, except that 3-iodo-9-phenyl-9H-carbazole was used instead of Intermediate I-13. The compound thus produced was confirmed by using LC-MS.

$C_{30}H_{22}N_2$ cal. 410.18 found 410.15

Synthesis of Compound HT7

Compound HT7 was synthesized in the same (or substantially the same) manner as in the synthesis of Compound HT1, except that Intermediate I-15 was used instead of Intermediate I-14. The compound thus produced was confirmed by using LC-MS and $^1$H NMR.

$C_{45}H_{34}N_2$ cal. 602.27 found 602.25

125
Synthesis of Compound HT28

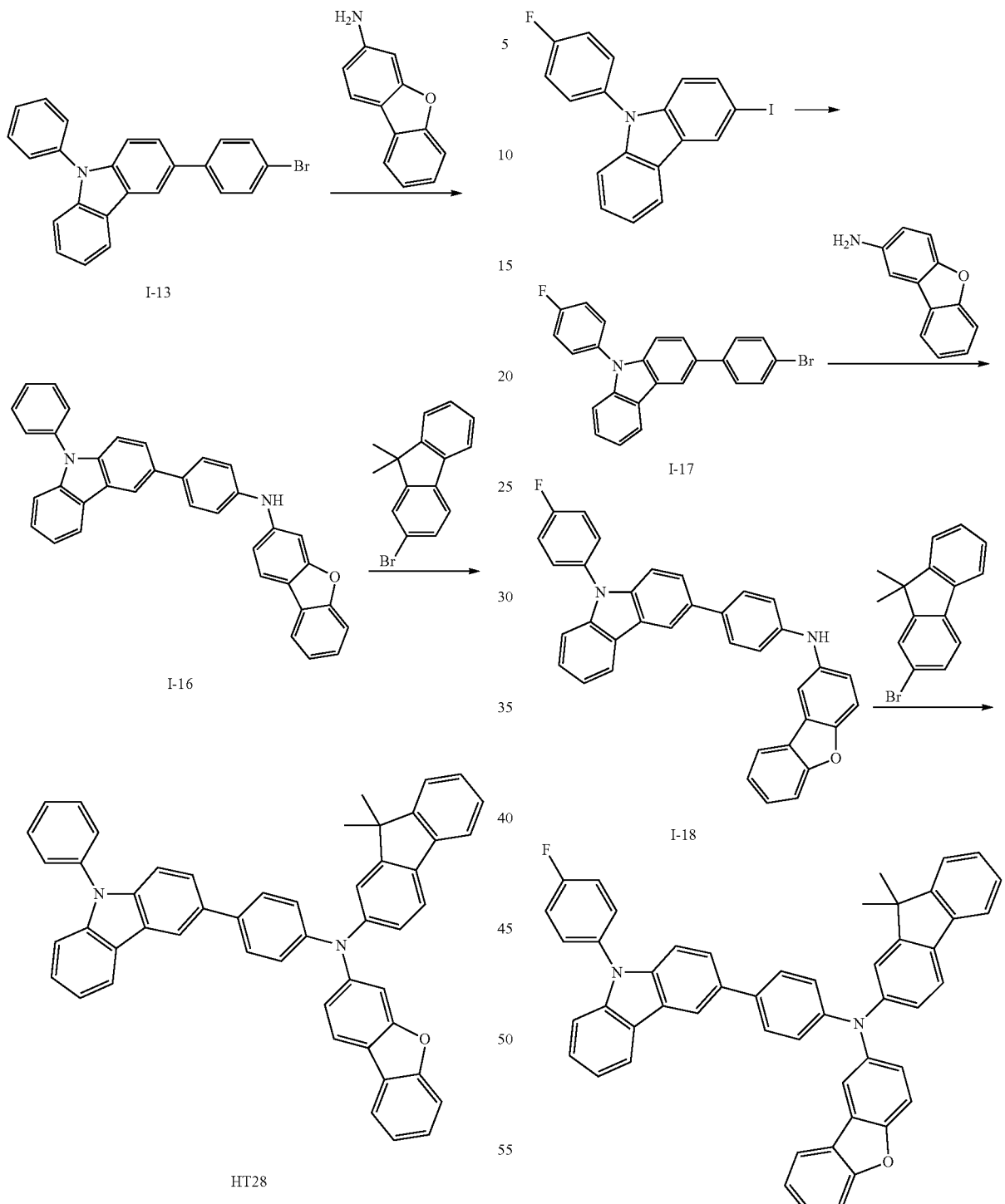

I-13

I-16

HT28

Synthesis of Compound HT28

Compound HT28 was synthesized in the same (or substantially the same) manner as in the synthesis of Compound HT1, except that dibenzo[b,d]furan-3-amine was used instead of [1,1'-biphenyl]-4-amine, and Intermediate I-16 was used instead of Intermediate I-14. The compound thus produced was confirmed by using LC-MS and $^1$H NMR.

$C_{51}H_{36}N_2O$ cal. 692.28 found 692.27

126
Synthesis of Compound HT30

I-17

I-18

HT30

Synthesis of Compound HT30

Compound HT30 was synthesized in the same (or substantially the same) manner as in the synthesis of Compound HT1, except that 9-(4-fluorophenyl)-3-iodo-9H-carbazole was used to obtain Intermediate I-17 instead of 3-iodo-9-phenyl-9H-carbazole used to obtain Intermediate I-13, and that dibenzo[b,d]furan-2-amine was used to obtain Intermediate I-18 instead of [1,1'-biphenyl]-4-amine used to obtain Intermediate I-14. The compound thus produced was confirmed by using LC-MS and $^1$H NMR.

$C_{51}H_{35}FN_2O$ cal. 710.27 found 710.26

Synthesis of Compound HT33

Compound HT33 was synthesized in the same (or substantially the same) manner as in the synthesis of Compound HT3, except that dibenzo[b,d]furan-2-amine was used to obtain Intermediate I-19 instead of [1,1'-biphenyl]-4-amine

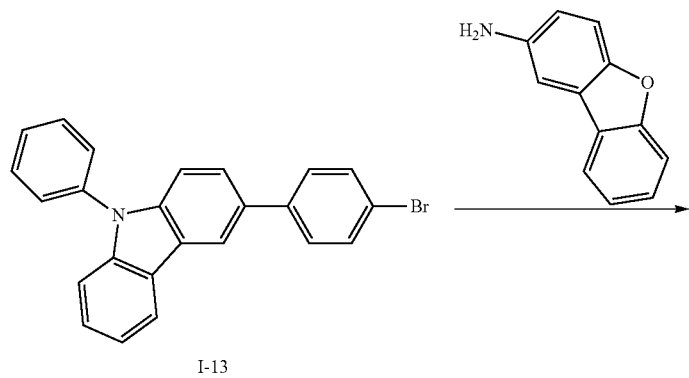

I-13

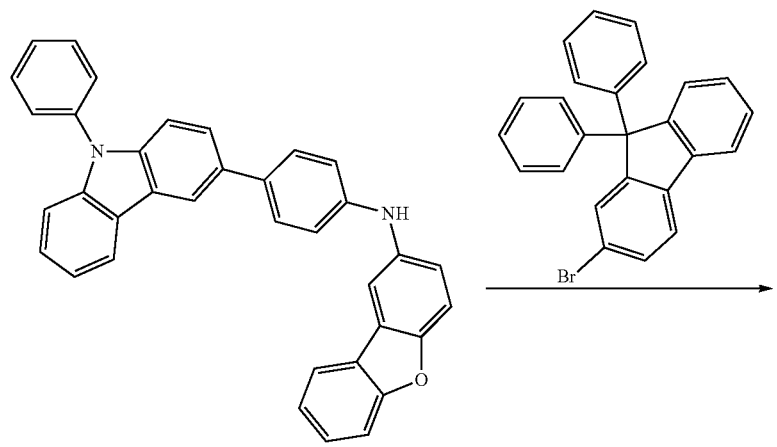

I-19

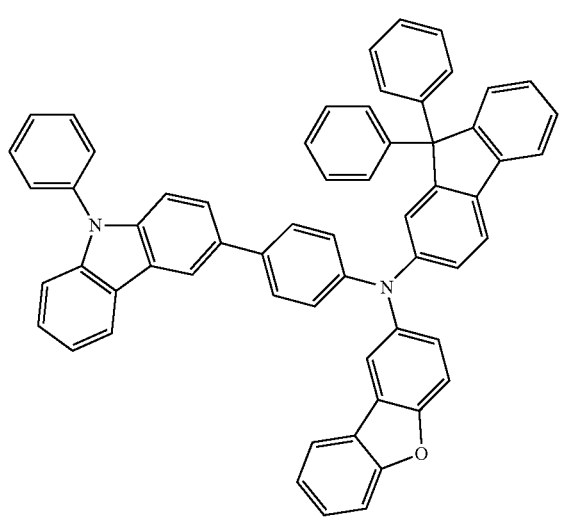

HT33 used to obtain Intermediate I-14. The compound thus produced was confirmed by using LC-MS and $^1$H NMR.

$C_{61}H_{40}N_2O$ cal. 816.31 found 816.30.

Hereinafter, $^1$H NMR and LC-MS data of the synthesized compounds is summarized in Table 1 below.

Example 1

A Corning 15 Ω/cm' (1200 Å) ITO glass substrate, as an anode, was cut to a size of 50 mm×50 mm×0.7 mm, sonicated by using isopropyl alcohol and pure water for 5

TABLE 1

| Compound | 1H NMR (CDCl3, 400 MHz) | LC-MS Found | LC-MS Calc. |
|---|---|---|---|
| 2 | 8.99-8.95(m, 2H), 8.85-8.81(m, 5H), 8.24-8.19(m, 1H), 7.92-7.81(m, 3H), 7.64-7.54(m, 8H), 7.42-7.38(m, 2H) | 499.16 | 499.17 |
| 9 | 8.85-8.80(m, 2H), 8.60(m, 1H), 8.49(m, 1H), 8.29(m, 1H), 7.95-7.90(m, 3H), 7.84-7.79(m, 2H), 7.72-7.70(m, 1H), 7.65-7.62(m, 2H), 7.61-7.46(m, 7H), 7.34-7.25(m, 2H) | 534.18 | 534.17 |
| 25 | 8.85-8.81(m, 2H), 8.61-8.57(m, 2H), 8.36-8.17(m, 7H), 7.96(s, 1H), 7.92-7.89(m, 3H), 7.72-7.70(m, 1H), 7.64-7.58(m, 2H), 7.58-7.47(m, 6H), 7.31-7.26(m, 2H) | 574.24 | 574.20 |
| 34 | 8.86-8.78(m, 7H), 8.54-8.52(m, 1H), 8.39(s, 1H), 8.11-8.09(m, 1H), 7.99-7.90(m, 3H), 7.78-7.70(m, 3H), 7.64-7.53(m, 7H), 7.52-7.38(m, 6H) | 651.22 | 651.23 |
| 49 | 8.85-8.80(m, 2H), 8.28(s, 1H), 8.20-8.17(m, 1H), 7.95-7.91(m, 4H), 7.72-7.70(m, 1H), 7.69-7.47(m, 12H), 7.45-7.39(m, 4H) | 544.17 | 544.16 |
| 68 | 8.92-8.82(m, 2H), 8.65-8.63(m, 2H), 8.37(S, 1H), 8.07-8.02(m, 3H), 7.96-7.82(m, 6H), 7.78-7.73(m, 4H), 7.64-7.51(m, 6H), 7.14-7.09(m, 2H) | 598.18 | 598.20 |
| 73 | 8.92-8.90(m, 1H), 8.85-8.82(m, 1H), 8.37(s, 1H), 8.07-8.05(m, 1H), 7.92-7.83(m, 6H), 7.81-7.73(m, 3H), 7.64-7.46(m, 6H), 7.41-7.29(m, 5H) | 520.19 | 520.18 |
| 96 | 8.85-8.80(m, 2H), 8.51(s, 1H), 8.25-8.23(m, 1H), 8.10-8.09(m, 1H), 7.95-7.86(m, 4H), 7.82-7.77(m, 4H), 7.72-7.69(m, 2H), 7.64-7.46(m, 9H), 7.41-7.28(m, 4H) | 596.20 | 596.21 |
| H9 | 8.26 (d, 1H), 8.07 (d, H), 8.04-7.93 (m, 7H), 7.87 (d, 2H), 7.74-7.70 (m, 2H), 7.67 (dd, 1H), 7.61-7.49 (m, 4H), 7.47 (d, 2H), 7.38-7.34 (m, 2H), 7.27-7.19 (m, 4H) | 507.2 | 506.2 |
| H45 | 8.08 (d, 1H), 7.75 (d, 2H), 7.68 (d, 2H), 7.65-7.52 (m, 11H), 7.42 (dt, 1H), 7.40 (dt, 1H), 7.31 (dd, 2H), 7.24-7.20 (m, 4) | 457.2 | 456.19 |
| H60 | 8.05 (d, 2H), 7.76-7.55 (m, 12H), 7.45 (dt, 2H), 7.39-7.28 (m, 6H), 7.26-7.18 (m, 4H), 1.66 (s, 6H) | 573.3 | 572.25 |
| HT1 | 8.24-8.22(m, 1H), 8.16-8.14(m, 1H), 7.78-7.73(m, 2H), 7.67-7.61(m, 3H), 7.58-7.54(m, 3H), 7.53-7.47(m, 6H), 7.46-7.26(m, 7H), 7.21-7.09(m, 3H), 6.71-6.68(m, 1H), 6.58-6.50(m, 4H), 6.42-6.40(m, 1H), 1.61(s, 6H) | 678.29 | 678.30 |
| HT3 | 8.24-8.22(m, 1H), 8.16-8.14(m, 1H), 7.86-7.84(m, 1H), 7.76-7.73(m, 1H), 7.67-7.61(m, 3H), 7.58-7.54(m, 3H), 7.53-7.48(m, 6H), 7.47-7.43(m, 3H), 7.42-7.35(m, 2H), 7.33-7.26(m, 2H), 7.21-7.15(m, 6H), 7.14-7.06(m, 6H), 6.81-6.78(m, 1H), 6.72-6.69(m, 1H), 6.58-6.54(m, 2H), 6.53-6.49(m, 2H), 6.42-6.41(m, 1H) | 802.32 | 802.33 |
| HT7 | 8.22-8.20(m, 1H), 7.82-7.81(m, 1H), 7.78-7.75(m, 1H), 7.65-7.61(m, 2H), 7.58-7.56(m, 1H), 7.53-7.46(m, 7H), 7.45-7.43(m, 1H), 7.42-7.22(m, 7H), 7.14-7.09(m, 2H), 6.96-6.93(m, 1H), 6.76-6.73(m, 1H), 6.59-6.56(m, 2H), 6.52-6.51(m, 1H), 1.61(s, 6H) | 602.25 | 602.27 |
| HT28 | 8.24-8.22(m, 1H), 8.15-8.14(m, 1H), 7.80-7.71(m, 4H), 7.67-7.64(m, 2H), 7.59-7.46(m, 8H), 7.45-7.41(m, 1H), 7.39-7.26(m, 4H), 7.21-7.18(m, 1H), 7.12-7.09(m, 2H), 7.05-7.04(m, 1H), 6.99-6.97(m, 1H), 6.89-6.87(m, 1H), 6.70-6.66(m, 2H), 6.53-6.52(m, 1H), 1.61(s, 6H) | 692.27 | 692.28 |
| HT30 | 8.24-8.22(m, 1H), 8.15-8.14(m, 1H), 7.84-7.81(m, 1H), 7.78-7.71(m, 4H), 7.67-7.64(m, 1H), 7.59-7.55(m, 3H), 7.54-7.52(m, 1H), 7.51-7.50(m, 1H), 7.44-7.40(m, 1H), 7.39-7.27(m, 5H), 7.20-7.18(m, 1H), 7.14-7.04(m, 4H), 7.00-6.97(m, 1H), 6.76-6.73(m, 1H), 6.63-6.60(m, 2H), 6.52-6.51(m, 1H), 1.61(s, 6H) | 710.26 | 710.27 |
| HT33 | 8.24-8.22(m, 1H), 8.15-8.14(m, 1H), 7.87-7.81(m, 2H), 7.76-7.71(m, 2H), 7.67-7.64(m, 1H), 7.59-7.56(m, 2H), 7.55-7.52(m, 1H), 7.51-7.45(m, 6H), 7.44-7.39(m, 3H), 7.35-7.25(m, 3H), 7.23-7.20(m, 1H), 7.19-7.15(m, 5H), 7.14-7.09(m, 4H), 7.09-7.06(m, 2H), 7.01-6.97(m, 1H), 6.81-6.78(m, 1H), 6.71-6.68(m, 1H), 6.63-6.62(m, 1H), 6.61-6.60(m, 1H), 6.58-6.57(m, 1H) | 816.30 | 816.31 | minutes respectively, and cleaned by exposure to ultraviolet rays with ozone for 30 minutes. Then, the resulting glass substrate was mounted into a vacuum-deposition apparatus.

2-TNATA was vacuum-deposited on the obtained ITO anode to form a hole injection layer having a thickness of 600 Å, and 4,4'-bis[N-(1-naphthyl)-N-phenylan amino group]biphenyl (NPB) was vacuum-deposited on the hole injection layer to form a hole transport layer having a thickness of 300 Å.

Compound 2 was deposited on the emission layer to form an electron transport layer having a thickness of 300 Å, LiF was deposited on the electron transport layer to form an electron injection layer having a thickness of 10 Å, and Al was vacuum-deposited on the electron injection layer to form a LiF/Al electrode (a cathode) having a thickness of 3000 Å, thereby completing the manufacture of an organic light-emitting device.

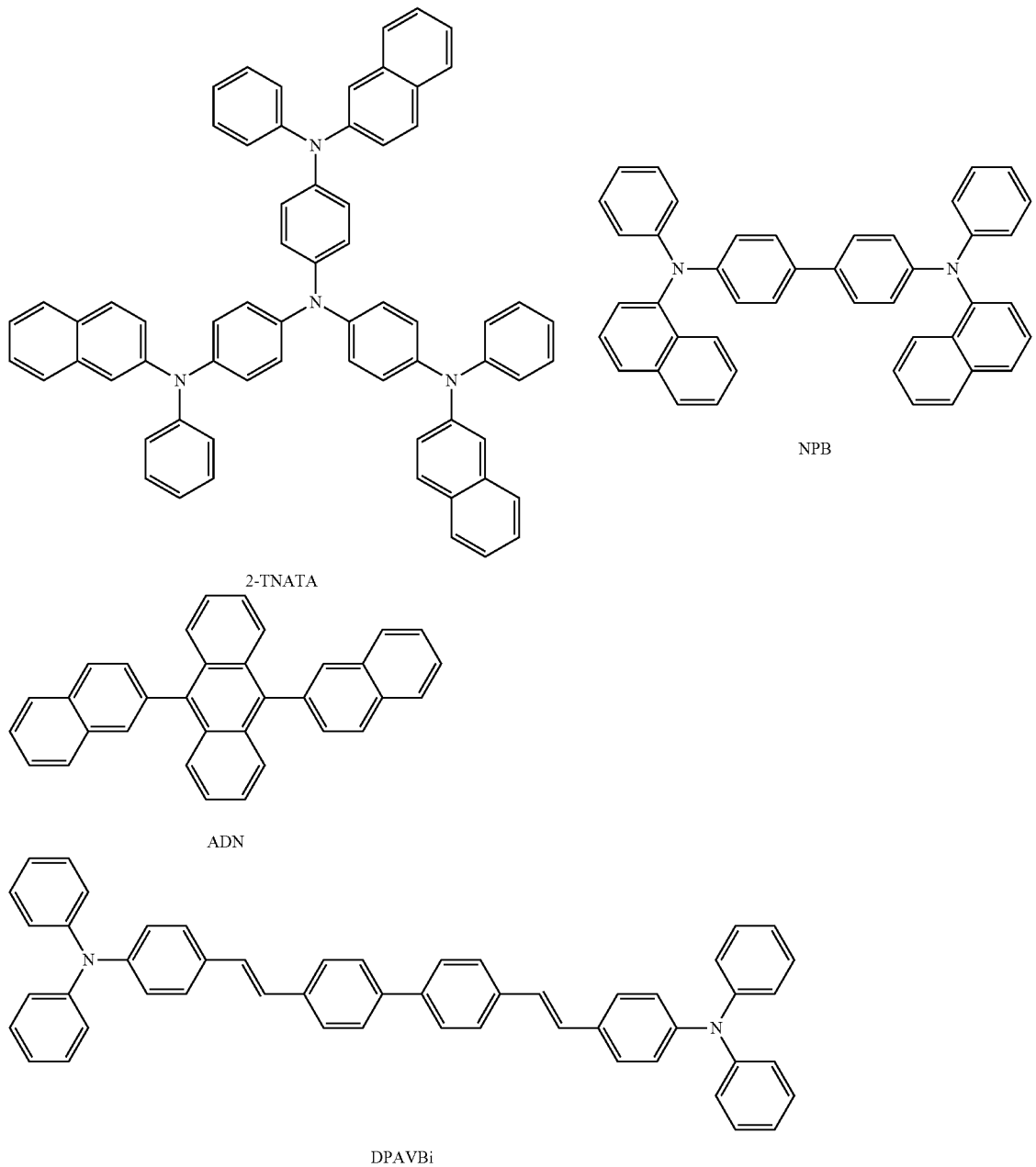

9,10-di-naphthalene-2-yl-anthracene (ADN), as a blue fluorescent host, and 4,4'-bis[2-(4-(N,N-diphenylamino)phenyl)vinyl]biphenyl (DPAVBi), as a blue fluorescent dopant, were co-deposited on the hole transport layer at a weight ratio of 98:2 to form an emission layer having a thickness of 300 Å.

Example 2

An organic light-emitting device was manufactured in the same (or substantially the same) manner as in Example 1, except that Compound 9 was used instead of Compound 2 in the formation of the electron transport layer.

Example 3

An organic light-emitting device was manufactured in the same (or substantially the same) manner as in Example 1, except that Compound 25 was used instead of Compound 2 in the formation of the electron transport layer.

Example 4

An organic light-emitting device was manufactured in the same (or substantially the same) manner as in Example 1, except that Compound 34 was used instead of Compound 2 in the formation of the electron transport layer.

Example 5

An organic light-emitting device was manufactured in the same (or substantially the same) manner as in Example 1, except that Compound 49 was used instead of Compound 2 in the formation of the electron transport layer.

Example 6

An organic light-emitting device was manufactured in the same (or substantially the same) manner as in Example 1, except that Compound 68 was used instead of Compound 2 in the formation of the electron transport layer.

Example 7

An organic light-emitting device was manufactured in the same (or substantially the same) manner as in Example 1, except that Compound 73 was used instead of Compound 2 in the formation of the electron transport layer.

Example 8

An organic light-emitting device was manufactured in the same (or substantially the same) manner as in Example 1, except that Compound 96 was used instead of Compound 2 in the formation of the electron transport layer.

Comparative Example 1

An organic light-emitting device was manufactured in the same (or substantially the same) manner as in Example 1, except that Alq3 was used instead of Compound 2 in the formation of the electron transport layer. The organic light-emitting device emitted blue light with a current density of a driving voltage of 7.35 V, a luminance of 2,065 cd/m2, and a current efficiency of 4.13 cd/A at a current density of 50 mA/cm2, and had a luminance half-life of 145 hours at a current density of 100 mA/cm2.

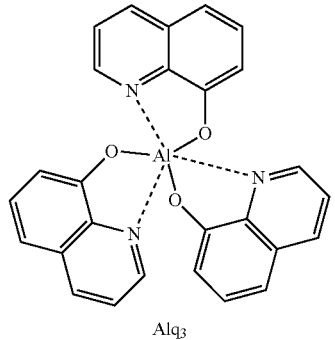

Alq$_3$

The results of evaluating the devices prepared in Examples 1 to 8 and Comparative Example 1 are shown in Table 2.

TABLE 2

| | Electron transport material | Driving voltage (V) | Current density (mA/cm$^2$) | Luminance (cd/m$^2$) | Efficiency (cd/A) | Emission color | Half lifespan (hr @ 100 mA/cm$^2$) |
|---|---|---|---|---|---|---|---|
| Example 1 | Compound 2 | 5.60 | 50 | 3,180 | 6.36 | blue | 283 hr |
| Example 2 | Compound 9 | 5.93 | 50 | 3,030 | 6.06 | blue | 336 hr |
| Example 3 | Compound 25 | 5.73 | 50 | 3,065 | 6.13 | blue | 305 hr |
| Example 4 | Compound 34 | 5.68 | 50 | 3,160 | 6.32 | blue | 298 hr |
| Example 5 | Compound 49 | 6.12 | 50 | 3,010 | 6.02 | blue | 359 hr |
| Example 6 | Compound 68 | 5.54 | 50 | 3,220 | 6.44 | blue | 312 hr |
| Example 7 | Compound 73 | 5.85 | 50 | 3,135 | 6.27 | blue | 291 hr |
| Example 8 | Compound 96 | 6.07 | 50 | 3,105 | 6.21 | blue | 273 hr |
| Comparative Example 1 | Alq$_3$ | 7.35 | 50 | 2,065 | 4.13 | blue | 145 hr |

Example 9

An organic light-emitting device was manufactured in the same (or substantially the same) manner as in Example 1, except that Compound H9 of Formula 3 was used as a host in the emission layer instead of ADN.

Example 10

An organic light-emitting device was manufactured in the same (or substantially the same) manner as in Example 9, except that Compound 49 was used instead of Compound 2 in the formation of the electron transport layer.

Example 11

An organic light-emitting device was manufactured in the same (or substantially the same) manner as in Example 9, except that Compound 68 was used instead of Compound 2 in the formation of the electron transport layer.

Example 12

An organic light-emitting device was manufactured in the same (or substantially the same) manner as in Example 9, except that Compound H45 was used instead of Compound H9 as a host in the emission layer, and that Compound 9 was included in the electron transport layer instead of Compound 2.

Example 13

An organic light-emitting device was manufactured in the same (or substantially the same) manner as in Example 12, except that Compound 73 was used instead of Compound 9 in the formation of the electron transport layer.

Example 14

An organic light-emitting device was manufactured in the same (or substantially the same) manner as in Example 9, except that Compound H60 was used instead of Compound H9 as a host of the emission layer in the formation of the emission layer, and that Compound 68 was included in the electron transport layer instead of Compound 2.

Comparative Example 2

An organic light-emitting device was manufactured in the same (or substantially the same) manner as in Example 1, except that Compound H9 of Formula 3 was used instead of ADN as a host in the emission layer, and that Alq3 was included in the electron transport layer instead of Compound 2.

The results of evaluating the devices prepared in Examples 9 to 14 and Comparative Example 2 are shown in Table 3.

Example 15

An organic light-emitting device was manufactured in the same (or substantially the same) manner as in Example 1, except that Compound HT1 of Formula 201A was used instead of NPB in the formation of the hole transport layer.

Example 16

An organic light-emitting device was manufactured in the same (or substantially the same) manner as in Example 15, except that Compound 9 was used instead of Compound 2 in the formation of the hole transport layer.

Example 17

An organic light-emitting device was manufactured in the same (or substantially the same) manner as in Example 15, except that Compound HT3 was used instead of Compound HT1 in the formation of the hole transport layer, and that Compound 20 was included in the electron transport layer instead of Compound 2.

Example 18

An organic light-emitting device was manufactured in the same (or substantially the same) manner as in Example 15, except that Compound HT7 was used instead of Compound HT1 in the formation of the hole transport layer, and that Compound 35 was included in the electron transport layer instead of Compound 2.

Example 19

An organic light-emitting device was manufactured in the same (or substantially the same) manner as in Example 15, except that Compound HT28 was used instead of Compound HT1 in the formation of the hole transport layer, and that Compound 65 was included in the electron transport layer instead of Compound 2.

Example 20

An organic light-emitting device was manufactured in the same (or substantially the same) manner as in Example 15, except that Compound HT30 was used instead of Compound

TABLE 3

| | Host Material | Electron transport material | Driving voltage (V) | Current density (mA/cm$^2$) | Luminance (cd/m$^2$) | Efficiency (cd/A) | Emission color | Half lifespan (hr @ 100 mA/cm$^2$) |
|---|---|---|---|---|---|---|---|---|
| Example 9 | Compound H9 | Compound 2 | 5.43 | 50 | 3,225 | 6.45 | blue | 308 hr |
| Example 10 | Compound H9 | Compound 49 | 6.01 | 50 | 3,055 | 6.11 | blue | 373 hr |
| Example 11 | Compound H9 | Compound 68 | 5.49 | 50 | 3,140 | 6.28 | blue | 321 hr |
| Example 12 | Compound H45 | Compound 9 | 5.75 | 50 | 3,105 | 6.21 | blue | 347 hour |
| Example 13 | Compound H45 | Compound 73 | 5.80 | 50 | 3,205 | 6.41 | blue | 311 hr |
| Example 14 | Compound H60 | Compound 68 | 5.50 | 50 | 3,255 | 6.51 | blue | 336 hr |
| Comparative Example 2 | Compound H9 | Alq$_3$ | 7.02 | 50 | 2,160 | 4.32 | blue | 183 hr |

HT1 in the formation of the hole transport layer, and that Compound 68 was included in the electron transport layer instead of Compound 2.

Example 21

An organic light-emitting device was manufactured in the same (or substantially the same) manner as in Example 15, except that Compound HT33 was used instead of Compound HT1 in the formation of the hole transport layer, and that Compound 77 was included in the electron transport layer instead of Compound 2.

Comparative Example 3

An organic light-emitting device was manufactured in the same (or substantially the same) manner as in Example 15, except that Alq3 was included in the electron transport layer instead of Compound 2.

The results of evaluating the devices prepared in Examples 15 to 21 and Comparative Example 3 are shown in Table 4.

TABLE 4

|  | Hole transport material | Electron transport material | Driving voltage (V) | Current density (mA/cm$^2$) | Luminance (cd/m$^2$) | Efficiency (cd/A) | Emission color | Half lifespan (hr @ 100 mA/cm$^2$) |
|---|---|---|---|---|---|---|---|---|
| Example 15 | Compound HT1 | Compound 2 | 5.25 | 50 | 3320 | 6.64 | blue | 307 hr |
| Example 16 | Compound HT1 | Compound 9 | 5.45 | 50 | 3620 | 7.24 | blue | 340 hr |
| Example 17 | Compound HT3 | Compound 20 | 5.51 | 50 | 3327 | 6.65 | blue | 388 hr |
| Example 18 | Compound HT7 | Compound 35 | 5.38 | 50 | 3419 | 6.84 | blue | 355 hr |
| Example 19 | Compound HT28 | Compound 65 | 5.73 | 50 | 3398 | 6.80 | blue | 371 hr |
| Example 20 | Compound HT30 | Compound 68 | 5.42 | 50 | 3540 | 7.08 | blue | 369 hr |
| Example 21 | Compound HT33 | Compound 77 | 5.69 | 50 | 3503 | 7.01 | blue | 373 hr |
| Comparative Example 3 | Compound HT1 | Alq$_3$ | 6.92 | 50 | 2,482 | 5.4 | blue | 278 hr |

When the compound having a structure of Formula 1 according to embodiments of the present disclosure was used as an electron transport material, driving voltage of the organic light-emitting devices including the compound of Formula 1 (as described in, for example, Examples 1 to 8), decreased about 1 V or more, I-V-L characteristics improved, including a significant improvement in efficiency, and lifespan characteristics of the devices including the compound improved, as compared to those of devices including Alq$_3$ as an electron transport material (as described in, for example, Comparative Example 1). Accordingly, compounds of Formula 1 according to embodiments of the present disclosure may have excellent effect as an electron transport material.

Also, when the compound of Formula 3 is used as a host of the emission layer, along with the electron transport material of Formula 1, efficiency and lifespan of the device may be further improved.

Further, when the compound of Formula 201A is included in the hole transport layer, along with the electron transport material of Formula 1, efficiency and lifespan of the device may be further improved.

As described above, according to one or more example embodiments, an organic light-emitting device may have a high efficiency, low driving voltage, high luminance, and long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:
a first electrode;
a second electrode facing the first electrode; and an organic layer between the first electrode and the second electrode, the organic layer comprising an emission layer, wherein the organic layer further comprises i) a hole transport region between the first electrode and the emission layer, the hole transport region comprising a hole transport layer and at least one selected from a hole injection layer and a buffer layer; and ii) an electron transport region between the emission layer and the second electrode, the electron transport region comprising an electron transport layer and at least one selected from a hole blocking layer and an electron injection layer, wherein the electron transport region comprises a compound represented by Formula 2:

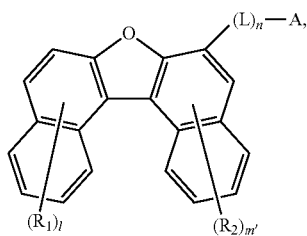

Formula 2 wherein, in Formula 2, $R_1$ and $R_2$ are each independently selected from hydrogen and deuterium;

A is a group represented by one of Formulae 3g and 3h:

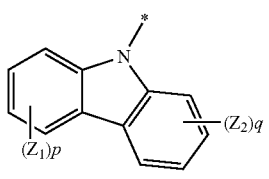

3g

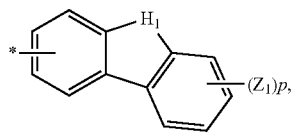

3h wherein, in Formulae 3g and 3h, $H_1$ is $CR_{11}R_{12}$ or $NR_{13}$;

$Z_1$ and $Z_2$ each independently selected from a hydrogen, a deuterium, —F, —Cl, —Br, —I, a hydroxyl group, a cyano group, a nitro group, an amino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, $R_{11}$ to $R_{13}$ are each independently selected from a hydrogen, a deuterium, —F, —Cl, —Br, —I, a hydroxyl group, a cyano group, a nitro group, an amino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, a substituted or unsubstituted $C_6$-$C_{20}$ aryl group, a substituted or unsubstituted monovalent non-aromatic condensed polycyclic group, and a substituted or unsubstituted monovalent non-aromatic condensed heteropolycyclic group, wherein, $R_{11}$ and $R_{12}$ are optionally linked to each other and form a ring;

p in Formulae 3g and 3h is 4, and q in Formula 3g is 4; and

* is a binding site;

L is selected from a single bond, and a group represented by one of Formulae 2a to 2d:

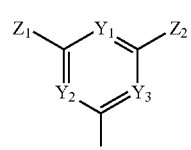

2a

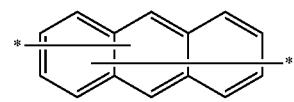

2b

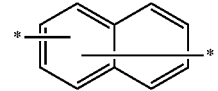

2c

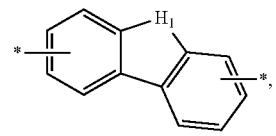

2d wherein, in Formulae 2a to 2d, $Y_1$ to $Y_3$ are each independently —CH— or N;

$H_1$ is $CR_{11}R_{12}$ or $NR_{13}$; and $Z_1$, $Z_2$, and $R_{11}$ to $R_{13}$ are each independently selected from a binding site, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted monovalent non-aromatic condensed polycyclic group, and a substituted or unsubstituted monovalent non-aromatic condensed heteropolycyclic group;

wherein, $R_{11}$ and $R_{12}$ are optionally linked to each other and form a ring; and

* is a binding site;

l and m' are each independently an integer selected from 1 to 6;

n is an integer selected from 1 to 3;

at least one substituent of the substituted $C_1$-$C_{60}$ alkyl group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —PO($Q_{31}$)($Q_{32}$), —SO$_2$($Q_{33}$), and —SO($Q_{34}$);

wherein, $Q_{11}$ to $Q_{17}$, $Q_{21}$ to $Q_{27}$ and $Q_{31}$ to $Q_{34}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein the electron transport layer comprises the compound of Formula 2.

3. The organic light-emitting device of claim 1, wherein the emission layer comprises a compound represented by Formula 3:

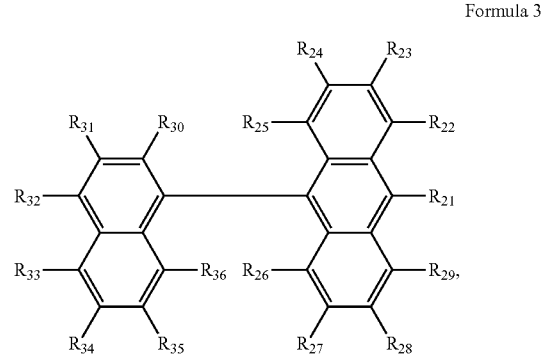

Formula 3 wherein, in Formula 3, $R_{21}$ to $R_{36}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

at least one substituent of the substituted $C_1$-$C_{60}$ alkyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q₁₁)(Q₁₂), —Si(Q₁₃)(Q₁₄)(Q₁₅), and —B(Q₁₆)(Q₁₇);

a C₃-C₁₀ cycloalkyl group, a C₁-C₁₀ heterocycloalkyl group, a C₃-C₁₀ cycloalkenyl group, a C₁-C₁₀ heterocycloalkenyl group, a C₆-C₆₀ aryl group, a C₆-C₆₀ aryloxy group, a C₆-C₆₀ arylthio group, a C₁-C₆₀ heteroaryl group, a monovalent non-aromatic condensed polycyclic group, and a monovalent non-aromatic condensed heteropolycyclic group;

a C₃-C₁₀ cycloalkyl group, a C₁-C₁₀ heterocycloalkyl group, a C₃-C₁₀ cycloalkenyl group, a C₁-C₁₀ heterocycloalkenyl group, a C₆-C₆₀ aryl group, a C₆-C₆₀ aryloxy group, a C₆-C₆₀ arylthio group, a C₁-C₆₀ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C₁-C₆₀ alkyl group, a C₂-C₆₀ alkenyl group, a C₂-C₆₀ alkynyl group, a C₁-C₆₀ alkoxy group, a C₃-C₁₀ cycloalkyl group, a C₁-C₁₀ heterocycloalkyl group, a C₃-C₁₀ cycloalkenyl group, a C₁-C₁₀ heterocycloalkenyl group, a C₆-C₆₀ aryl group, a C₆-C₆₀ aryloxy group, a C₆-C₆₀ arylthio group, a C₁-C₆₀ heteroaryl group, a monovalent non-aromatic condensed polycyclic group, a monovalent non-aromatic condensed heteropolycyclic group, —N(Q₂₁)(Q₂₂), and —B(Q₂₆)(Q₂₇); and —Si(Q₂₃)(Q₂₄)(Q₂₅), wherein Q₁₁ to Q₁₇ and Q₂₁ to Q₂₇ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C₁-C₆₀ alkyl group, a C₂-C₆₀ alkenyl group, a C₂-C₆₀ alkynyl group, a C₁-C₆₀ alkoxy group, a C₃-C₁₀ cycloalkyl group, a C₁-C₁₀ heterocycloalkyl group, a C₃-C₁₀ cycloalkenyl group, a C₁-C₁₀ heterocycloalkenyl group, a C₆-C₆₀ aryl group, a C₁-C₆₀ heteroaryl group, a monovalent non-aromatic condensed polycyclic group, and a monovalent non-aromatic condensed heteropolycyclic group.

4. The organic light-emitting device of claim 3, wherein, in Formula 3, R₂₂, R₂₄ to R₂₉, R₃₀, and R₃₃ to R₃₆ are each independently hydrogen or deuterium.

5. The organic light-emitting device of claim 3, wherein the compound of Formula 3 is used as a host in the emission layer.

6. The organic light-emitting device of claim 3, wherein the compound of Formula 3 is one of Compounds H1 to H78:

H1

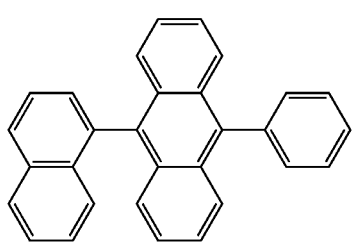

-continued

H2

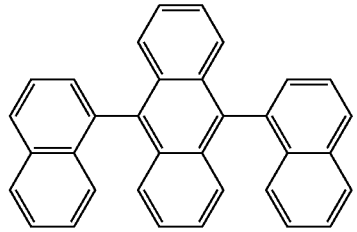

H3

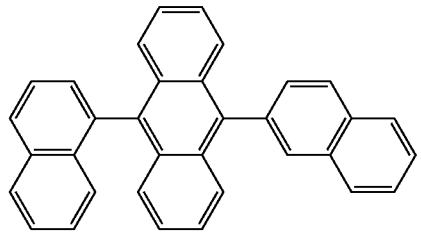

H4

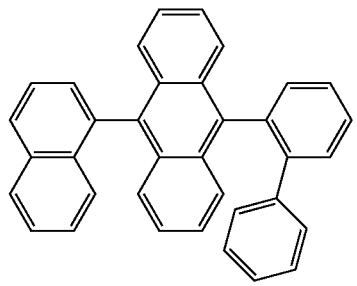

H5

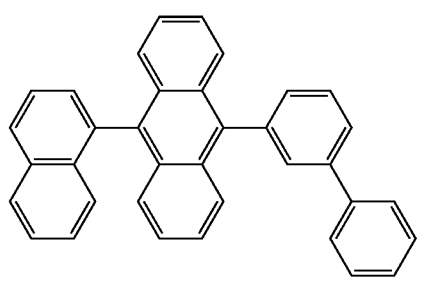

H6

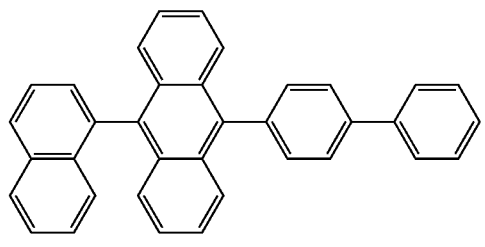

H7

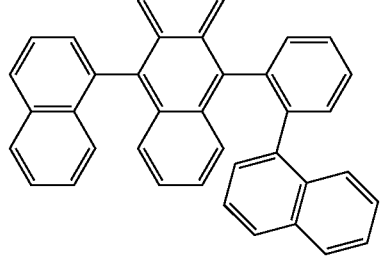

145
-continued
H8
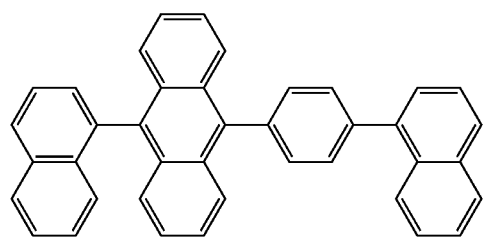
H9
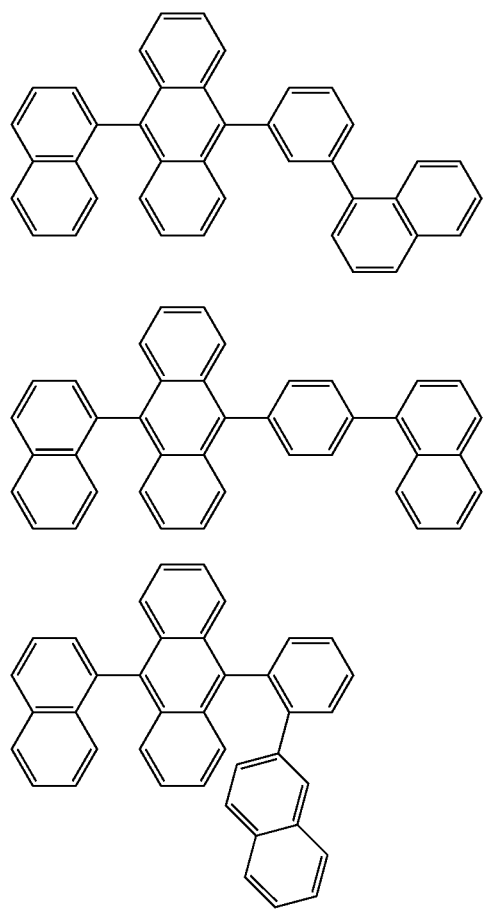
H10
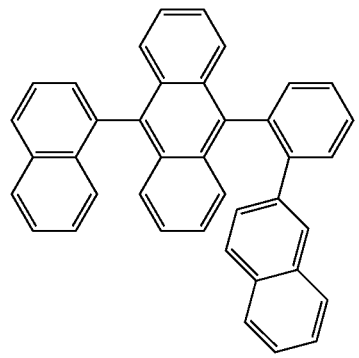
H11
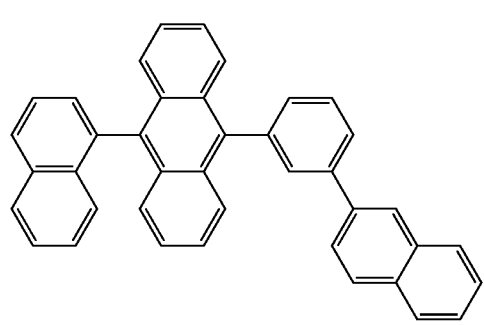
H12
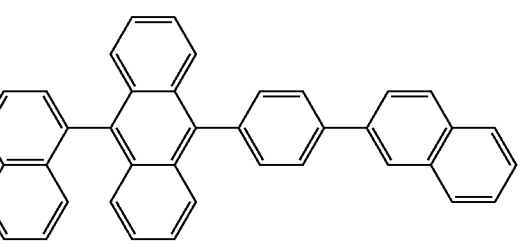
146
-continued
H13
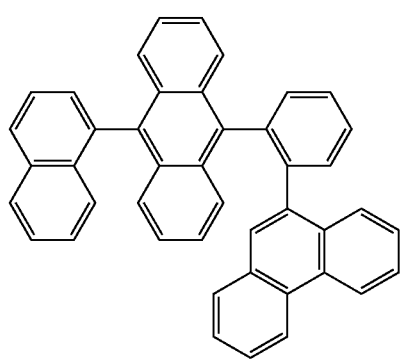
H14
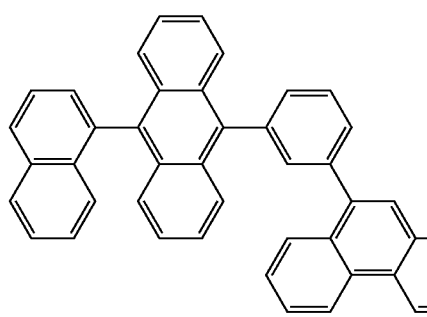
H15
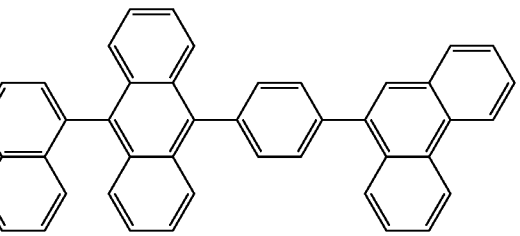
H16
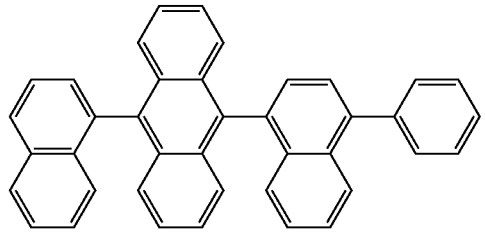
H17
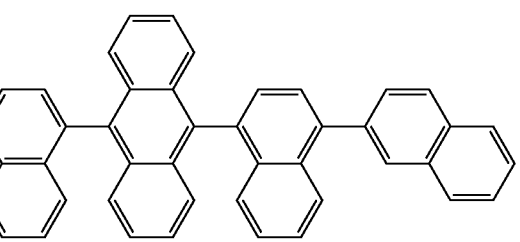

H18
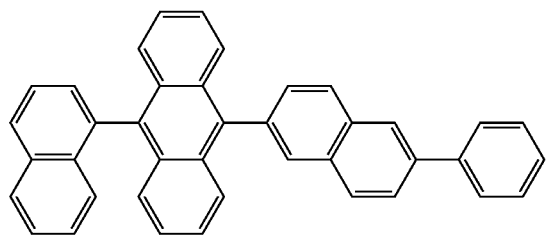
H19
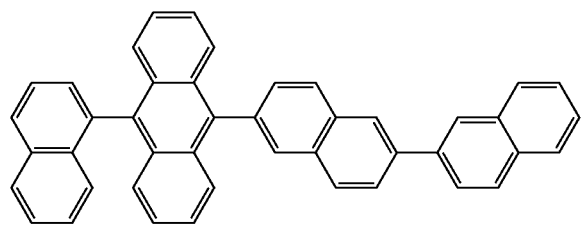
H20
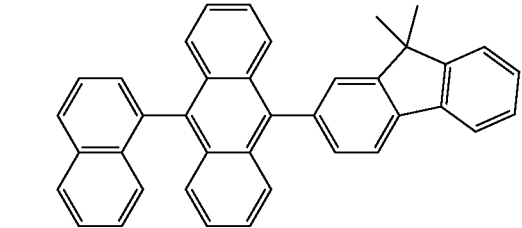
H21
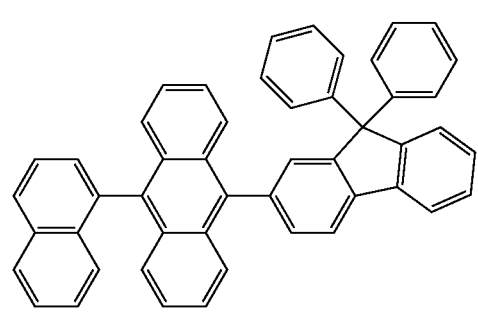
H22
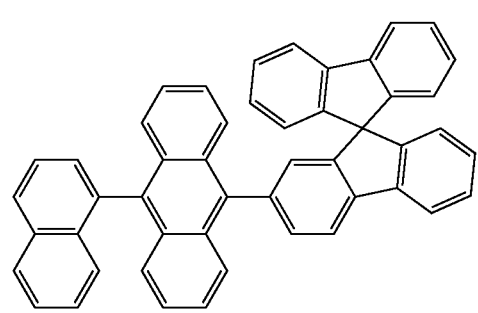
H23
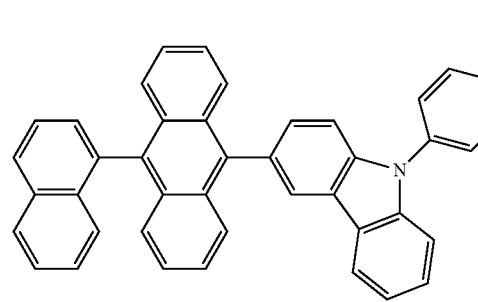
H24
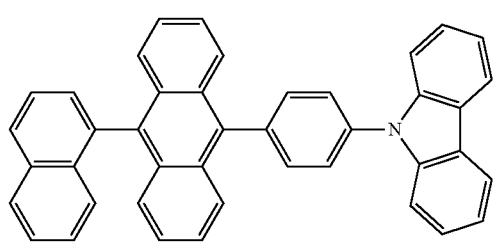
H25
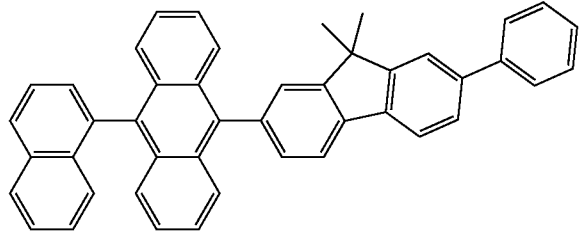
H26
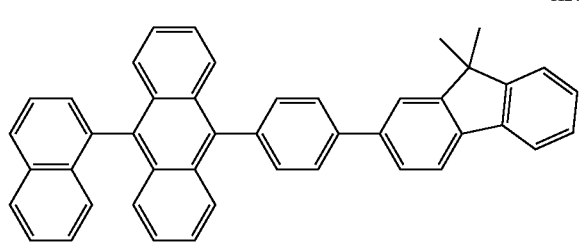
H27
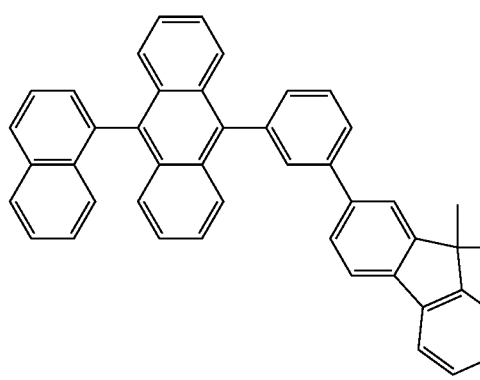
H28
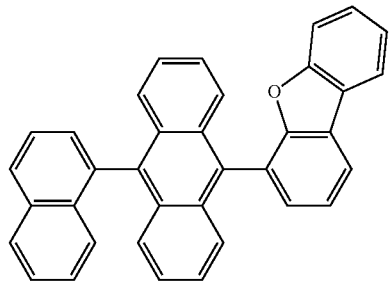

-continued
H29
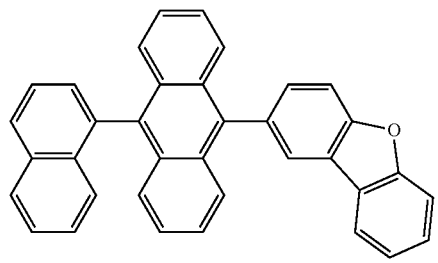
H30
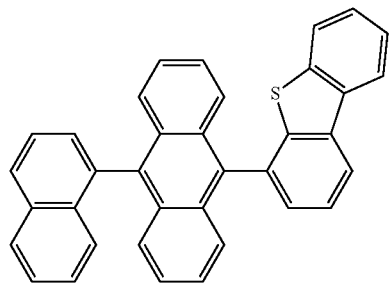
H31
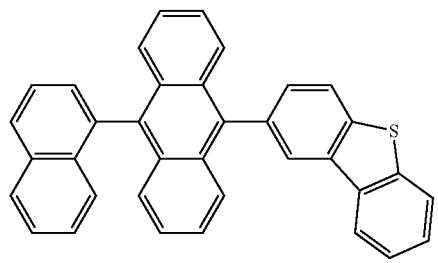
H32
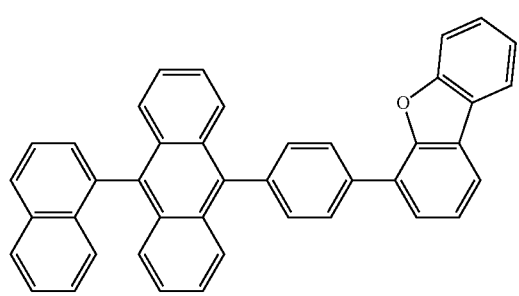
H33
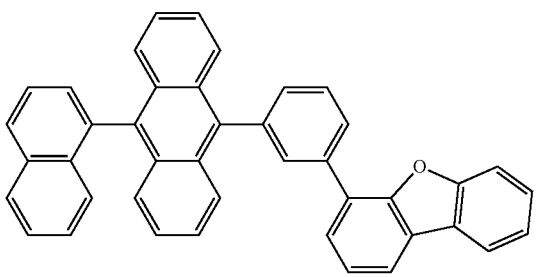
-continued
H34
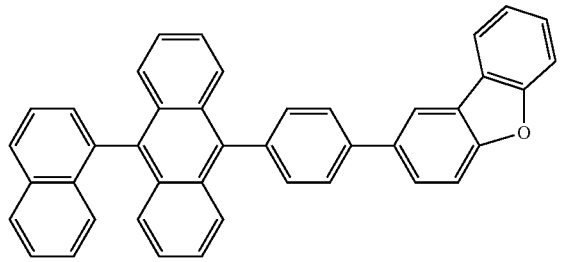
H35
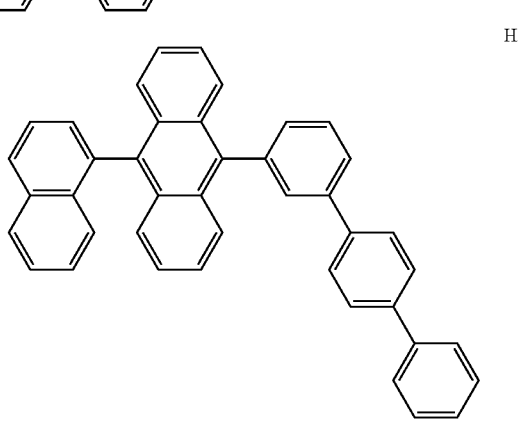
H36
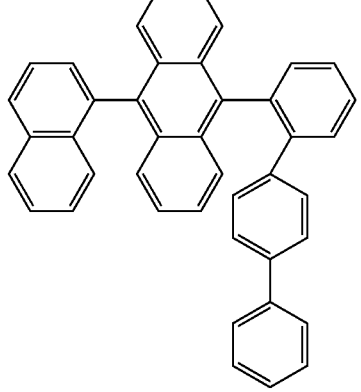
H37
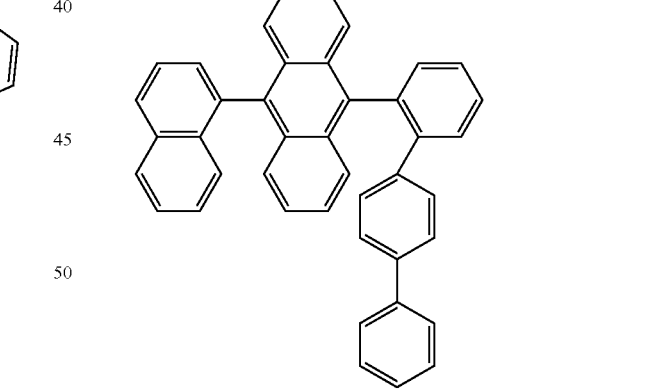
H38
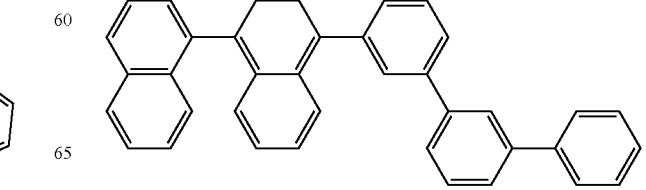

151
-continued
H39
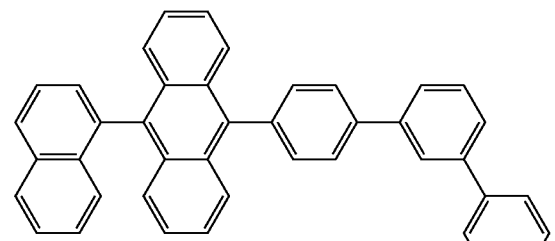
H40
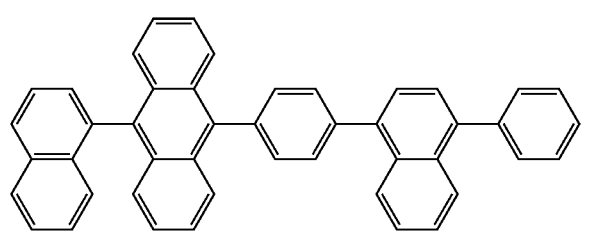
H41
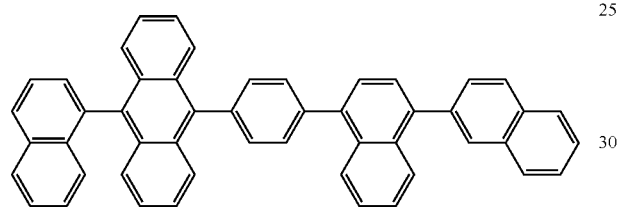
H42
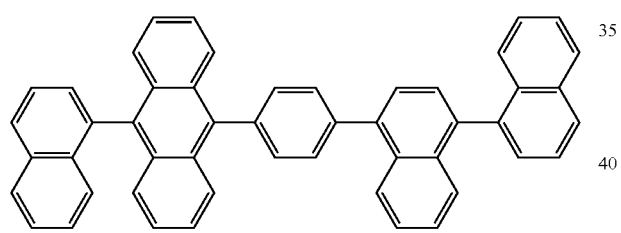
H43
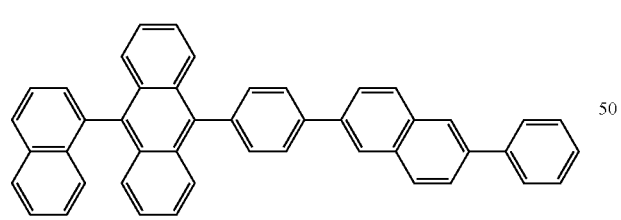
H44
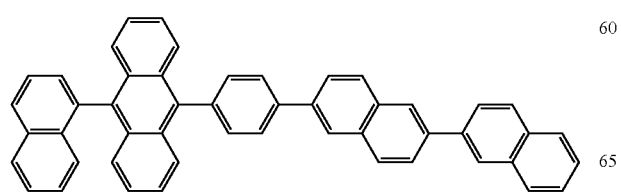
152
-continued
H45
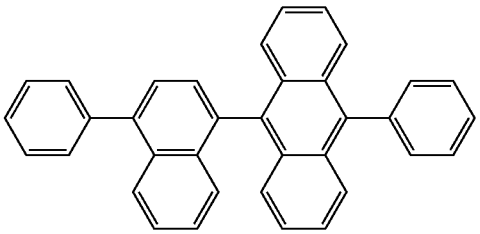
H46
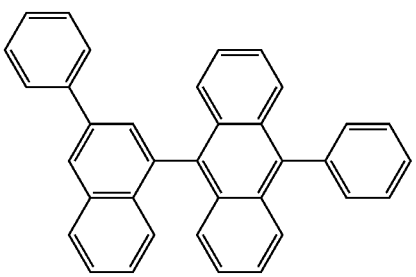
H47
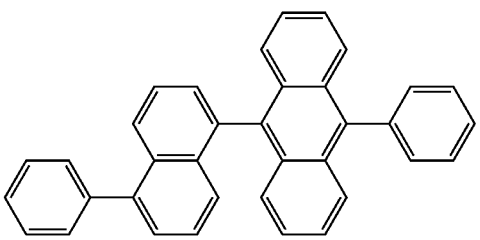
H48
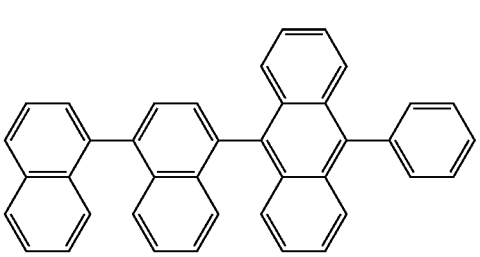
H49
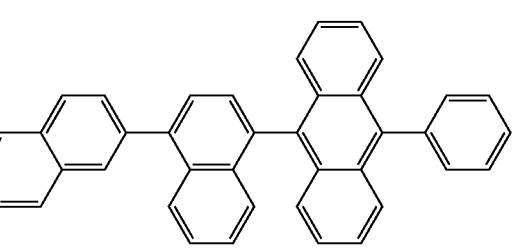
H50
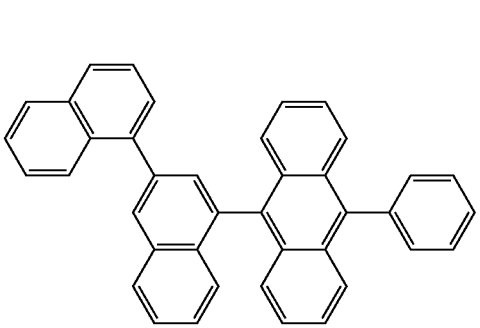

H51
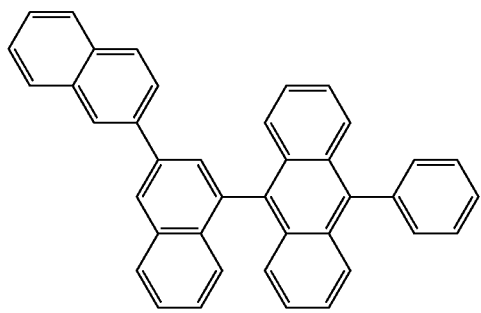
H52
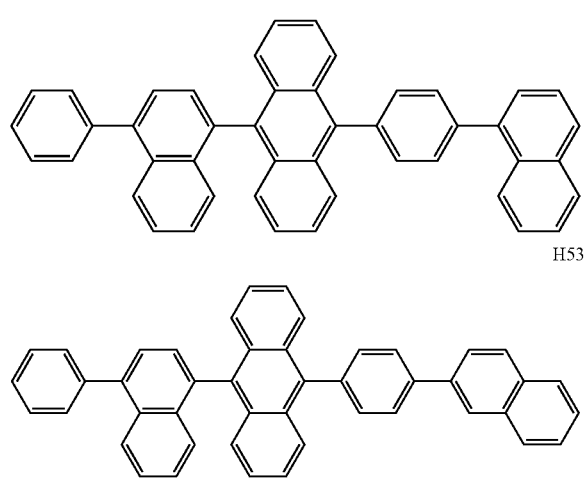
H53
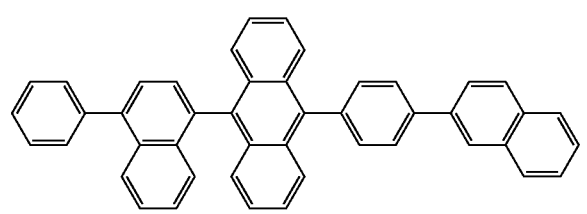
H54
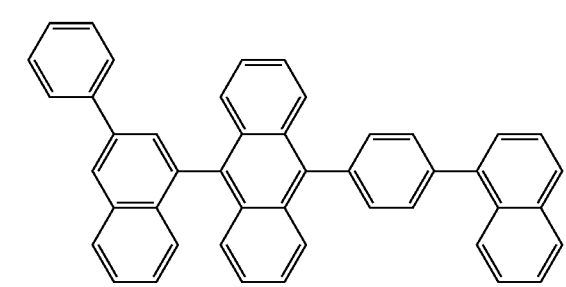
H55
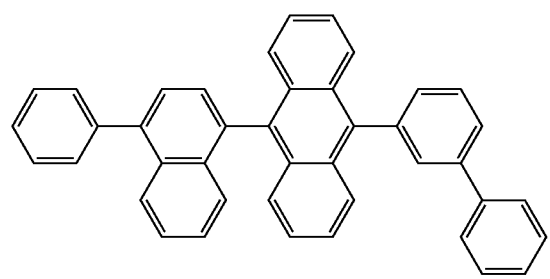
H56
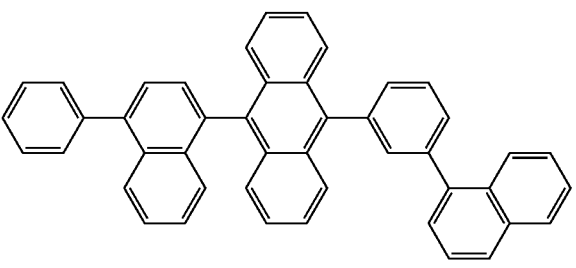
H57
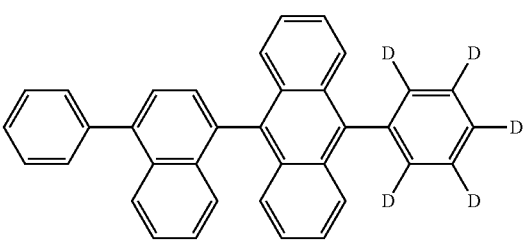
H58
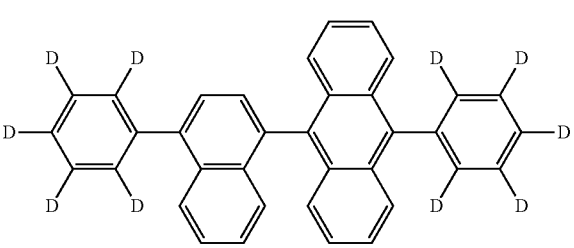
H59
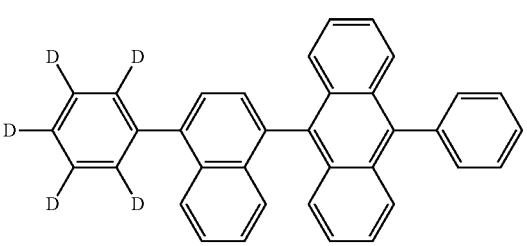
H60
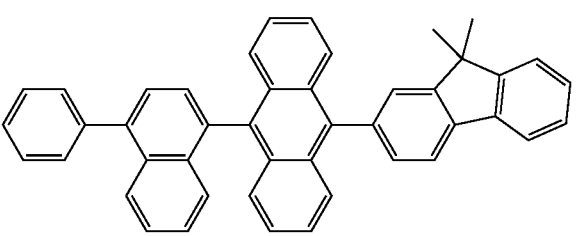
H61
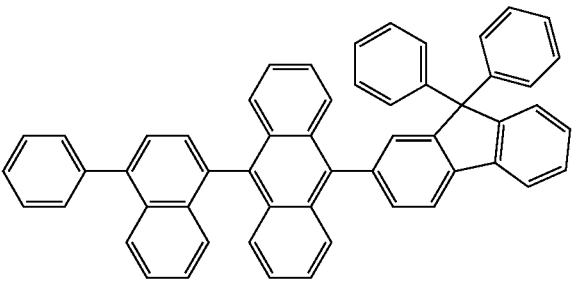

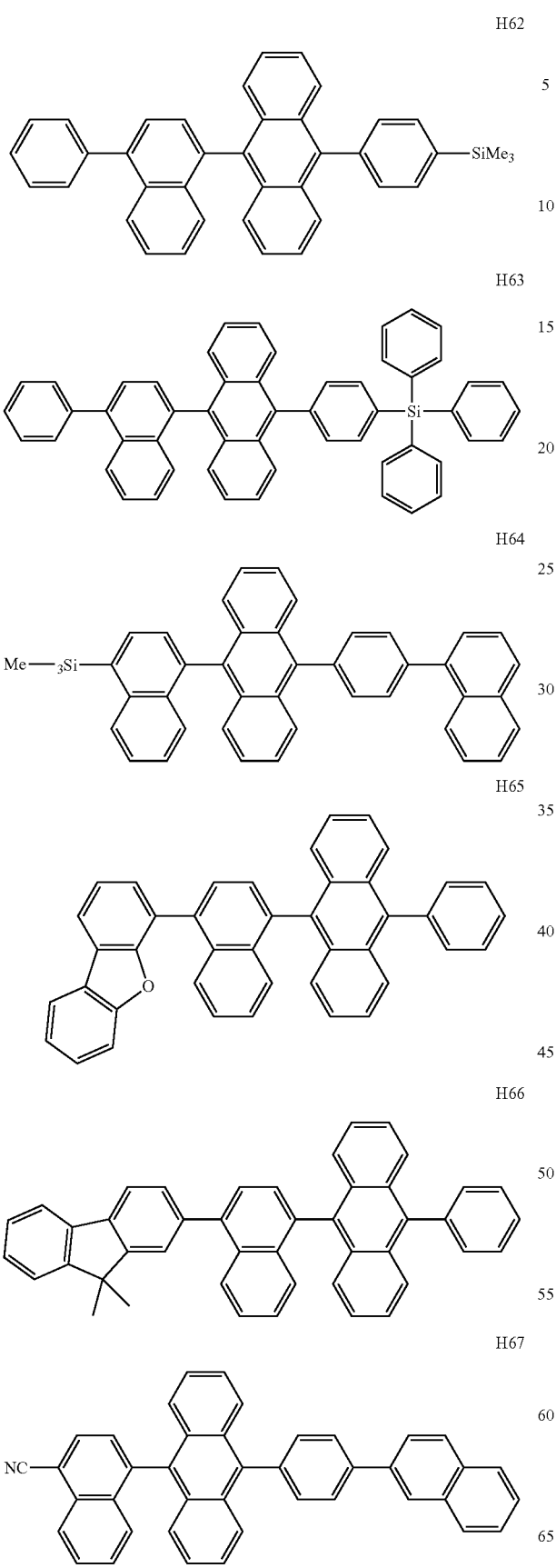

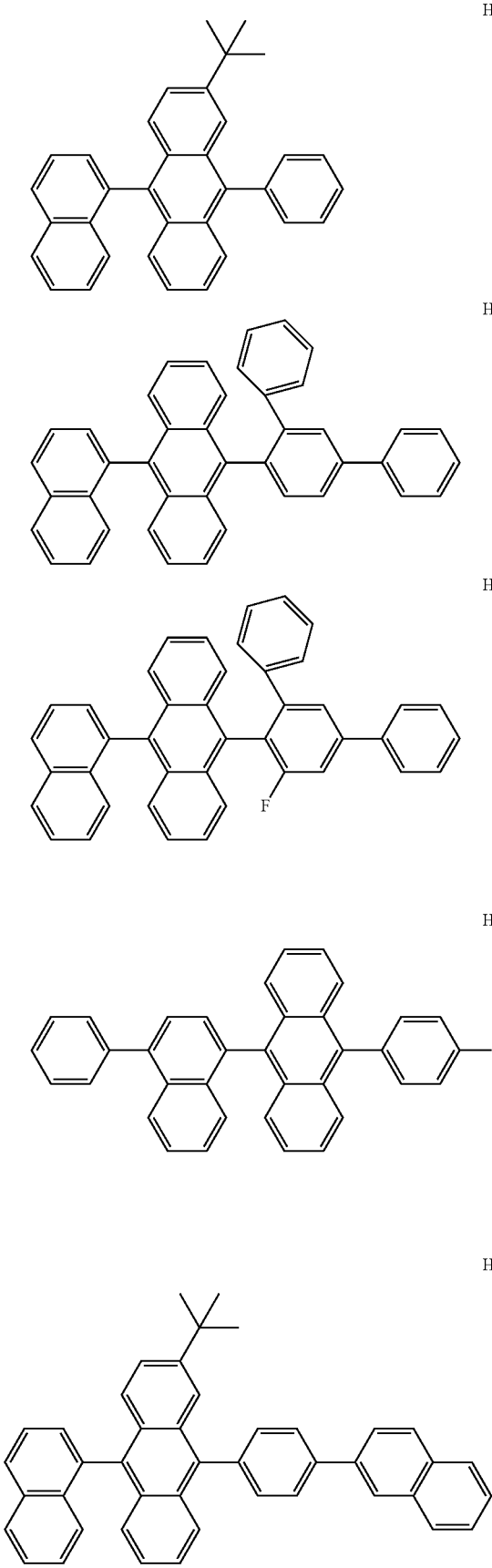

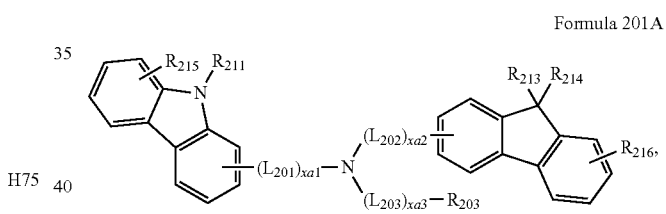

7. The organic light-emitting device of claim 1, wherein the hole transport region comprises a compound represented by Formula 201A:

Formula 201A wherein, in Formula 201A,
$L_{201}$ to $L_{203}$ are each independently selected from:
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 are each independently selected from 0 and 1;

$R_{203}$ and $R_{211}$ are each independently selected from:

a phenyl group, a biphenyl group, a terphenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; wherein $R_{213}$ and $R_{214}$ are optionally linked to each other and form a ring $R_{215}$ and $R_{216}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

8. The organic light-emitting device of claim 7, wherein $R_{211}$ in Formula 201A is a substituted or unsubstituted phenyl group or a substituted or unsubstituted pyridyl group.

9. The organic light-emitting device of claim 7, wherein $R_{213}$ and $R_{214}$ in Formula 201A are each independently a methyl group or a phenyl group.

10. The organic light-emitting device of claim 7, wherein the hole transport layer of the hole transport region comprises the compound of Formula 201A.

11. The organic light-emitting device of claim 7, wherein the compound of Formula 201A is one of Compounds HT1 to HT33:

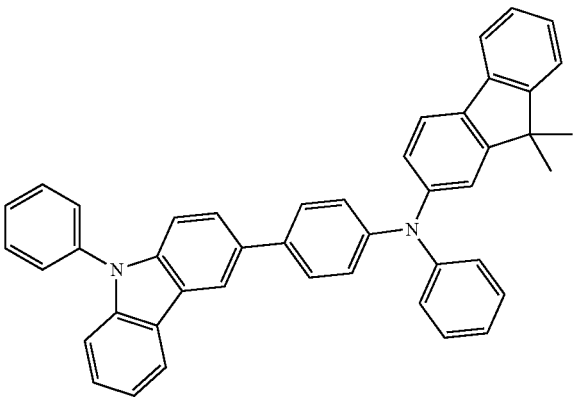

HT2

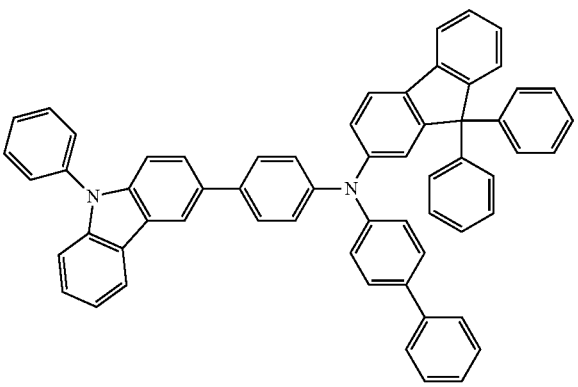

HT3

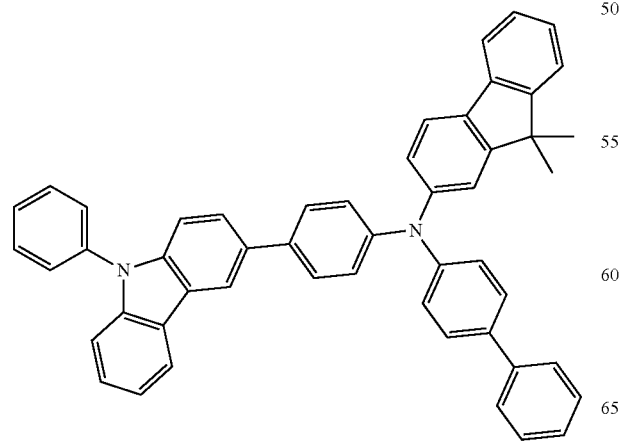

HT1

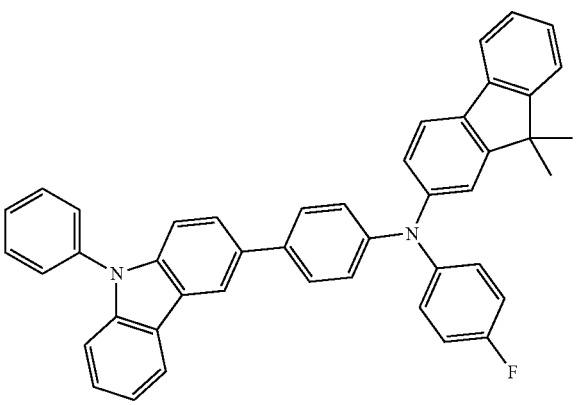

HT4

-continued
HT5
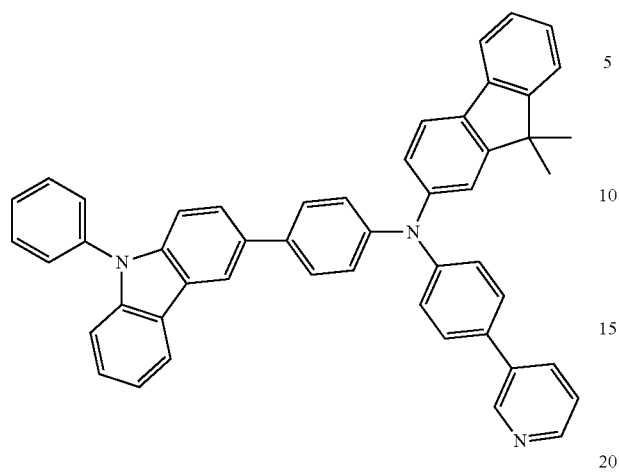
HT6
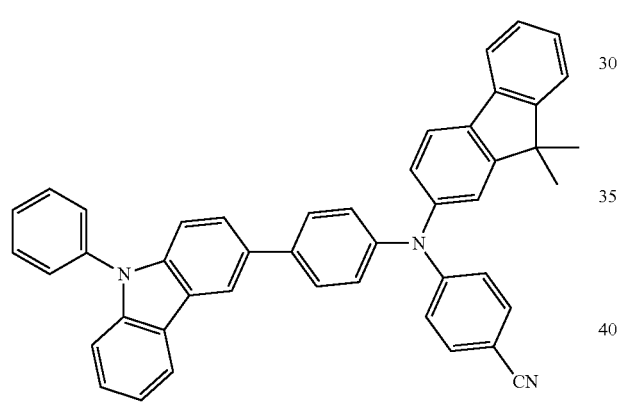
HT7
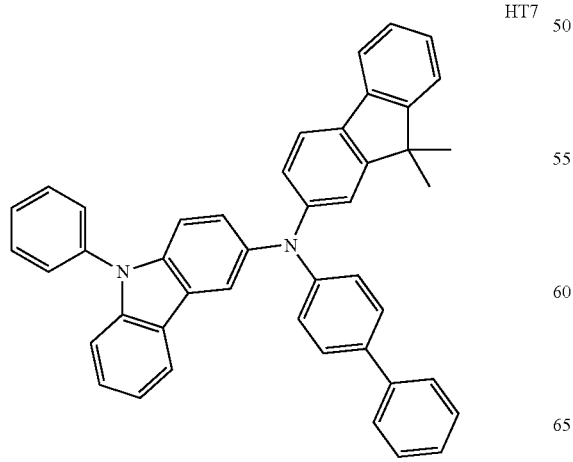
-continued
HT8
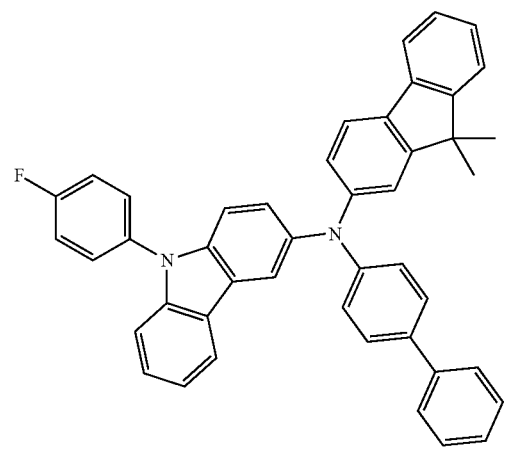
HT9
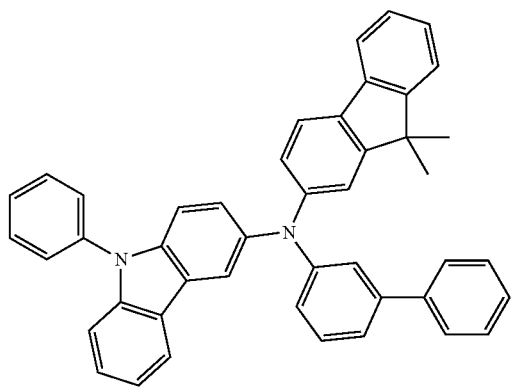
HT10
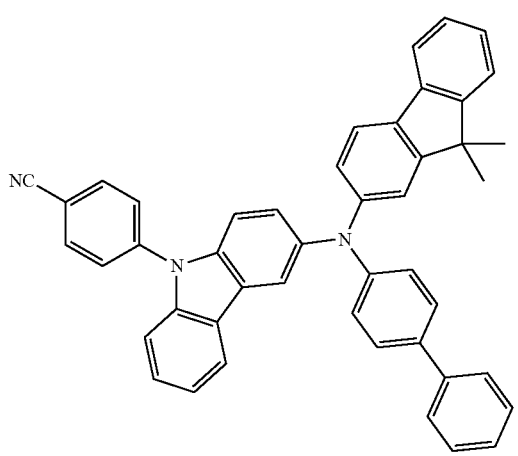

-continued
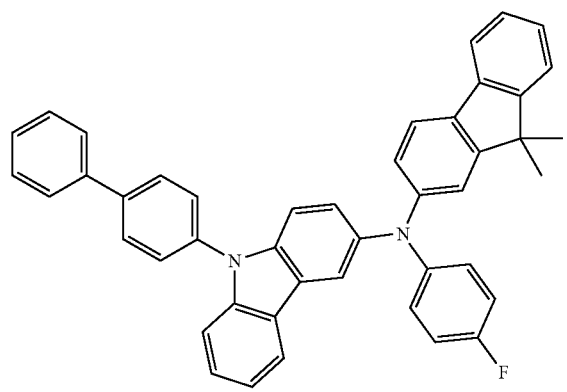
HT11
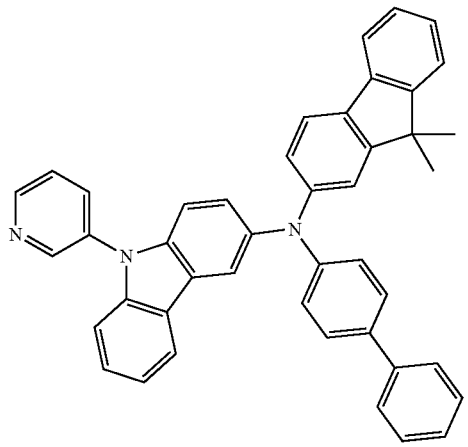
HT14
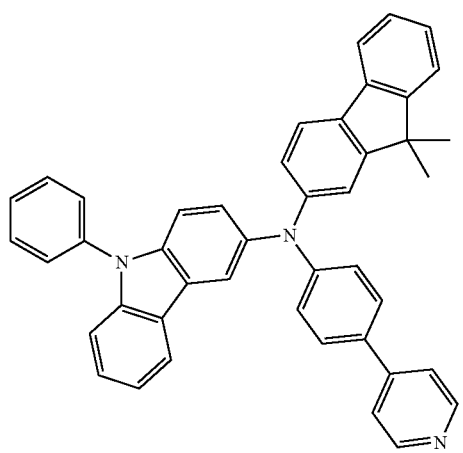
HT12
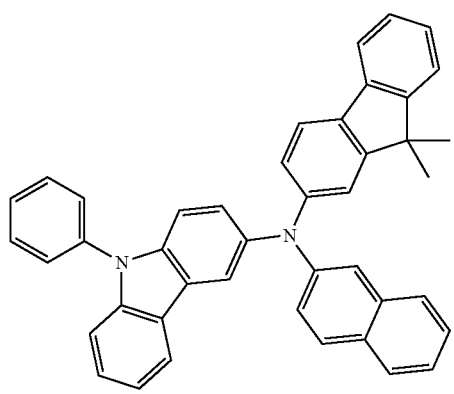
HT13
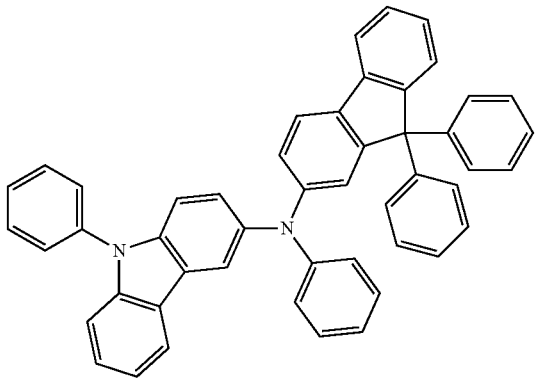
HT16

167
-continued
HT17
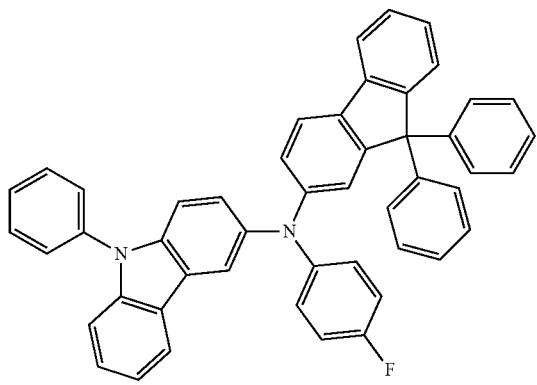
HT18
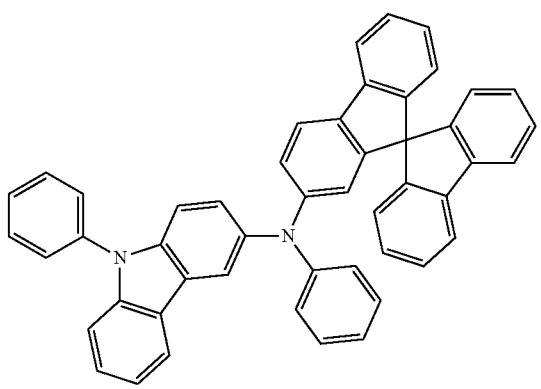
HT19
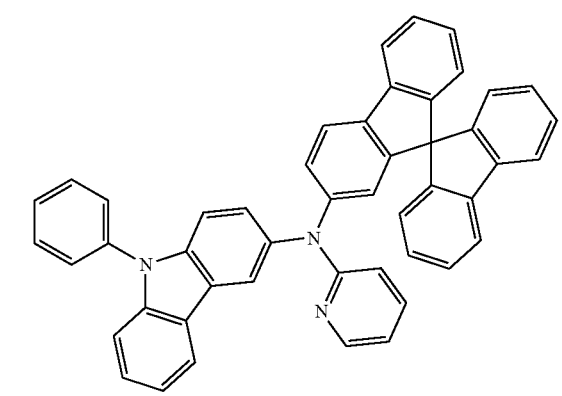
HT20
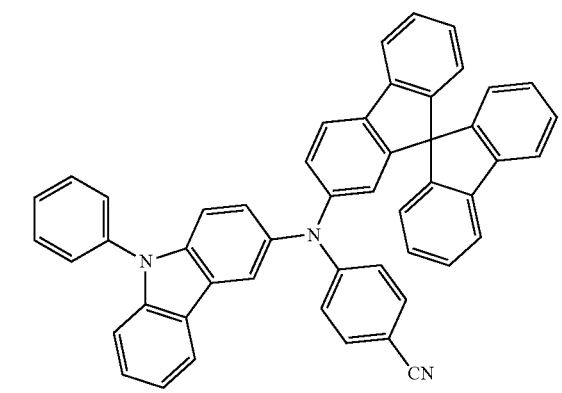
168
-continued
HT21
HT22
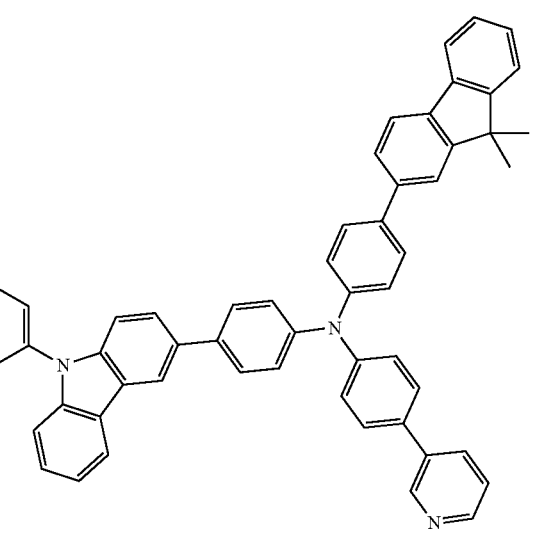
HT23
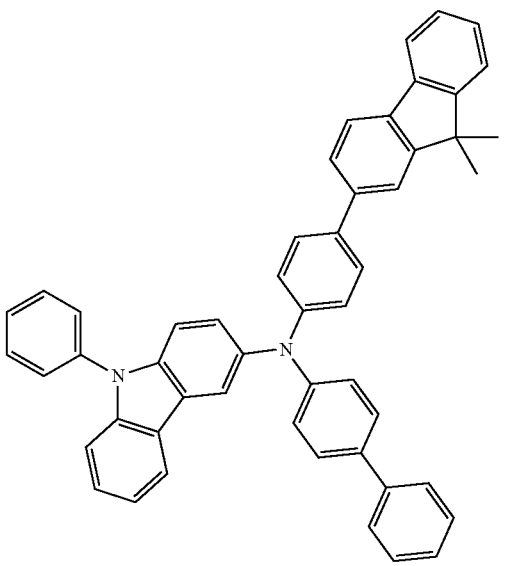

HT24
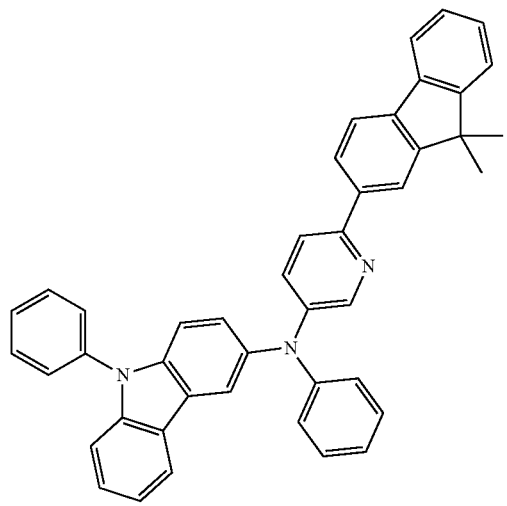
HT27
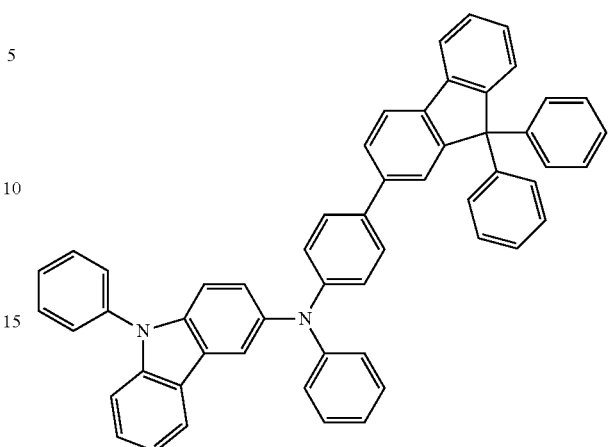
HT25
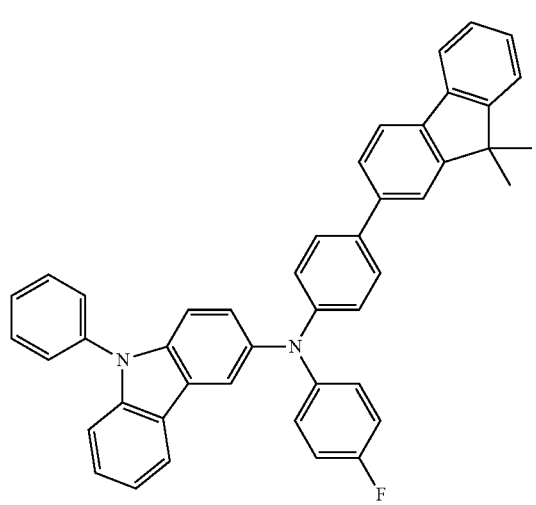
HT28
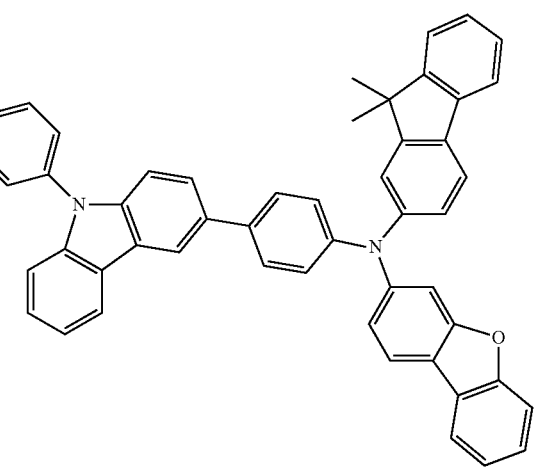
HT26
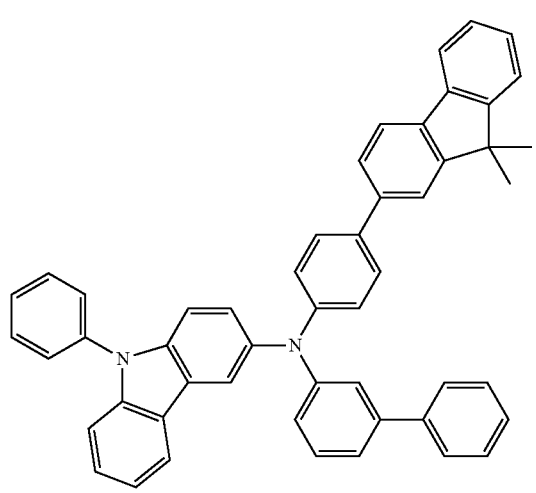
HT29
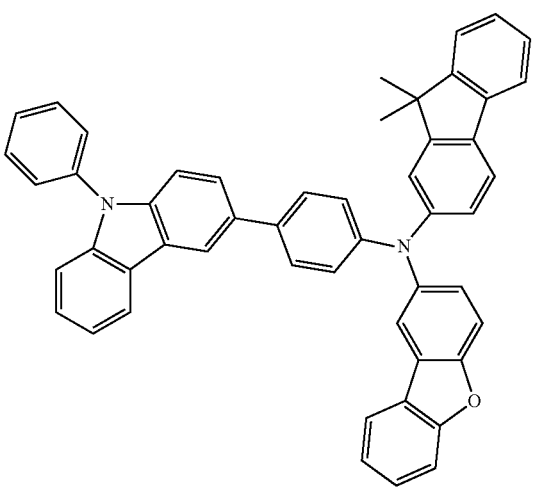

-continued

HT30
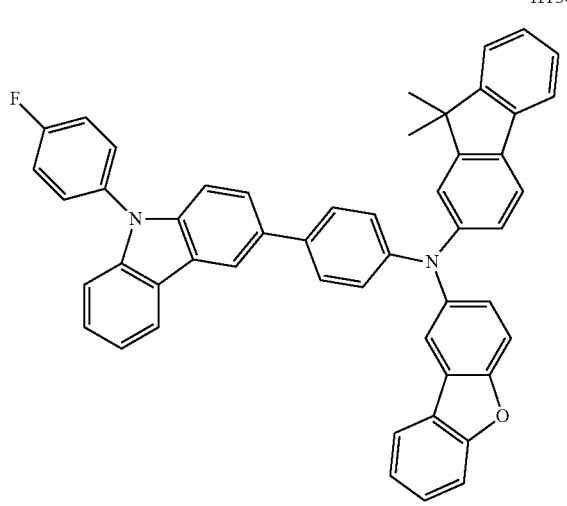

HT31
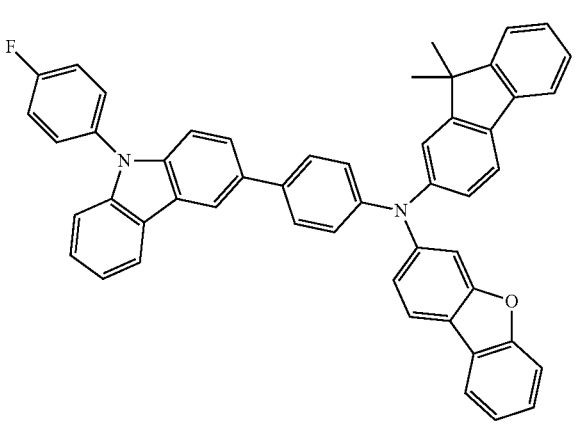

HT32
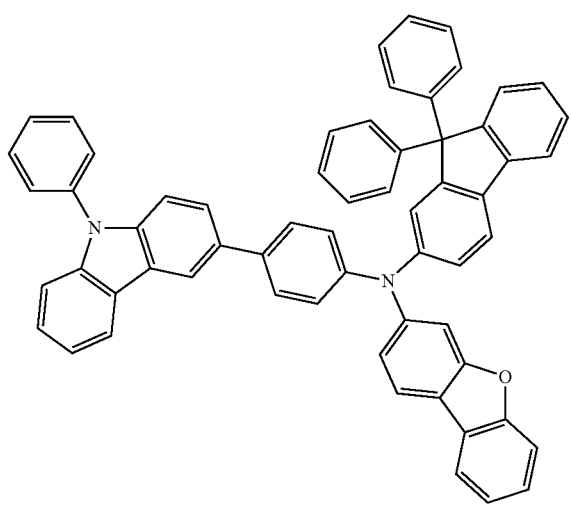

-continued

HT33
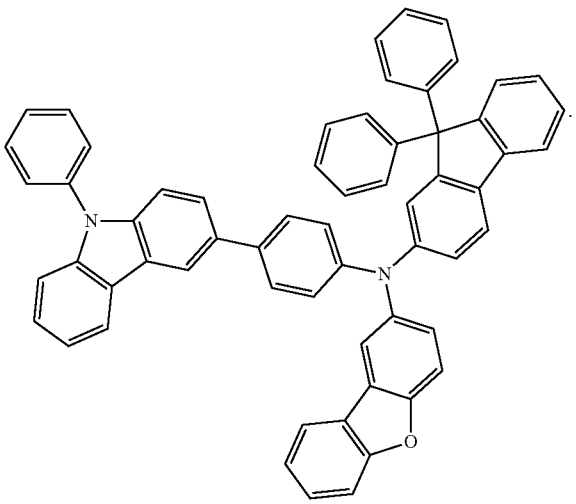

12. The organic light-emitting device of claim 1, wherein the hole transport region comprises a charge-generating material.

13. The organic light-emitting device of claim 1, wherein the electron transport region comprises a metal complex.

14. The organic light-emitting device of claim 1, wherein the electron transport region comprises Compound ET-D1 and/or Compound ET-D2:

ET-D1

ET-D2
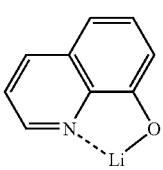

15. A flat display device comprising the organic light-emitting device of claim 1, wherein the first electrode is electrically coupled to a source electrode or drain electrode of a thin film transistor.

16. An organic light-emitting device comprising:
a first electrode;
a second electrode facing the first electrode; and
an organic layer between the first electrode and the second electrode, the organic layer comprising an emission layer,
wherein the organic layer further comprises:
i) a hole transport region between the first electrode and the emission layer, the hole transport region comprising a hole transport layer and at least one selected from a hole injection layer and a buffer layer; and ii) an electron transport region between the emission layer and the second electrode, the electron transport region comprising an electron transport layer and at least one selected from a hole blocking layer and an electron injection layer,
wherein the electron transport region comprises a compound selected from Compounds:
9
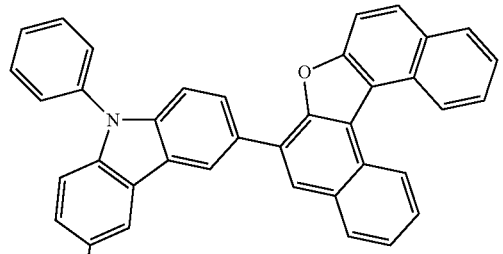
11
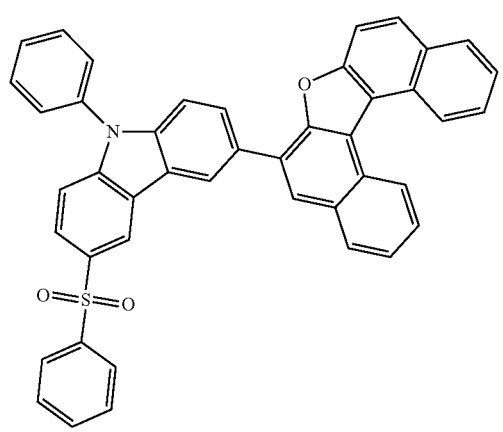
13
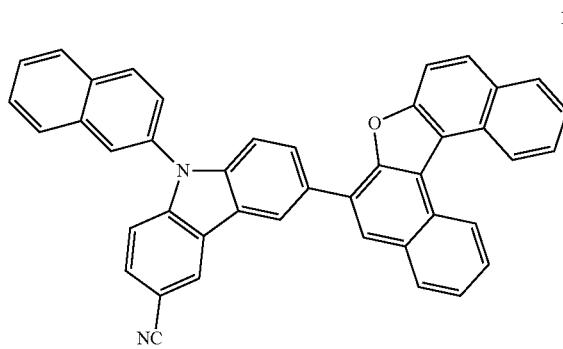
14
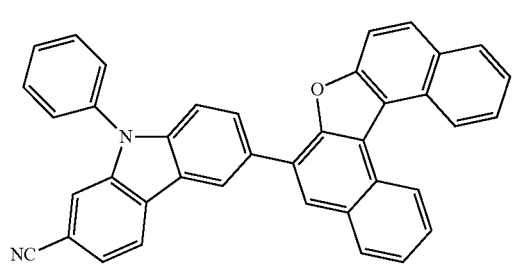
-continued
15
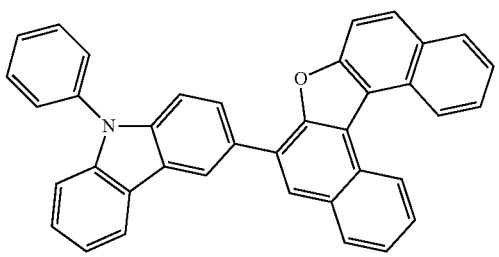
16
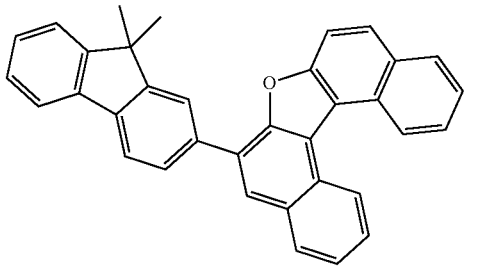
17
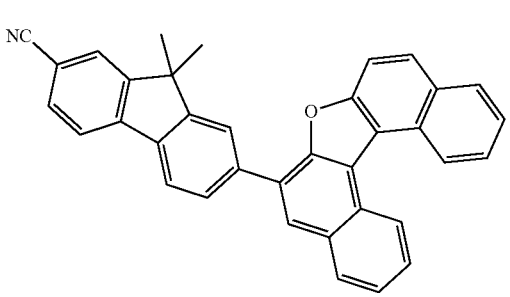
18
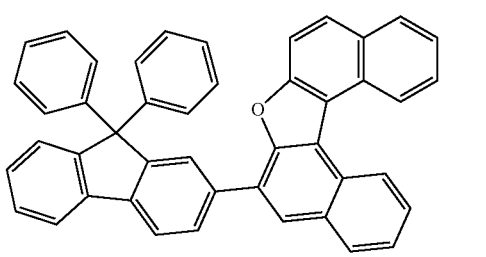
19
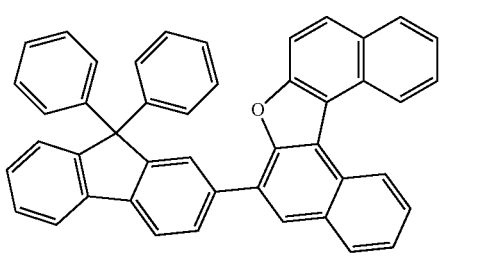
20
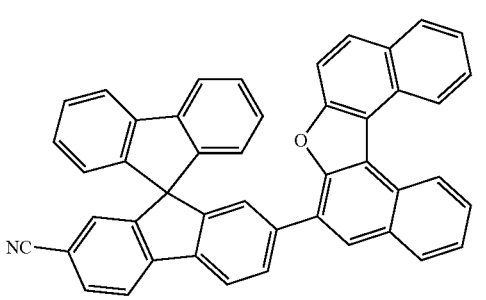

21
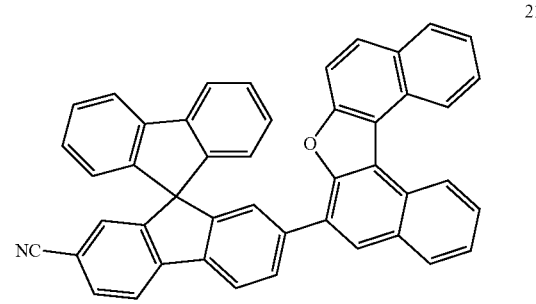
57
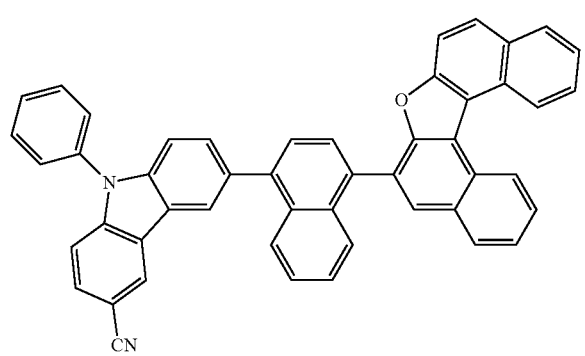
64
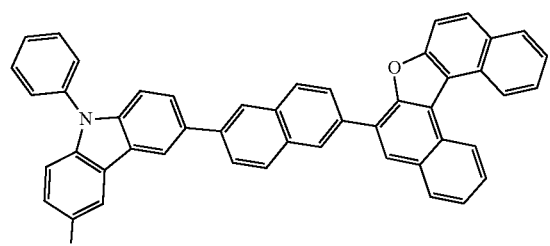
84
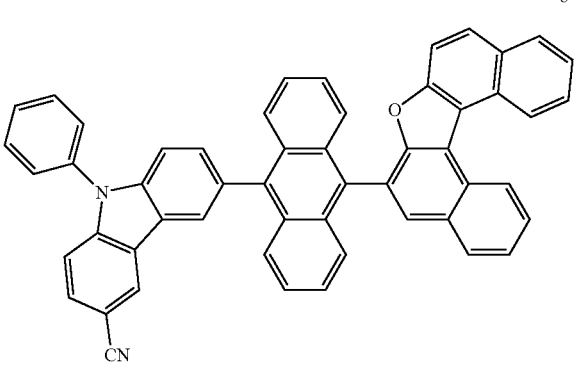
86
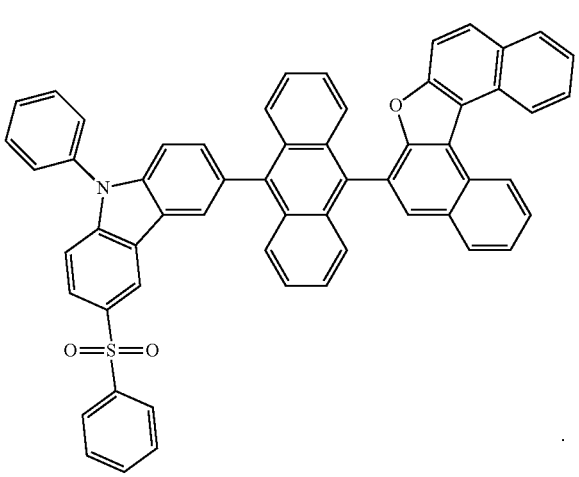
* * * * *